US009881820B2

(12) United States Patent
Wong et al.

(10) Patent No.: US 9,881,820 B2
(45) Date of Patent: Jan. 30, 2018

(54) FRONT OPENING RING POD

(71) Applicant: Lam Research Corporation, Fremont, CA (US)

(72) Inventors: Scott Wong, Sunnyvale, CA (US); Damon Tyrone Genetti, Livermore, CA (US); Derek John Witkowicki, Newark, CA (US); Alex Paterson, San Jose, CA (US); Richard H. Gould, Fremont, CA (US); Austin Ngo, San Jose, CA (US); Marc Estoque, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/138,097

(22) Filed: Apr. 25, 2016

(65) Prior Publication Data

US 2017/0117170 A1 Apr. 27, 2017

Related U.S. Application Data

(63) Continuation-in-part of application No. 15/048,960, filed on Feb. 19, 2016, which is a continuation-in-part of application No. 14/920,090, filed on Oct. 22, 2015.

(51) Int. Cl.
 *H01L 21/67* (2006.01)
 *H01L 21/673* (2006.01)
 (Continued)

(52) U.S. Cl.
 CPC .... *H01L 21/67167* (2013.01); *H01L 21/6719* (2013.01); *H01L 21/6732* (2013.01);
 (Continued)

(58) Field of Classification Search
 CPC ........ A47G 19/08; B65D 85/48; H01L 21/67; H01L 21/67167; H01L 21/672;
 (Continued)

(56) References Cited

U.S. PATENT DOCUMENTS 4,930,634 A * 6/1990 Williams .......... H01L 21/67343
 206/454
5,788,082 A * 8/1998 Nyseth .................... E21B 7/005
 206/454

(Continued)

*Primary Examiner* — Bryon Gehman
(74) *Attorney, Agent, or Firm* — Martine Penilla Group, LLP

(57) ABSTRACT

A pod for exchanging consumable parts with a process module includes a base plate having a front side, a back side, and first and second lateral sides. A first support column is disposed on the first lateral side proximal to the front side. A second support column is disposed on the second lateral side proximal to the front side. A third support column is disposed on the first lateral side proximal to back side and a fourth support column is disposed on the second lateral side proximal to the back side. Each of the support columns includes a plurality of support fingers distributed lengthwise and directed inward. A first hard stop column is disposed parallel to the third support column and a second hard stop column is disposed parallel to the fourth support column. A shell structure connected to the base plate is configured to enclose the first, second third and fourth support columns, top plate and first and second hard stop columns and includes a front opening disposed on the front side of the base plate. A door is mated to the front opening and includes retention assembly for securing consumable parts in the pod, when received in the pod.

29 Claims, 30 Drawing Sheets

(51) Int. Cl.
*H01L 21/677* (2006.01)
*H01L 21/687* (2006.01)

(52) U.S. Cl.
CPC .. *H01L 21/67196* (2013.01); *H01L 21/67201* (2013.01); *H01L 21/67303* (2013.01); *H01L 21/67369* (2013.01); *H01L 21/67379* (2013.01); *H01L 21/67383* (2013.01); *H01L 21/67386* (2013.01); *H01L 21/67389* (2013.01); *H01L 21/67742* (2013.01); *H01L 21/68707* (2013.01)

(58) Field of Classification Search
CPC ............ H01L 21/67201; H01L 21/673; H01L 21/67303; H01L 21/67379; H01L 21/67389; H01L 21/6719; H01L 21/67196; H01L 21/67369
USPC ................................ 206/454, 710, 711, 723
See application file for complete search history.

(56) References Cited

U.S. PATENT DOCUMENTS

| | | | | |
|---|---|---|---|---|
| 6,092,981 A * | 7/2000 | Pfeiffer | ............. | H01L 21/67303 206/710 |
| 6,776,289 B1 * | 8/2004 | Nyseth | ............. | H01L 21/67383 206/454 |
| 7,121,414 B2 * | 10/2006 | Beckhart | ............. | H01L 21/6732 206/711 |

* cited by examiner

ATM and/or VTM robot end-effector – with fingers sized to support a wafer

ATM and/or VTM robot end-effector (with extended fingers, wrist plate and mounting arm)

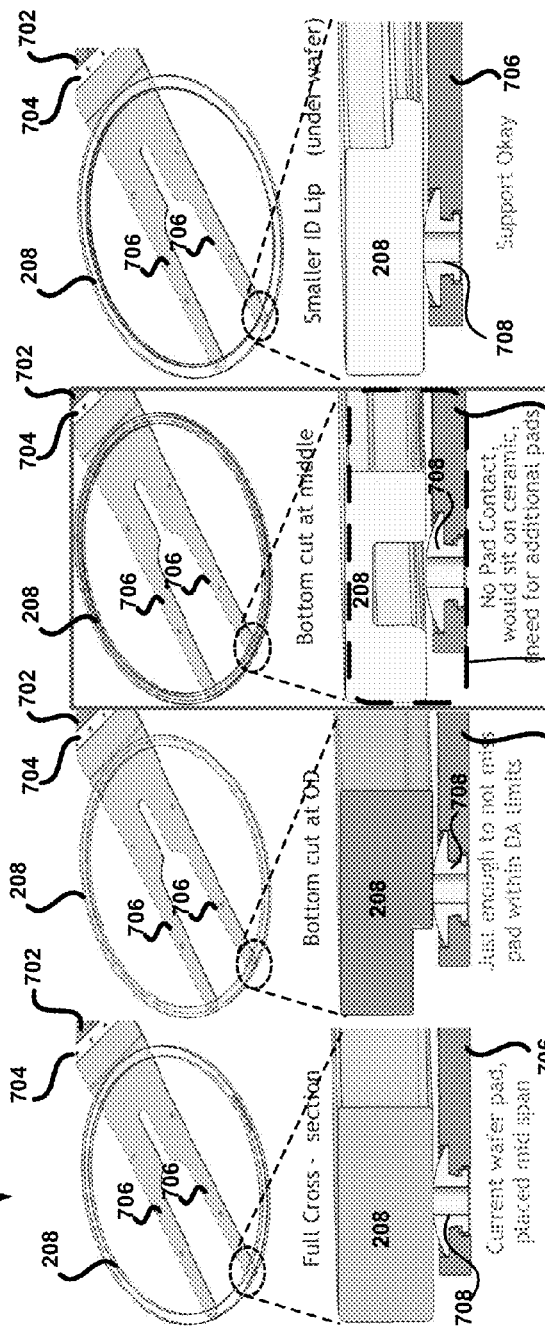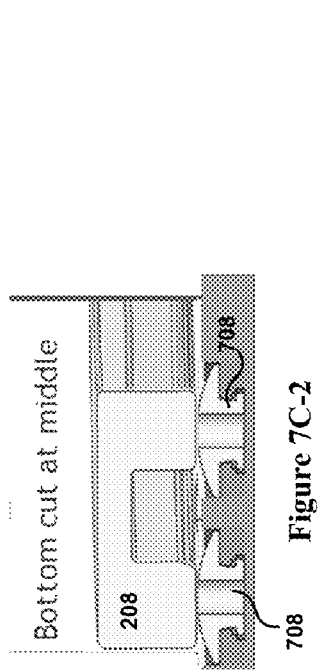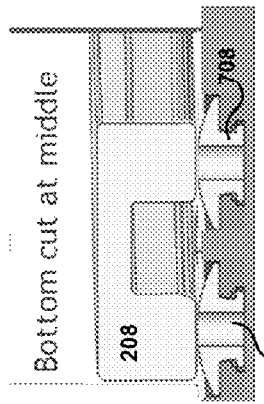

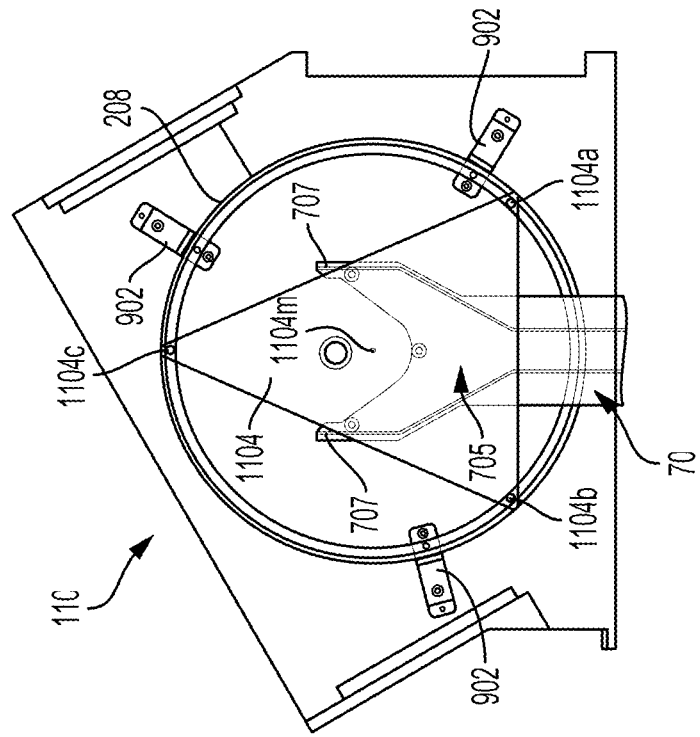
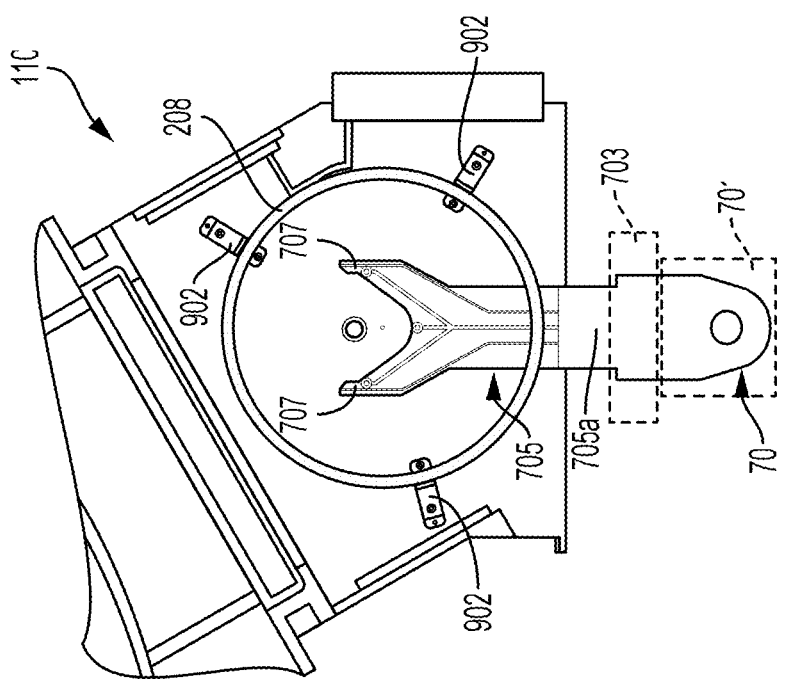

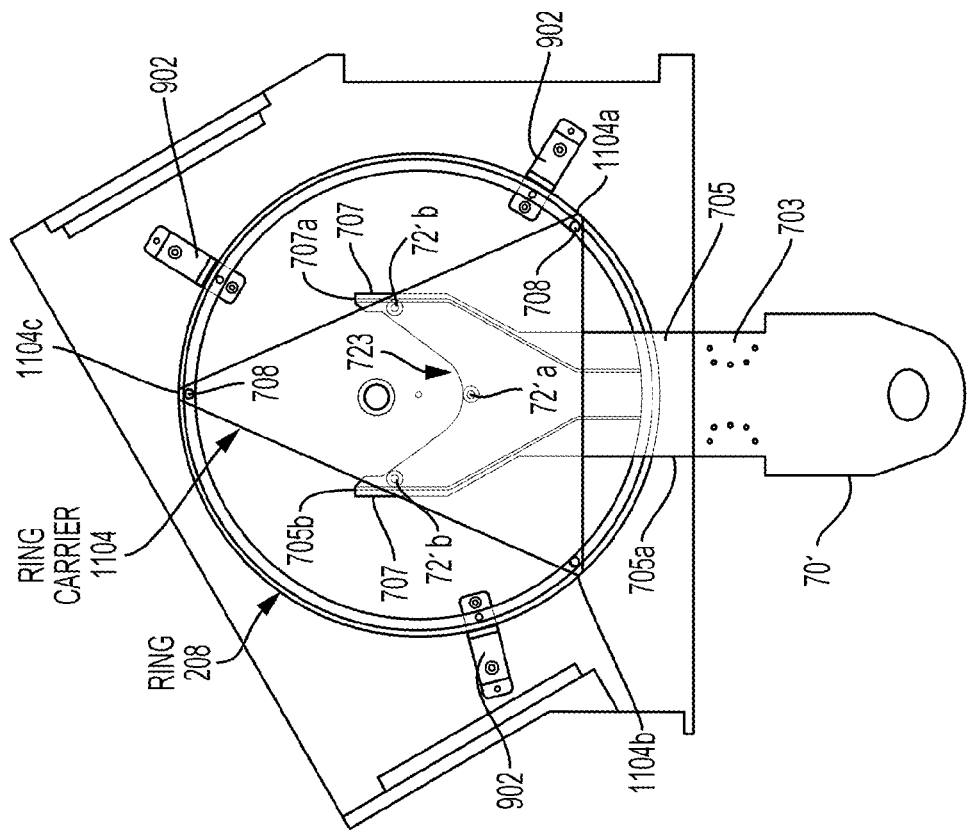
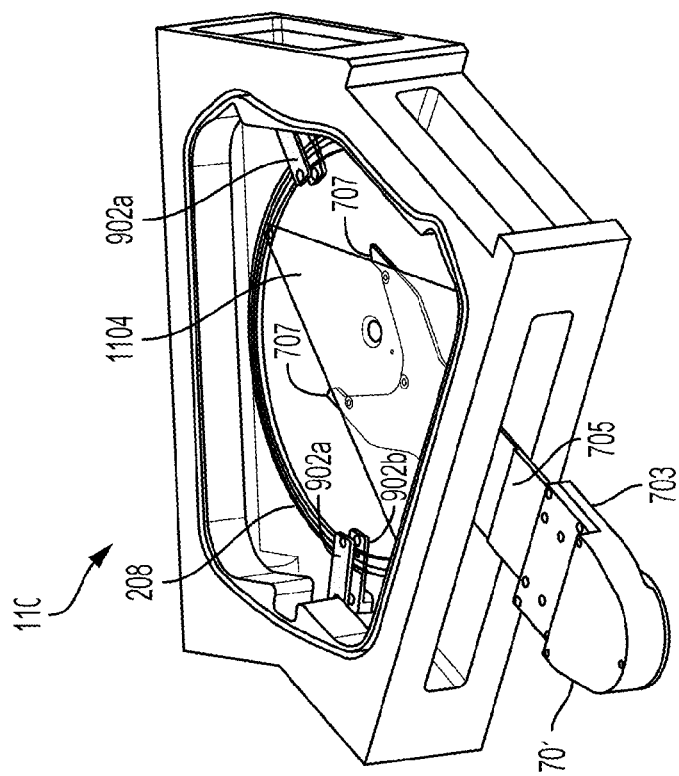
FIG. 9B
FIG. 9A

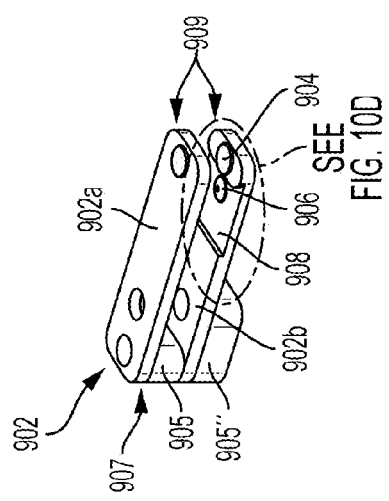
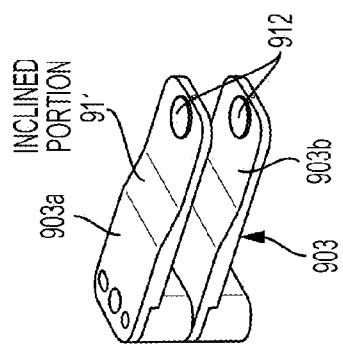
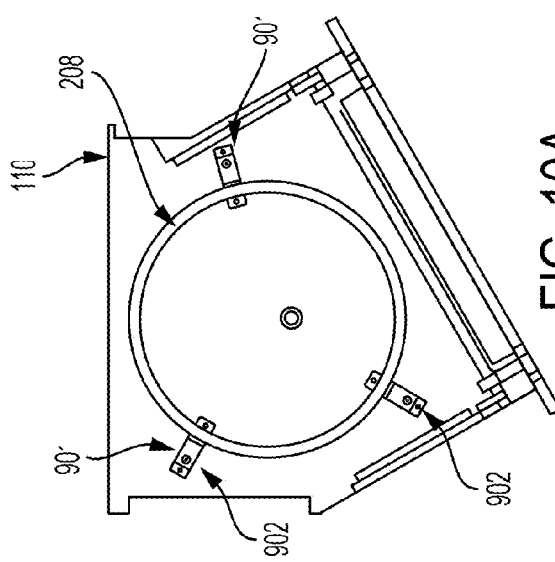
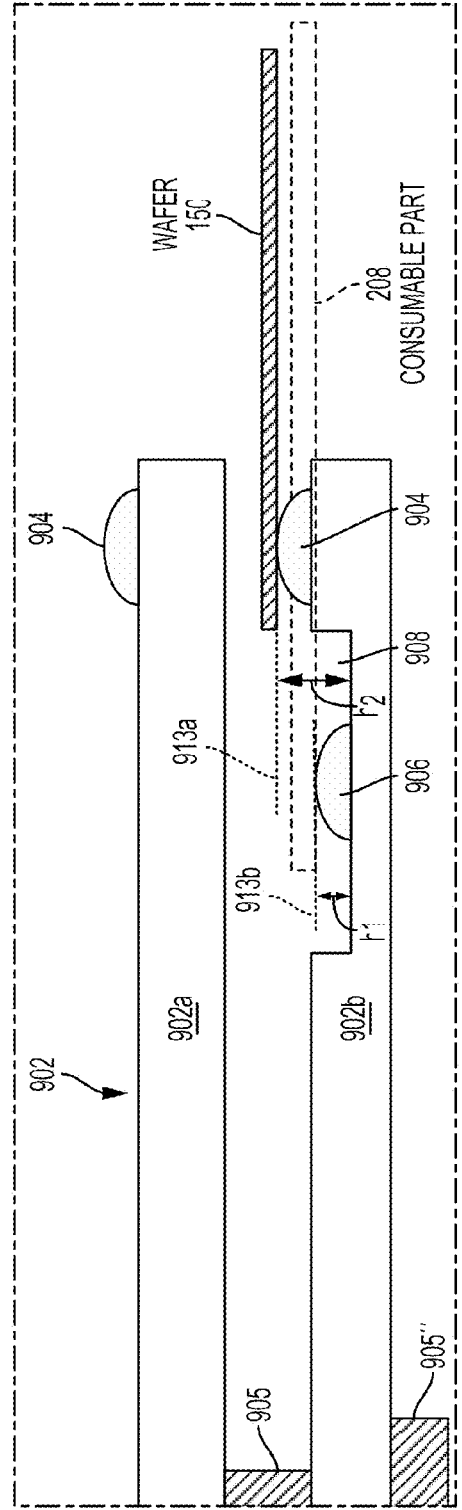

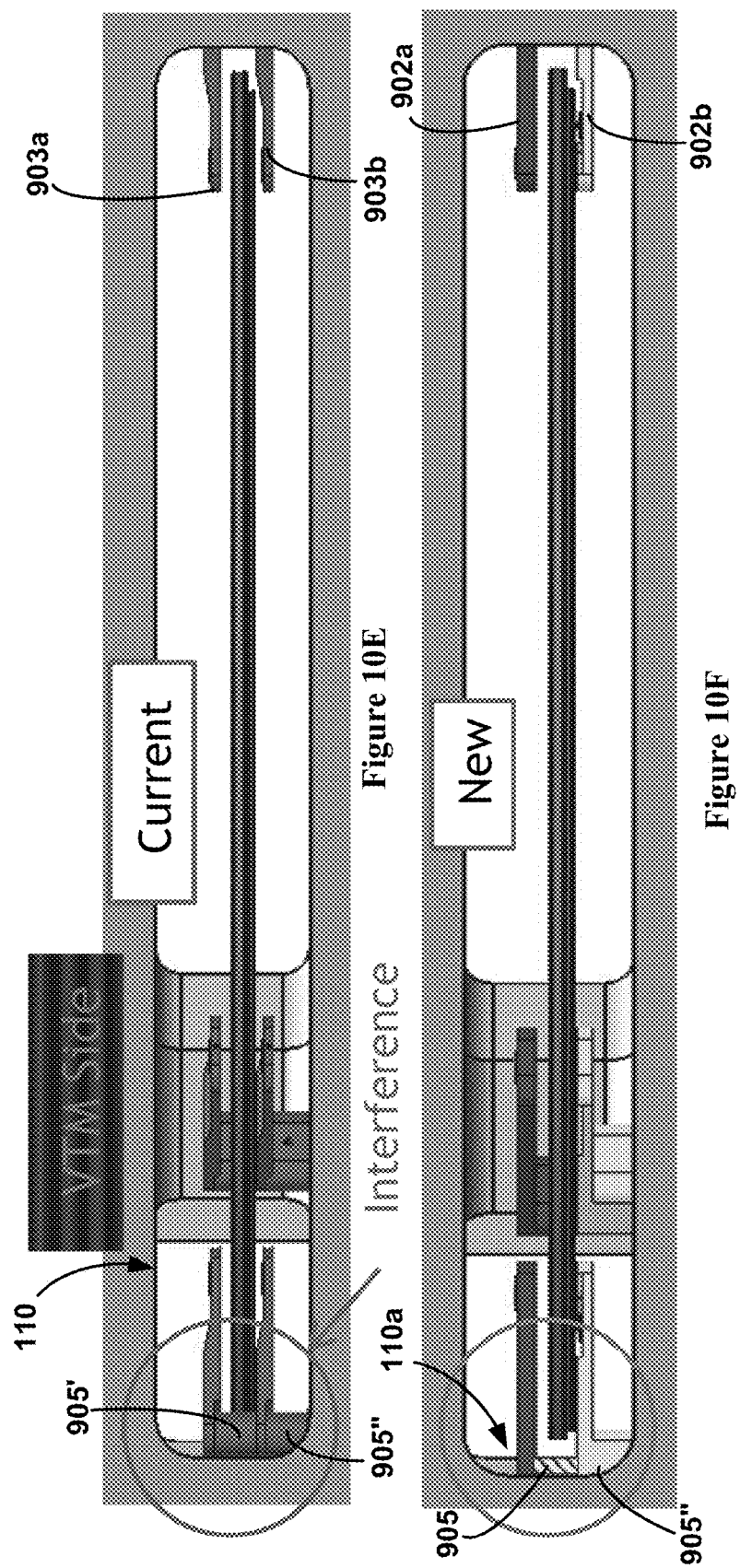

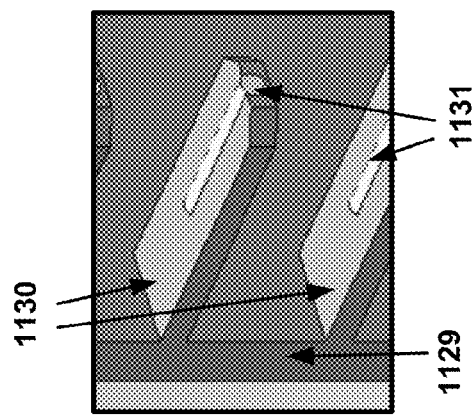
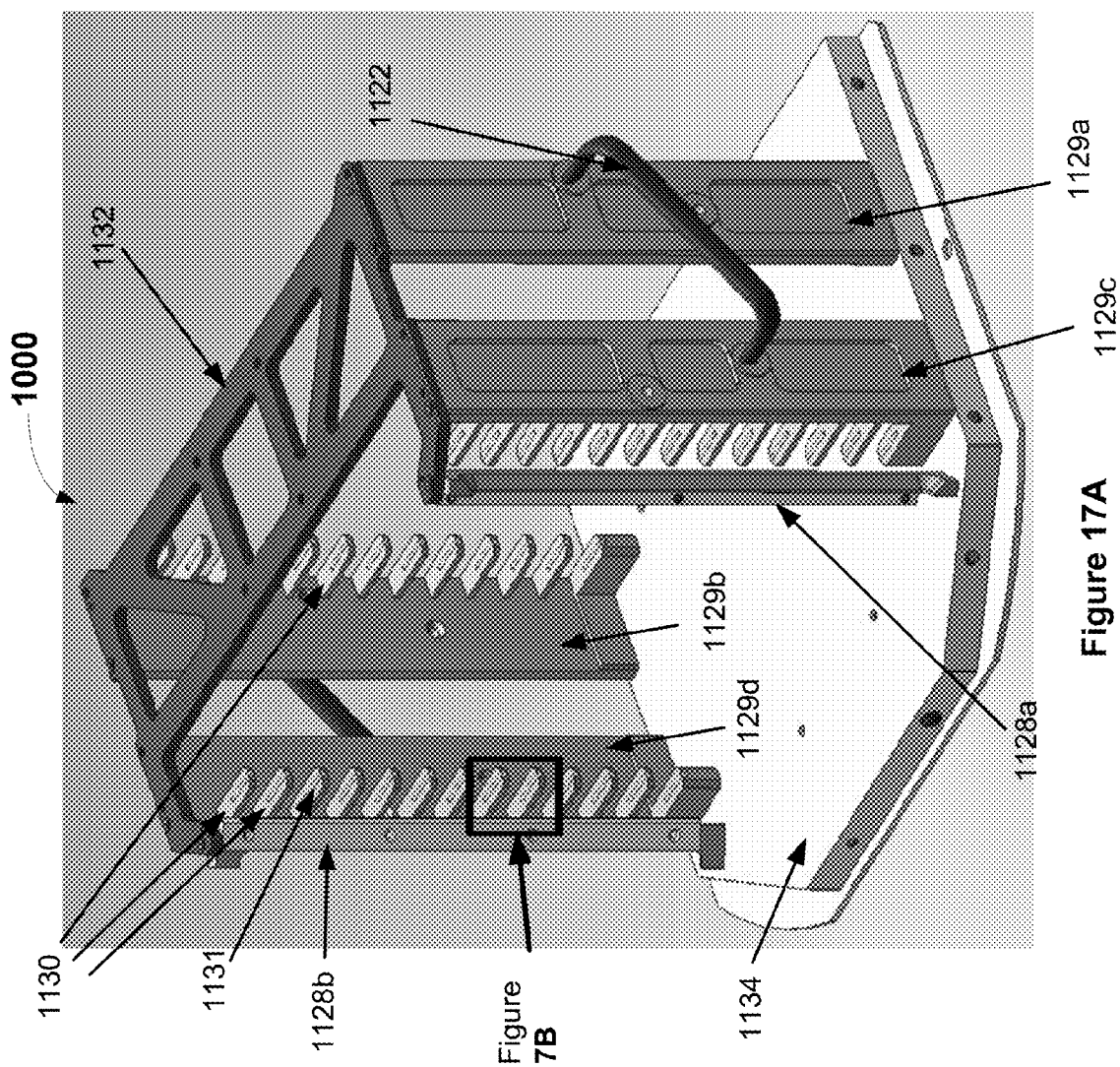

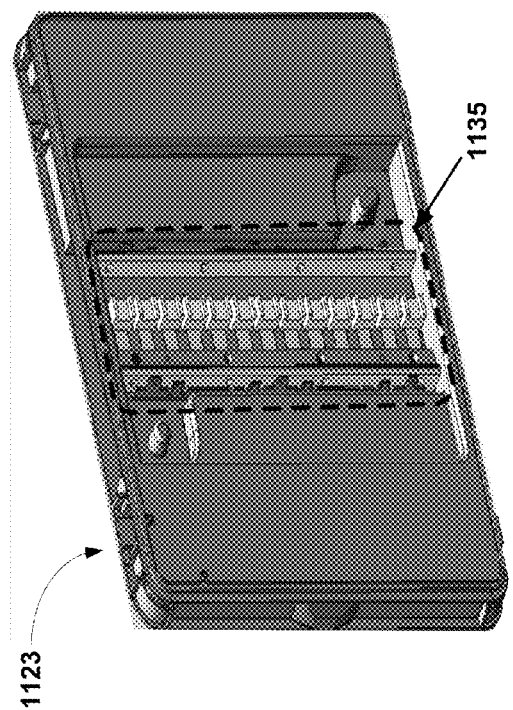
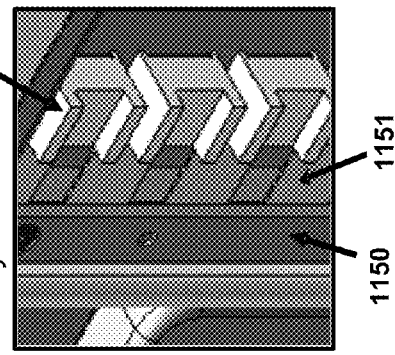
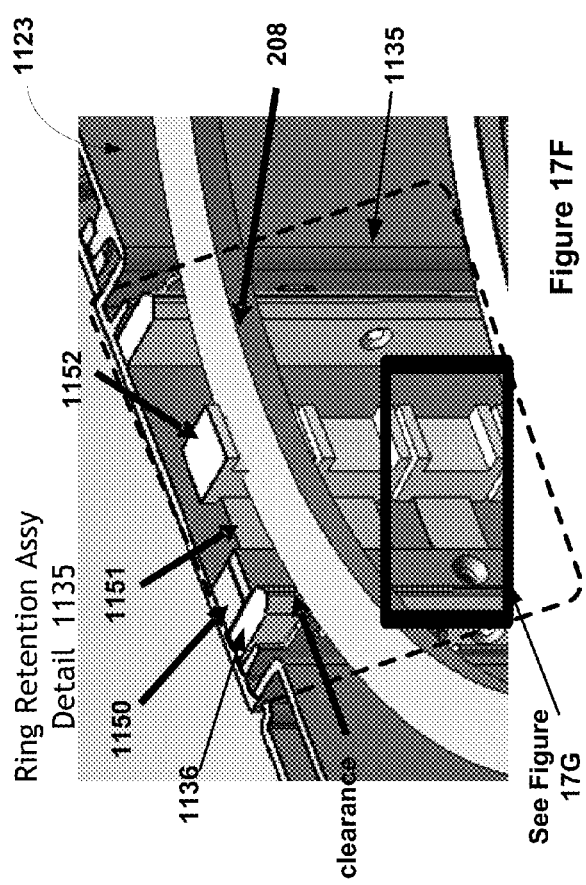

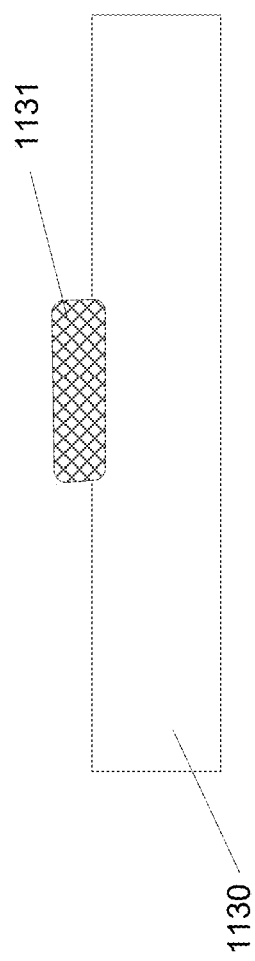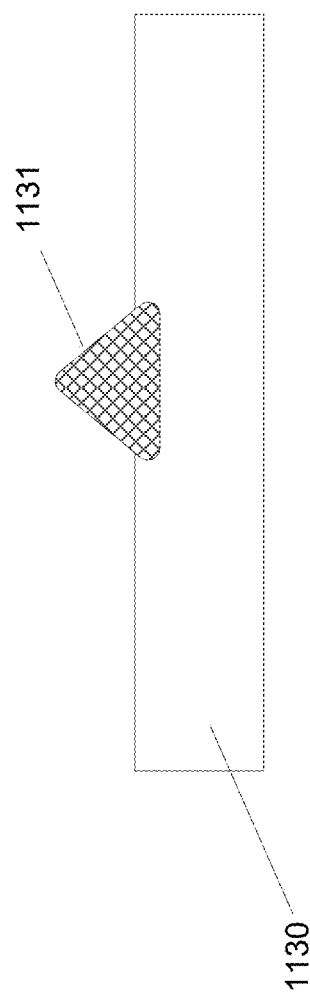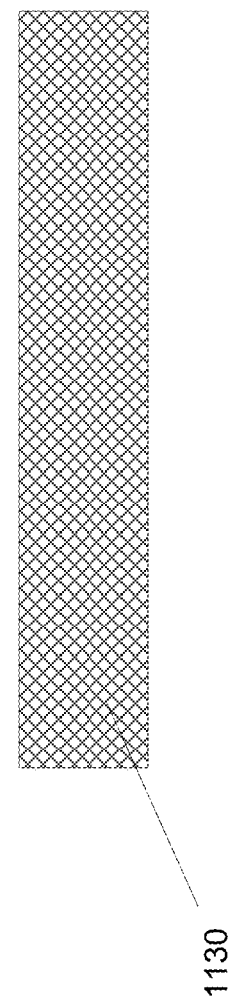

FRONT OPENING RING POD

CLAIM OF PRIORITY

This application is a continuation in part of U.S. patent application Ser. No. 15/048,960, filed on Feb. 19, 2016, and entitled, "Automated Replacement of Consumable Parts Using Interfacing Chambers", which is a continuation in part of application Ser. No. 14/920,090, filed on Oct. 22, 2015, and entitled, "Systems for Removing and Replacing Consumable Parts from a Semiconductor Process Module in Situ," all of which are incorporated herein by reference in its entirety for all purposes.

CROSS REFERENCE TO RELATED APPLICATIONS

This application is related to application Ser. No. 15/048,940, filed on Feb. 19, 2016, and titled, "Automated Replacement of Consumable Parts Using End Effectors Interfacing with Plasma Processing System", which is incorporated herein by reference in its entirety for all purposes.

BACKGROUND

1. Field of the Invention

The present embodiments relate to a cluster tool assembly used in manufacturing semiconductor wafer, and more particularly, to replacement stations that enables delivery and removal of consumable parts from the cluster tool assembly.

2. Description of the Related Art

A typical cluster tool assembly used in the manufacturing process to generate a semiconductor wafer includes one or more process modules with each process module used to perform a specific manufacturing operation, such as a cleaning operation, a deposition, an etching operation, a rinsing operation, a drying operation, etc. The chemistries and/or processing conditions used to perform these operations cause damage to some of the hardware components of the process module that are constantly exposed to the harsh conditions within the process module. These damaged or worn out hardware components need to be replaced periodically and promptly to ensure that the damaged hardware components do not expose other hardware components in the process module to the harsh conditions, and to ensure quality of the semiconductor wafer. For example, an edge ring that is disposed adjacent to a semiconductor wafer within a process module may get damaged due to its location and continuous exposure to ion bombardment from plasma generated within the process module that is used in an etching operation. The damaged edge ring needs to be replaced promptly to ensure that the damaged edge ring does not expose the underlying hardware components, such as a chuck, to the harsh process conditions. The hardware components that can be replaced are referred to herein as consumable parts.

The current process of replacing the damaged consumable part requires a trained service technician to perform a series of steps. The technician needs to bring the cluster tool assembly offline, pump/purge the cluster tool assembly to avoid exposure to toxic residuals, open the cluster tool, remove the damaged consumable part and replace the damaged consumable part with a new consumable part. Once the damaged part is replaced, the technician must then clean the cluster tool, pump the cluster tool assembly to vacuum and condition the cluster tool assembly for wafer processing. In some instances, the conditioning may involve qualifying the cluster tool assembly by running test process on the semiconductor wafer, taking cross-sections of the semiconductor wafer and analyzing the cross-sections to ensure the quality of the process operation. Replacing a damaged consumable part is a very involved and time-consuming process requiring the cluster tool assembly to be off-line for a considerable amount of time, thereby impacting the profit margin for a semiconductor manufacturer.

It is in this context that embodiments of the invention arise.

SUMMARY

Embodiments of the invention define a replacement station that can be coupled to a cluster tool assembly and is designed to remove and replace damaged hardware components, such as an edge ring, of a process module disposed within the cluster tool assembly without a need to break vacuum (i.e., expose the cluster tool assembly to atmospheric condition). A damaged hardware component that can be replaced is also referred to herein as a consumable part. The cluster tool assembly includes one or more process modules, with each process module configured to perform a semiconductor wafer processing operation. As the consumable part in a process module gets exposed to the chemicals and process conditions within, the consumable part gets damaged and needs to be replaced in a timely manner. The damaged consumable part may be replaced without opening the cluster tool assembly by mounting a replacement station to the cluster tool assembly. The replacement station includes a part buffer with compartments that are used to store new and used consumable parts. The replacement station and the process module(s) are coupled to a controller to enable the controller to coordinate access between the replacement station and the process module(s) while the process module(s) is maintained in a vacuum state, so as to allow replacement of the consumable part.

To provide easy access to the damaged consumable part, the process module may be designed to include a lift mechanism. When engaged, the lift mechanism is configured to allow the consumable part to be moved to a raised position so that a robot available within the cluster tool assembly may be used to access and retrieve the raised consumable part from the process module. A replacement consumable part is provided to the process module and the lift mechanism is used to receive the consumable part and lower it into position in the process module.

By providing the replacement station to access the consumable part, a need to open the cluster tool assembly to atmospheric conditions in order to access the damaged consumable part, is eliminated. The replacement station is maintained at vacuum, in some implementations, thereby eliminating the risk of contamination during replacement of the consumable part. As a result, the time required to recondition the process module to bring it to an active operation state after replacement of the damaged consumable part, is substantially reduced. Further, the robot and the lift mechanism allow replacement of the consumable part without the risk of inadvertently damaging any hardware components of the process modules during retrieval and replacement of the consumable part.

Embodiments of the disclosure provide a cluster tool assembly that can be used to remove and replace the consumable part from a process module without requiring the cluster tool assembly to be opened to atmospheric conditions. As the cluster tool assembly is not opened, the cluster tool assembly does not require to be purged or pumped. As a result, the time required to condition and qualify the cluster tool assembly is considerably reduced.

The replacement station may be disposed in three different positions. In one position, a roll-up replacement station is temporarily mounted directly to a process module within a cluster tool assembly, with ability to pump to vacuum and retract the consumable part directly from the process module. A new consumable part is retrieved from the replacement station and directly placed into the process module. In this position, the replacement station would include a robot and part buffer for holding used and new consumable parts. An isolation valve would remain on the process module. This configuration is desired since only the process module, not the entire cluster tool assembly, would have to be offline for this maintenance activity.

In a second position, the replacement station is permanently mounted to a vacuum transfer module (VTM) and a robot within the VTM is utilized to remove and replace the consumable part from the process module. In this position, the replacement station does not require a dedicated robot, but an end effector of the VTM robot would handle moving both semiconductor wafers and the consumable parts.

In a third position, the replacement station is temporarily or permanently mounted to an atmospheric transfer module (ATM) and a robot of the ATM, a robot of a vacuum transfer module (VTM) are used to remove and replace the consumable part from the process module. In this position, the replacement station would not require a dedicated robotic arm, but the VTM and ATM robot end effectors, as well as a loadlock chamber disposed between the ATM and the VTM would handle both the semiconductor wafers and the consumable parts.

The process module includes a consumable part lift mechanism. The consumable part is usually a ring, such as an edge ring. The consumable part would have to be lifted so that a robot could easily access and extract it. In one embodiment, the lift mechanism includes a vacuum-sealed actuator outfitted with a lift pin. In another embodiment, the actuator is maintained at vacuum. Under normal operation, the lift stays retracted and not in contact with the consumable part. When the consumable part needs to be replaced, the actuator extends the lift pin and raises the consumable part. The robot extends the end effector into the process module so that the end effector (for example, a spatula-shaped or finger-shaped part attached to the robot) slides underneath the consumable part. The actuator then retracts the lift pin, placing the consumable part on the end effector. The consumable part is pulled back into the replacement station. A reverse order is used to place a new consumable part in the process module.

In one embodiment, a pod for exchanging consumable parts of a process module is disclosed. The pod includes a base plate, a top plate, a first pair of support columns, a second pair of support columns, a first hard stop column, a second hard stop column, a shell structure and a door. The base plate has an outer perimeter defined by a front side, a back side and two lateral sides that extend between the front side and the back side. Each one of the first pair of support columns is oriented along each of the two lateral sides and disposed proximal to the front side of the base plate. Each one of the first pair of support columns extends between the top plate and the base plate and includes a plurality of support fingers distributed lengthwise along the respective support column of the first pair of support columns and face inward relative to the outer perimeter. Each one of the second pair of support columns is oriented along each of the two lateral sides and disposed proximal to the back side plate. Each one of the second pair of support columns extends between the top plate and the base plate, and includes a plurality of support fingers distributed lengthwise along the respective support column of the second pair of support columns and face inward relative to the outer perimeter. The first hard stop column is disposed proximate to a first one of the second pair of support columns. The second hard stop column is disposed proximate to a second one of the second pair of support columns. Each of the first and the second hard stop columns extends a length of the second pair of support columns, such than an edge surface of the first and the second hard stop columns face inward relative to the outer perimeter. The shell structure of the pod is configured to attach to the base plate and enclose the first pair of support columns, the second pair of support columns, the top plate and the first and second hard stop columns. The shell structure has a front opening that is disposed along the front side of the base plate. The door is configured to mate with the front opening of the shell structure and the front side of the base plate. The door is configured with a retention assembly that is disposed on an inside surface of the door and extends between the base plate and the top plate, such that the consumable parts when disposed in the pod, rest upon the support fingers of the first and second pairs of support columns. The retention assembly secures the consumable parts against the first and the second hard stop columns, when the door is closed.

In another embodiment, a pod for holding consumable parts to be supplied or returned from a process module is disclosed. The pod includes a base plate, a first support column, a second support column, a third support column, a fourth support column, a top plate, a first hard stop column, a second hard stop column, a shell structure and a door. The base plate is defined by a front side, a back side, a first lateral side and a second lateral side. The first and the second lateral side are oriented opposite to one another. The first support column is disposed proximal to the front side and on the first lateral side. The second support column is disposed proximal to the front side and on the second lateral side. The third support column is disposed proximal to the back side and on the first lateral side. The fourth support column is disposed proximal to the back side and on the second lateral side. The top plate is disposed above the base plate and is connected to each of the first, second, third and fourth support columns. Each of the first, second, third and fourth support columns include support fingers that are distributed between the base plate and the top plate and oriented toward an inner region of the pod. The first hard stop column is disposed parallel to the third column and a second hard stop column is disposed parallel to the fourth column, such that the first and the second hard stop columns are oriented toward the inner region of the pod and extend between the base plate and the top plate. The shell structure is configured to connect to the base plate and enclose the first, second, third and fourth support columns, the top plate, the first hard stop column and the second hard stop column. The shell structure has a front opening disposed proximate to the front side of the base plate. The door mates with the front opening of the shell structure and has a retention assembly for securing consumable parts in the pod, when disposed over select ones of the support fingers. The retention assembly is disposed on an inside surface of the door and extends between the base plate and the top plate.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

FIGS. 6B, 6B-1 and 6C illustrate overhead and side view of an end effector mechanism disposed in an atmospheric transfer module and/or a vacuum transfer module, in some embodiments of the invention.

FIGS. 7A-7D illustrate varying bottom surface profile of a consumable part that is received using end effector mechanism, in accordance with some embodiments of the invention.

FIGS. 7F-1, 7F-2 illustrates an alternate contact pad concept used in the end effector mechanism on a robot of a VTM and/or an ATM for supporting consumable parts with different bottom profiles, in accordance with some embodiments of the invention.

FIGS. 8A-8B illustrate example end effector mechanisms used to deliver substrate and consumable part into a loadlock chamber, in accordance with some embodiments of the invention.

FIGS. 9A-9B illustrate example side and top view of an end effector mechanism with ring carrier that is used to deliver consumable part to a loadlock chamber, in accordance with some embodiments of the invention.

FIGS. 10A-10D illustrate example finger assembly used within a loadlock chamber that is configured to receive consumable part, in accordance to some embodiments of the invention.

FIGS. 10E-10F illustrate a view of an existing airlock chamber and a re-designed airlock chamber that includes finger assemblies to receive consumable part, in accordance to some embodiments of the invention.

FIG. 17A illustrates a view of support columns and hard stop columns of an example replacement station, in one embodiment of the invention. FIG. 17B illustrates an expanded view of a portion of a support column illustrated in FIG. 17A, identifying different parts of the support fingers, in some embodiments of the invention.

FIGS. 17E, 17F and 17G illustrate detailed view of a retention assembly provided on a door of a replacement station, in some embodiments of the invention.

FIGS. 17H, 17I and 17J provide different cross-sectional view of a support finger with support pad defined thereon, in some embodiments of the invention.

DESCRIPTION

Figure 1:
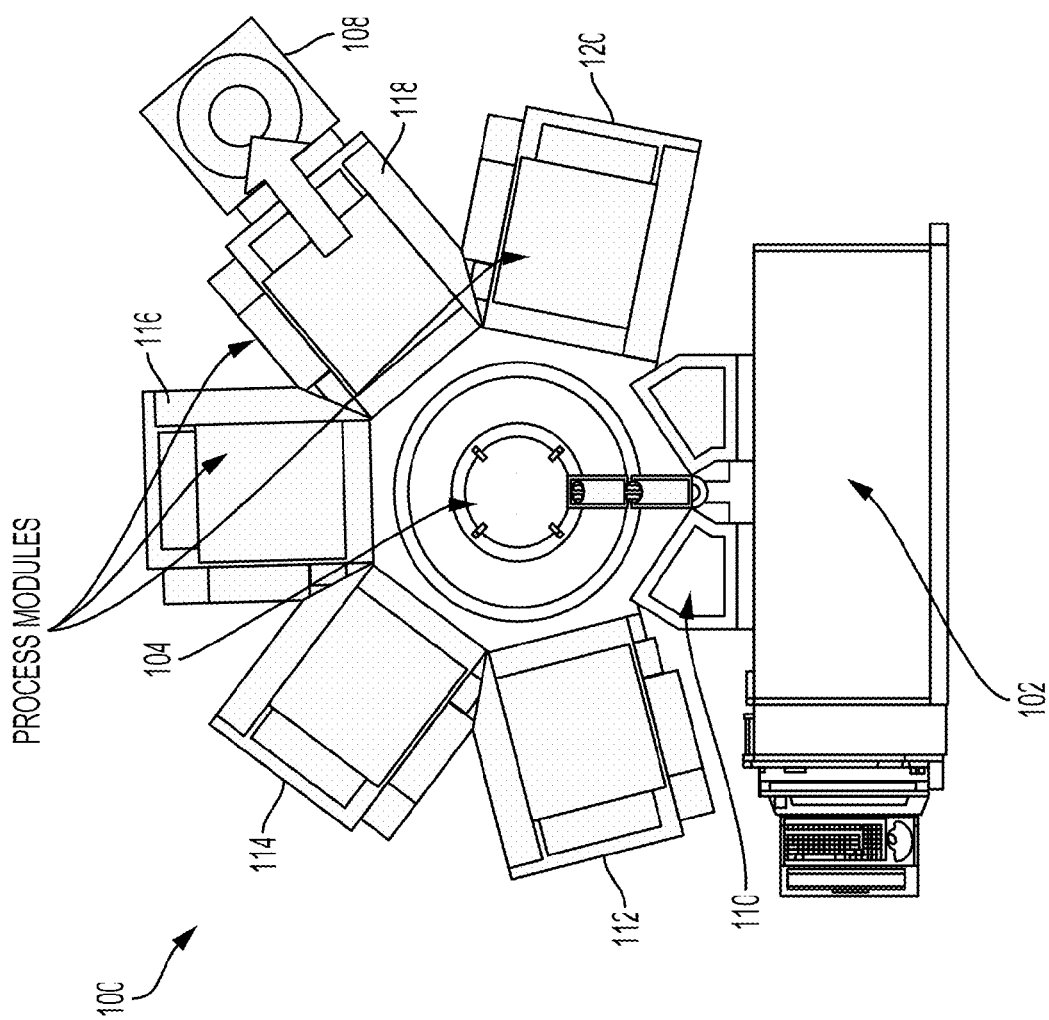
FIG. 1 illustrates a simplified block diagram of a cluster tool assembly that includes a replacement station mounted to a process module that is used in processing a semiconductor wafer, in one embodiment of the invention.

Embodiments of the disclosure define a cluster tool assembly that is used to process a semiconductor wafer. The cluster tool assembly includes a process module that is used to process a semiconductor wafer. A replacement station is mounted to the cluster tool assembly. The replacement station is maintained at vacuum so as to provide the necessary process condition for replacement of the consumable part without risk of contaminating the process module or the cluster tool assembly. A dedicated robot within the replacement station or the robot available within the cluster tool assembly is used to retrieve a used consumable part from the process module and replace with a new consumable part.

In some embodiments, the replacement station may be mounted directly to a process module of a cluster tool assembly in which a consumable part needs to be replaced. In such embodiments, the replacement station is coupled directly to the process module. A robot defined in the replacement station is used to retrieve and replace the consumable part.

In some other embodiments, the replacement station may be mounted directly to a vacuum transfer module (VTM) within a cluster tool assembly. The replacement station is mounted so as to maintain uniformity and symmetry of the cluster tool assembly. A robot of the VTM that is used to move a semiconductor wafer into and out of process modules is also used to retrieve and replace a consumable part disposed in a process module.

In some other embodiments, the replacement station may be mounted directly to an atmospheric transfer module of a cluster tool assembly. In such embodiments, a robot of the atmospheric transfer module works with a robot of a vacuum transfer module of the cluster tool assembly to access and replace the consumable part from a process module. The replacement station is designed to mount to different modules of the cluster tool assembly and enable replacing of the consumable part without requiring the cluster tool assembly to be opened to atmospheric conditions to access the consumable part.

Traditional design of a cluster tool assembly required the cluster tool assembly to be opened in order to access and replace the consumable part within a process module. Opening of the cluster tool assembly required taking the cluster tool assembly offline and purging the cluster tool assembly to atmospheric condition to allow access to the process modules. Once the cluster tool assembly is opened, a trained technician would manually remove and replace the consumable part from a process module. Upon replacement of the consumable part, the cluster tool assembly had to be conditioned so that the semiconductor wafer can be processed. Since the semiconductor wafers are valuable products, extreme care has to be taken when conditioning the cluster tool assembly. The conditioning would require cleaning the cluster tool assembly, pumping the cluster tool assembly to vacuum, conditioning the cluster tool assembly and qualifying the cluster tool assembly using test runs. Each of these steps requires considerable time and effort. In addition to the time required at every step to condition the cluster tool assembly, additional delays may be experienced when problems are encountered at one or more of the steps during the conditioning of the cluster tool assembly. Some of the problems commonly encountered during the conditioning of the cluster tool assembly may include misalignment of the consumable part during replacement, damage to the new consumable part when replacing a damaged or used consumable part, damage to other hardware components in the process module during retrieval or replacement of the consumable part, cluster tool assembly not achieving vacuum after pumping, cluster tool assembly not achieving process performance, etc. Based on the severity of each problem, additional time and effort may have to be expended, further contributing to delay of bringing the cluster tool assembly online, directly impacting the profit margin for a manufacturer.

Mounting a replacement station to the cluster tool assembly and accessing the consumable part through the replacement station saves considerable amount of time and effort required for maintaining the cluster tool assembly. The risk of damage to the consumable part, process module and/or the cluster tool assembly is minimized by using a robot available within the cluster tool assembly for replacing the consumable part, and the risk of contamination is minimized by maintaining the replacement station at vacuum, thereby avoiding exposure of the inside of the cluster tool assembly to outside atmosphere. Using the robot, one can achieve a more precise alignment of the consumable part in the process module while minimizing damage to other hardware components of the process module. Consequently, time required to condition the cluster tool assembly is greatly reduced. Timely replacement of the consumable parts increases quality and yield of semiconductor components defined in the semiconductor wafer.

FIG. 1 illustrates a simplified schematic diagram of a cluster tool assembly 100 that is used to process a semiconductor wafer, in one embodiment. The cluster tool assembly 100 includes a plurality of modules to allow the semiconductor wafer to be processed in a controlled environment with minimal exposure of the semiconductor wafer to environment. The cluster tool assembly 100, in one embodiment, includes an atmospheric transfer module (ATM) 102, a common vacuum transfer module (VTM) 104 and one or more process modules 112-120. The ATM 102 is operated under ambient (i.e., atmospheric) condition and interfaces with a wafer loader (not shown) to bring a semiconductor wafer into the integrated cluster tool assembly 100 for processing, and for returning the semiconductor wafer, after processing. The ATM 102 may include a robot to move the semiconductor wafer from the wafer loader to the VTM 104. The robot may be part of a dry robot as the ATM 102 is at atmospheric condition.

The VTM 104 is operated under vacuum so as to minimize exposure of the semiconductor wafer surface to atmospheric air as the semiconductor wafer is moved from one process module into another. Since, the VTM 104 is operating under vacuum and the ATM 102 is operating at atmospheric condition, a loadlock chamber 110 is placed between the ATM 102 and the VTM 104. The loadlock chamber 110 provides a controlled interface to allow the transfer of the semiconductor wafer from the ATM 102 in to the VTM 104. In this embodiment, the robot within the ATM 102 may be used to deposit the semiconductor wafer into the loadlock chamber 110. A separate robot may be provided within the VTM 104 to retrieve the semiconductor wafer from the loadlock chamber 110 and transfer the semiconductor wafer into and out of process module (112-120). Due to its location, the loadlock chamber, in some embodiments, is also referred to as an "interfacing chamber".

The one or more process modules 112-120 are integrated with the VTM 104 so as to allow the semiconductor wafer to move from one process module to another process module in a controlled environment maintained by the VTM 104. In some embodiments, the process modules 112-120 may be distributed uniformly around the VTM 104 and are used to perform distinct process operations. Some of the process operations that can be carried out using the process modules 112-120 include etch operation, rinsing, cleaning, drying operation, plasma operation, deposition operation, plating operation, etc. By way of example, process module 112 may be used to perform a deposition operation, process module 114 may be used to perform a cleaning operation, process module 116 may be used to perform a second deposition operation, process module 118 may be used to perform an etch or removal operation, and so on. The VTM 104 with the controlled environment allows the semiconductor wafer to be transferred into and out of the process modules 112-120 without risk of contamination and the robot within the VTM 104 assists in transferring the semiconductor wafer into and out of the various process modules 112-120 that are integrated with the VTM 104.

In one embodiment, a replacement station 108 is mounted to a process module (e.g., any one of the process modules 112-120) within the cluster tool assembly 100. In the example embodiment illustrated in FIG. 1, the replacement station 108 is mounted to process module 118. The replacement station may be configured to mount to any of the other process modules 112-120, as and when consumable part(s) needs to be replaced in any one of the process modules 112-120. The process module 118, for example, may be used to perform an etch operation. The replacement station 108 is used to retrieve and replace a consumable part that is used in the process module 118. The replacement station 108 includes a mechanism, such as a pump mechanism, (not shown) to pump and maintain the replacement station 108 at vacuum, when mounted to the process module.

In one embodiment, the replacement station 108 may be coupled to the process module (i.e., any one of process modules 112-120) through an isolation valve, when a consumable part needs to be replaced at the process module (112-120) and de-coupled from the process module (112-120) when the consumable part has been successfully replaced. In this embodiment, the replacement station 108 is a moveable modular unit that is designed to be temporarily mounted to a process module to complete the required operation (e.g., replacement of consumable part), dismounted once the required operation at the process module is completed, and either retracted or moved to a different process module where the required operation of replacing the consumable part is performed. For example, the isolation valve allows the replacement station 108 to be maintained at vacuum.

The replacement station 108 includes a part buffer to receive and hold the consumable part. In some embodiments, the part buffer may include a plurality of compartments for receiving the used consumable parts that are retrieved from a process module and new consumable parts that are to be delivered to the process module. In one embodiment, an opening in the replacement station 108, where the replacement station is mounted to the isolation valve, is sized to allow the movement of the consumable part into and out of the replacement station 108.

The consumable part is a hardware part within the process module that needs to be replaced due to its continuous exposure to the process conditions within the process module. As a result of its continuous exposure to the harsh process conditions used during processing of the semiconductor wafer, the consumable part needs to be closely monitored to determine when damage has exceeded an acceptable level so that it can be promptly replaced. For example, in an etch process module, an edge ring is disposed adjacent to the semiconductor wafer mounted on a chuck assembly to extend the process region of the semiconductor wafer. During the etching operation, the edge ring is exposed to the ion bombardment from the plasma that is used to form features on a surface of the semiconductor wafer. Over a course of time, as a result of continuous exposure, the edge ring may get damaged. When the edge ring gets damaged beyond an acceptable level, the edge ring needs to be replaced so that damage of the edge ring does not expose other underlying components or otherwise adversely affect the semiconductor wafer processing.

In a typical etch operation, ions from the plasma hit the semiconductor wafer surface at an angle that is perpendicular to a plasma sheath formed in a process region defined above the semiconductor wafer, when received in the process module. When layers of the edge ring wear away due to ion bombardment, the edge of the semiconductor wafer is exposed causing the plasma sheath to roll along a contour of the semiconductor wafer edge. Consequently, the ions hitting the semiconductor wafer surface follow the contour of the plasma sheath thereby causing tilt features to be formed toward the edge of the semiconductor wafer surface. These tilt features would affect the overall yield of the semiconductor components formed on the semiconductor wafer. Further, as layers of the edge ring wear away, an underlying component, such as a chuck, for example, may get exposed to the ions, damaging the chuck surface. In order to improve the yield and to avoid damage to any underlying components, the edge ring (i.e., consumable part) needs to be replaced periodically.

The replacement station 108 mounted to the process module 118 would allow the consumable part (i.e., edge ring) to be easily replaced without breaking vacuum in the process module. In one embodiment, the replacement station 108 includes a dedicated robot that is configured to extend an end effector into the process module (e.g., process module 118) to retrieve the consumable part that needs to be replaced, and to deliver a new consumable part. A lift mechanism within the process module provides access to the consumable part. The robot of the replacement station 108 may work to place the new consumable part on a lift pin of the lift mechanism, and the lift mechanism would install the new consumable part in its position within the process module.

In one embodiment, to assist in replacing the consumable part, the replacement station is mounted to the process module (e.g., any one or each of the process modules 112-120) through a first isolation valve. A robot from the replacement station is used to access and retrieve a consumable part from the process module and move into a part buffer defined in the replacement station and provide a replacement consumable part from the part buffer. In one embodiment, the first isolation valve may be operatively connected to a controller to coordinate retrieval and replacement of the consumable part in the process module.

In addition to using the first isolation valve to mount the replacement station to the process module, the process module may be coupled to a vacuum transfer module (VTM) of the cluster tool assembly 100 using a second isolation valve. When engaged, the second isolation valve is configured to isolate the process module (112-120) from the rest of the cluster tool assembly 100 so that the replacement of the consumable part within the process module can be easily carried out without affecting operation of other process modules of the cluster tool assembly 100. Providing the second isolation valve allows the specific process module (any one of 112-120) to be taken off-line instead of the whole cluster tool assembly 100, while the remainder of the process modules (112-120) within the cluster tool assembly 100 may be allowed to continue processing the semiconductor wafer. Further, as only a specific process module (e.g., any one of 112-120) is brought off-line for replacing the consumable part(s), it would take considerably less time to restore the process module (112-120) and the cluster tool assembly 100 to a fully operational state. As a result, time taken for conditioning and qualifying operation of the cluster tool assembly 100 is much shorter. A robot of the VTM 104 may be used to move the semiconductor wafer in and out of the process module (112-120) during semiconductor wafer processing.

To allow the robot of the replacement station 108 to retrieve the consumable part from the process module (112-120), the consumable part has to be easily accessible. The process module (112-120), in one embodiment, includes a lift mechanism that provides access to the consumable part that needs to be replaced. The lift mechanism, in some embodiments, may include lift pins that can be extended to move the consumable part to a raised position. An end effector of the robot in the replacement station 108 is extended into the process module (112-120) and slid below the consumable part. The lift mechanism then retracts the lift pin leaving the consumable part to rest on the end effector of the robot. The end effector with the consumable part is then retracted from the process module (112-120) into the replacement station 108. A new consumable part is moved to the process module (112-120) using the end effector of the robot and the lift pins of the lift mechanism is extended to receive the new consumable part. The lift pins of the lift mechanism act together to align the new consumable part into position in the process module (112-120). The process of retrieving and replacing the consumable part using the lift mechanism will be discussed in more detail with reference to FIG. 4.

In some embodiments, the entire cluster tool assembly 100 may have to be brought off-line to replace the consumable part. This may occur when more than one consumable part within more than one process module (112-120) needs to be replaced, for example. Even in such embodiments, the time to bring the cluster tool assembly 100 off-line, mount the replacement station to the process module(s) (112-120), remove and replace the consumable part, condition and qualify the cluster tool assembly 100 may be much shorter as the replacement station and the process module(s) are maintained at vacuum. As a result, the process condition (i.e., vacuum) of the cluster tool assembly 100 is not adversely affected during replacement of the consumable part. Further, as the replacement is done using robot, more precise retrieval and placement of the consumable part may be engineered, thereby avoiding risk of damage to the consumable part and/or process module (112-120).

In some implementations, an opening at a side of the process module where the replacement station is mounted may be sized so that the consumable part can easily fit through the opening. Further, the opening in the process module (112-120) may be designed to minimize any asymmetry issues that may occur in the process module (112-120) and in the cluster tool assembly 100 as a whole.

The various embodiments and implementations discussed with reference to FIG. 1 allow the replacement station 108 to be mounted temporarily to the process module (112-120) when a consumable part in the process module (112-120) needs to be replaced, and retracted when the replacement of the consumable part is completed. The replacement station 108 may include a single part buffer with two distinct holding areas to receive and hold the used and new consumable parts or alternately have different part buffers for holding the used and new consumable parts separately. The robot provided in the replacement station 108 and the part buffer(s) allow delivery and retrieval of the consumable part directly to and from the process module (112-120). The isolation valves in the process module (112-120) allow bringing just the process module (112-120) offline instead of the entire cluster tool assembly 100.

Figure 2:
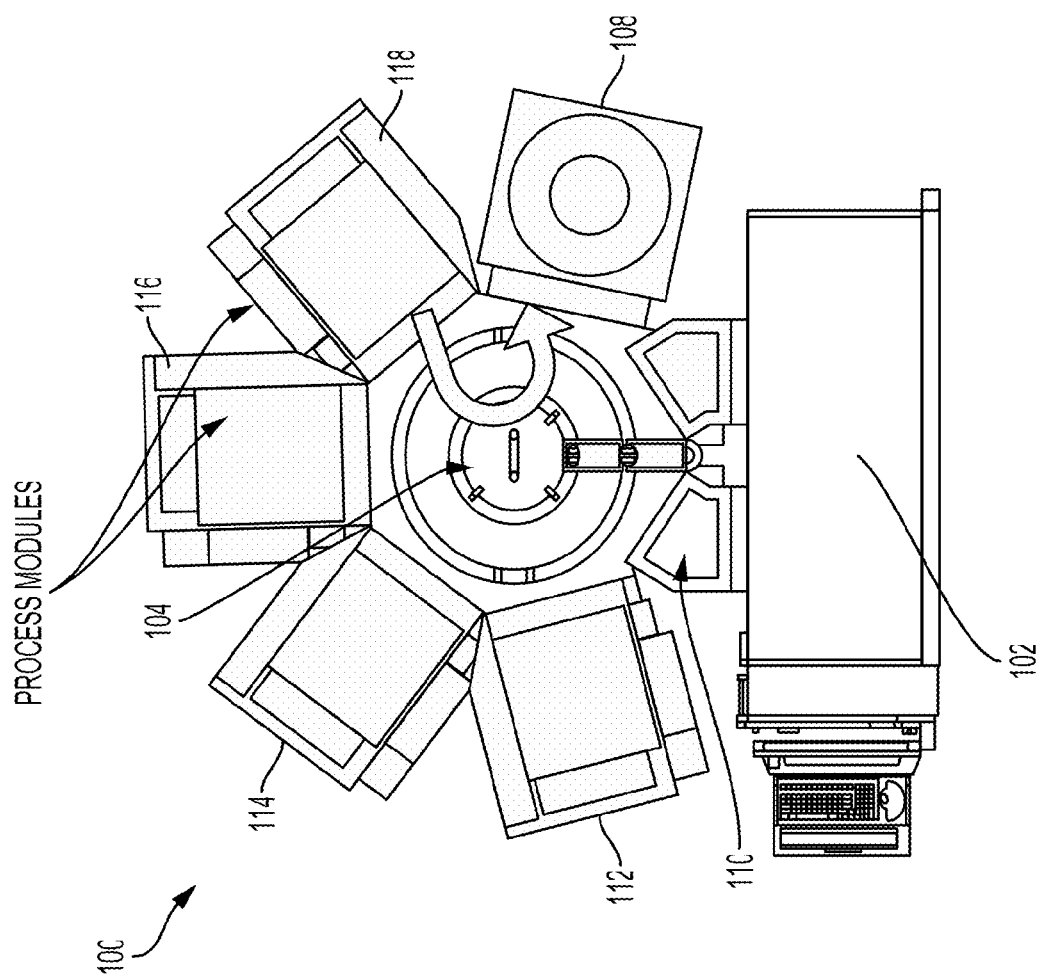
FIG. 2 illustrates a simplified block diagram of a cluster tool assembly that includes a replacement station mounted to a vacuum transfer module of the cluster tool, in an alternate embodiment of the invention.

FIG. 2 illustrates an alternate embodiment of a cluster tool assembly 100 wherein the replacement station 108 is configured to be mounted to a vacuum transfer module (VTM) 104 disposed in the cluster tool assembly 100 instead of the process module (112-118). The VTM 104 includes a robot that is used, during processing of the semiconductor wafer, to move a semiconductor wafer from a loadlock chamber 110 to a process module 112-118, and into and out of one or more process modules 112-118 integrated with the VTM 104. The robot includes an end effector that is used to receive, hold and move the semiconductor wafer between the different process modules. A separate opening is defined in the VTM 104 to allow the replacement station 108 to be mounted such that the replacement station 108 aligns with the opening defined in the VTM 104. Where symmetry is important, the opening in the VTM 104 is defined to preserve the uniformity and symmetry of the VTM 104, and of the cluster tool assembly 100. For example, a dummy opening with a dummy door may be defined in the VTM 104 opposite to the opening, to maintain the uniformity and symmetry at the VTM 104. Alternately, if a dummy opening is already present in the VTM 104 and the opening is large enough to move the consumable part, the replacement station 108 may be mounted to the dummy opening so as to continue to maintain the uniformity and symmetry in the cluster tool assembly 100.

Typically, the opening in the VTM 104 is sized to fit the semiconductor wafer and a carrier/robot that are used to move the semiconductor wafer in to and out of the VTM 104. However, a consumable part that is larger than the semiconductor wafer may not fit through. For example, an edge ring disposed to surround the semiconductor wafer when received in the process module (112-118), is wider than the semiconductor wafer. In such cases, the edge ring as a whole may not be able to fit through the opening that was designed to move the semiconductor wafer, without re-engineering the opening. In some cases, re-engineering the opening of the VTM 104 may not be a viable option as it may affect symmetry of the cluster tool assembly. Therefore, instead of re-engineering the opening of the VTM 104 and causing asymmetry in the cluster tool assembly 100, a segmented consumable part may be used so that each segment may fit through the opening. For example, the edge ring that is used to surround the semiconductor wafer in the process module may be designed as a segmented edge ring made up of two or more parts with each part designed to fit through the opening of the VTM 104 and the replacement station 108. In this example, the segmented edge ring may be individually extracted and replaced.

When replacing the consumable part, especially a multipart segmented consumable part, each segment of the consumable part has to be properly aligned and set within the process module so that no gap is defined between the segments. It should be noted that in process operations, such as a high-aspect ratio etching operation, a gap present between any components of a etch process module would cause the ion to flow through and damage any underlying component. For example, a gap in an edge ring in a high aspect etcher module would cause the high-energy ion to flow through to an underlying chuck on which the edge ring may be disposed, damaging the surface of the chuck. To prevent the gap from forming, the segmented consumable part may be designed to ensure that each segment fits tightly with other segment when installed in the process module.

Accordingly, in some implementations, the segmented or multi-part consumable part may be designed to have interlocking segments. Alternately, the consumable part may be designed to have overlapping segments so as to prevent the ion or processing gas/chemistry from finding a direct flow path to the underlying component. For example, in some implementations, the consumable part may be made of an inner part and an outer part that can either wholly or segmentally fit through the opening defined between the VTM 104 and the replacement station, and installed in the process module with one part overlapping over the other part, thereby preventing gap from forming. Other variations in design of the consumable part may be implemented to enable the consumable part to be moved into and out of the VTM 104 without having to re-engineer the opening that is designed to maintain symmetry in the cluster tool assembly.

In one embodiment, instead of using a dedicated robot in the replacement station 108, a robot used in the VTM 104 to move the semiconductor wafer into and out of the process module, may also be used in the retrieval and replacement of the consumable part. In some implementations, an end effector of the robot that is used to move the semiconductor wafer between the process modules is also used to receive, hold and move the consumable part between the process module 112-118 and the replacement station 108. In other implementations, the robot of the VTM 104 is designed to have different end effectors for moving the consumable part and the semiconductor wafer. An end effector is a part that is usually defined in a robot for retrieving, supporting, holding, picking, lifting, moving, or rotating a moveable part, such as a semiconductor wafer or a consumable part. The moveable part may be held in any orientation plane. Separate end effectors may be provided to separately move the consumable part and the semiconductor wafer so as to prevent contamination of the semiconductor wafer.

In an alternate embodiment, a dedicated robot in the replacement station 108 may work with the robot of the VTM 104 to extract and replace the consumable part in a process module. For example, the robot of the VTM 104 may be used to extract the used consumable part from the process module and move it to a staging area defined between the VTM 104 and the replacement station 108. The dedicated robot of the replacement station 108 may be used to move the used consumable part from the staging area into a part buffer. Similarly, the dedicated robot of the replacement station 108 may be used to move a new consumable part from the part buffer of the replacement station 108 into the staging area and the robot of the VTM 104 may be used to move the new consumable part from the staging area to the process module. In one embodiment, the staging area may have a first area for receiving the used consumable part and a second area for receiving the new consumable part. The lift mechanism in the process module (112-118) is used to install the new consumable part in the process module (112-118).

The design of the replacement station 108 in the embodiment illustrated in FIG. 2 is similar to the design of the replacement station 108 discussed with reference to FIG. 1. For example, the replacement station 108 of FIG. 2 includes a mechanism, such as a pump, to maintain the replacement station 108 at vacuum when the replacement station 108 is mounted to the VTM 104. Maintaining the process condition of the replacement station 108 similar to the VTM 104 (i.e., at vacuum) would ensure that the process condition within the VTM 104 is not adversely affected during replacement of the consumable part. One or more part buffers are defined in the replacement station 108 to receive and hold the used and new consumable parts.

The design of the process module (118) illustrated in FIG. 2 is slightly different from the process module (118) defined in FIG. 1. In that, the process module illustrated in FIG. 2 does not include a second opening. For example, as the replacement station 108 is being mounted directly to the VTM 104 and access to the process module (118) from the replacement station 108 is provided through the VTM 104, the process module (118) does not require a second opening for mounting the replacement station 108. Additionally, a single isolation valve is used to provide access to the process module (118) through the VTM 104 during replacement of the consumable part and for isolating the process module during processing of semiconductor wafer. It should be noted that the replacement station 108 is maintained at vacuum so that the consumable part may be easily replaced without adversely affecting the process condition in the cluster tool assembly 100. Consequently, the conditioning and qualifying of the cluster tool assembly 100 to process the semiconductor wafer may be accomplished in a shorter time as the purge/pump process is not required and the other qualifying steps are performed in a shorter time. The replacement station 108, in some implementations, may be permanently mounted to the VTM 104.

Figure 3:
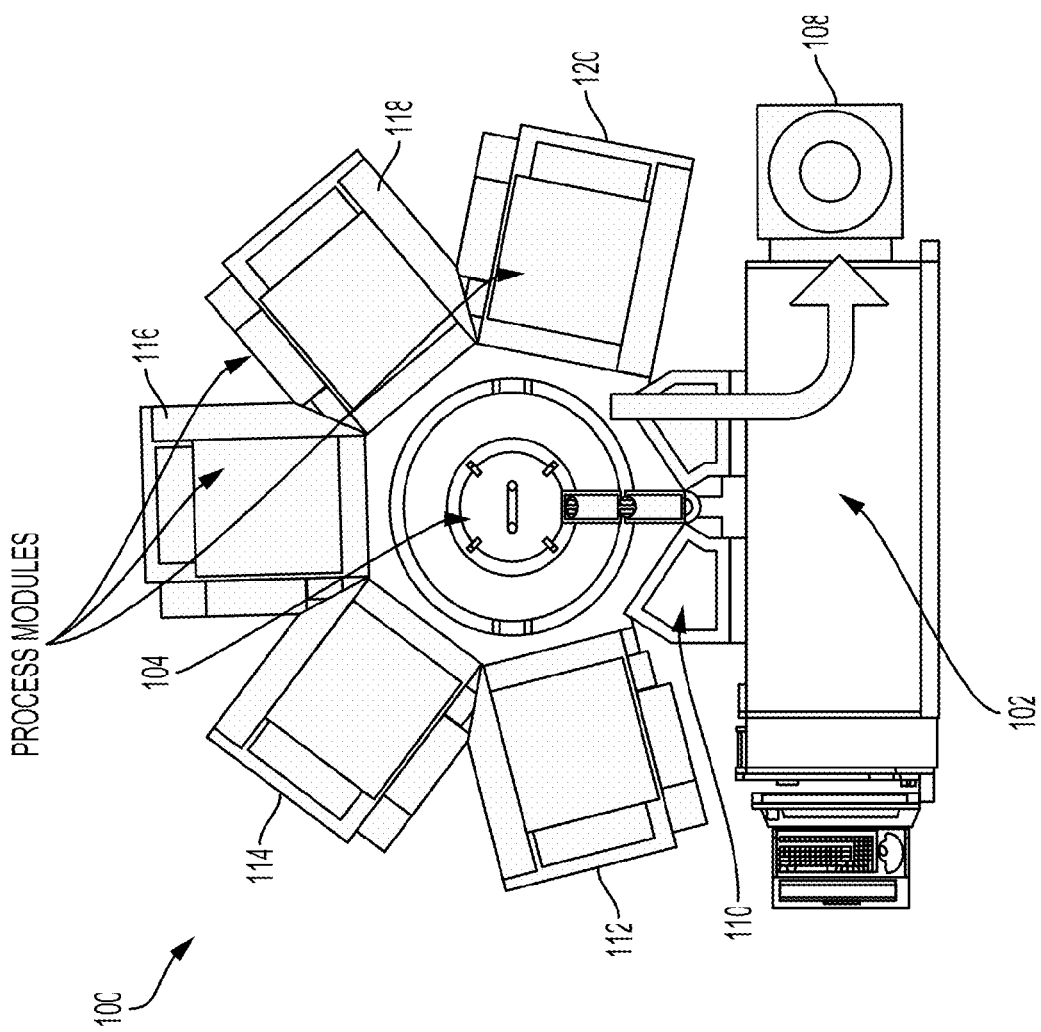
FIG. 3 illustrates a simplified block diagram of a cluster tool assembly that includes a replacement station mounted to an atmospheric transfer module of the cluster tool, in an alternate embodiment of the invention.

FIG. 3 illustrates another embodiment of a cluster tool assembly 100 wherein the replacement station 108 is mounted to an atmospheric transfer module (ATM) 102. A robot in the ATM 102 of the cluster tool assembly 100 used to move the semiconductor wafer from a wafer loader, for example, to a loadlock chamber 110 is also used to move the consumable part to and from the replacement station 108. In this embodiment, the replacement station 108 mounted to the ATM 102 is maintained at same atmospheric condition as the ATM 102. Consequently, the replacement station 108 does not need a pump or similar mechanism to maintain the replacement station 108 at vacuum. In some implementations, the replacement station 108 may be permanently mounted to the ATM 102.

In addition to the ATM 102, the cluster tool assembly 100 illustrated in FIG. 3 includes a vacuum transfer module (VTM) 104 and a plurality of process modules 112-120 integrated with the VTM 104. A loadlock chamber 110 is defined between the ATM 102 and the VTM 104 and acts as an interface to move the semiconductor wafer from ATM 102 to the VTM 104, while preserving process conditions in the ATM 102 and VTM 104.

The loadlock chamber 110 of the cluster tool assembly 100 is designed to handle both the semiconductor wafer and the consumable part. Separate staging areas, such as compartments, may be provided in the loadlock chamber 110 for receiving the semiconductor wafer and the consumable part in order to avoid contaminating the semiconductor wafer. The staging area in the loadlock chamber 110 designed for receiving the consumable part may be further configured to provide separating staging areas for receiving the used consumable part and the new consumable part. An opening defined in the loadlock chamber 110 is designed to fit the consumable part and the semiconductor wafer. Alternately, when the opening is not designed to fit the consumable part, a segmented consumable part may be used so that each segment of the consumable part may fit through the opening defined in the loadlock chamber 110.

In the embodiment illustrated in FIG. 3, a robot in the VTM 104 used to move the semiconductor wafer from the loadlock chamber 110 to a process module (112-120) that is integrated into the VTM 104 or from one process module (112-120) to another, is also used to move the consumable part between the loadlock chamber 110 and the process module (112-120).

In some implementations, in addition to the robot s of the ATM 102 and the VTM 104, the replacement station 108, may include a dedicated robot that is configured to move the consumable part between a part buffer of the replacement station and the ATM 102. In such embodiments, the robot of the ATM 102 may be used to move the consumable part and the semiconductor wafer between the ATM 102 and the loadlock chamber 110, and the robot of the VTM 104 may be used to move the consumable part and the semiconductor wafer between the loadlock chamber 110 and the process module (112-120). In one implementation, a single end effector may be provided in the robots of the ATM 102 and VTM 104 that may be engaged at different times to move both the semiconductor wafer and the consumable part. In another embodiment, separate end effectors may be provided in the robots of the ATM 102 and the VTM 104, one for moving the semiconductor wafer and another for moving the consumable part. A lift mechanism is used to properly align and install the new consumable part at appropriate location within the process module (112-120).

Figure 3A:
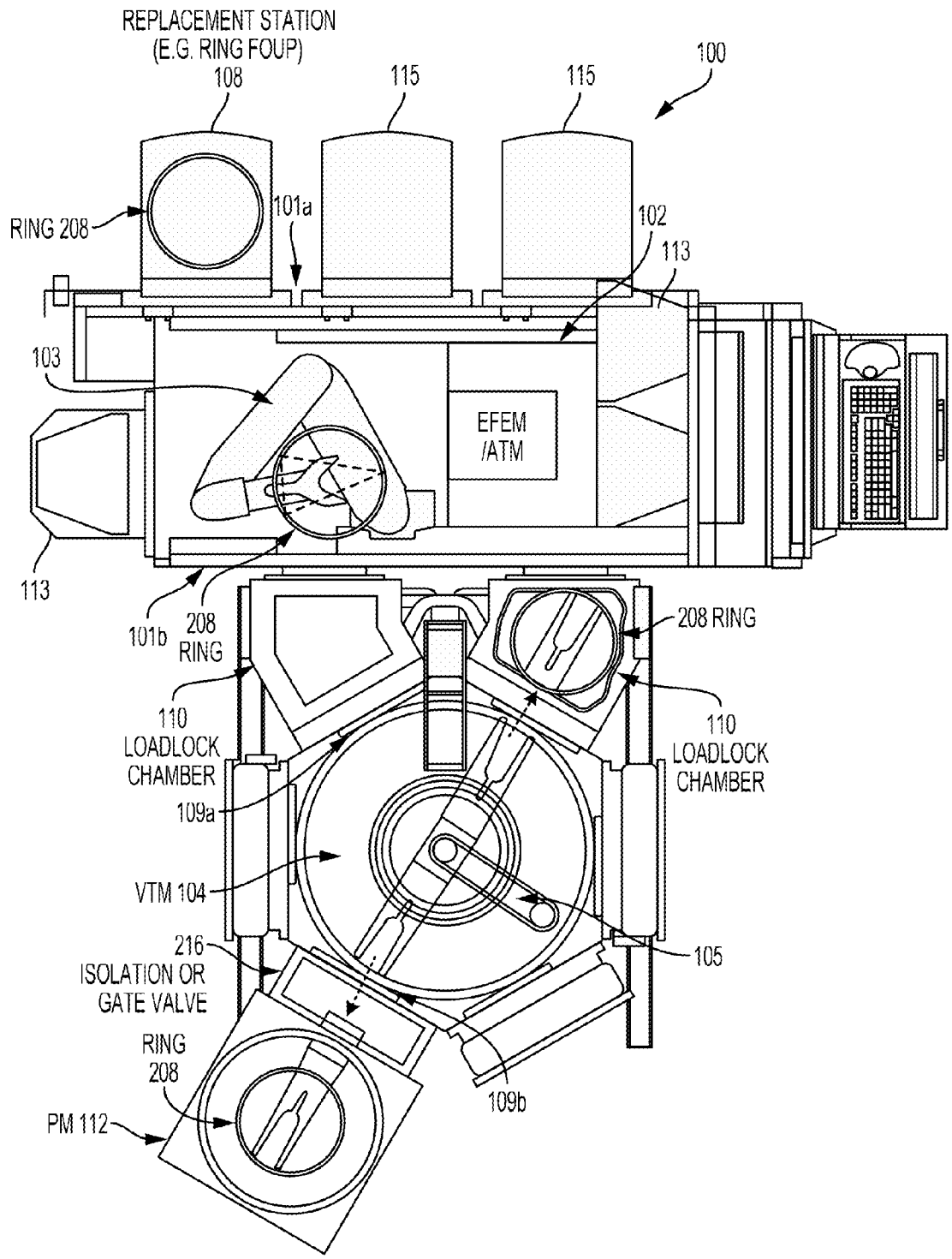
FIG. 3A illustrates a simplified block diagram of a cluster tool assembly that includes robots with end effectors that are used to move the consumable part within the cluster tool, in one embodiment of the invention.

FIG. 3A illustrates a more detailed version of a cluster tool assembly 100 that includes an additional module than what is illustrated in FIG. 3, in one embodiment. As in FIG. 3, the embodiment illustrated in FIG. 3A shows a replacement station 108 coupled to a first side 101*a* of an ATM 102 and use robots of the ATM 102 and a VTM 104 for replacing the consumable part. In this embodiment, in addition to the replacement station 108 being mounted at a first side 101*a* of the ATM 102, one or more wafer loaders 115 are mounted at the first side 101*a* of the atmospheric transfer module 102. The wafer loader 115 may be a standard wafer loader, such as a front opening unified pod (FOUP) or a customized wafer loader that is designed to be coupled to the ATM 102. The replacement station 108 and the wafer loader(s) 115 are configured to be temporarily or permanently coupled to the ATM 102 via specific load ports (not shown) defined at the first side 101*a* of the ATM 102. The door to the replacement station 108 and the wafer loader(s) 115 (both standard and customized wafer loaders) are designed to be compatible with an opening of a standard load port defined on the first side 101*a* of the ATM 102. The wafer loader 115 includes a wafer buffer that includes a plurality of compartments for receiving and holding processed or un-processed wafers. It should be noted that wafers and substrates are used interchangeably in this application and refer to a thin slice of semiconductor material used for fabrication of electronic devices, such as integrated circuits. In some embodiments, the replacement station 108 is similar in structure and design to the wafer loader 115 (e.g., FOUP), and includes a part buffer 224 with a plurality of compartments 207 that are configured to receive and store the new and/or used consumable parts 208.

In addition to the replacement station 108 and the wafer loaders 115, one or more buffer stations 113 may be coupled to the ATM 102. The buffer stations 113 may include dynamic aligners that are generally used to provide alignment inputs to a computer that is communicatively connected to the ATM 102. The alignment input is used to align the wafer when it is being delivered to the loadlock chamber 110. For example, a robot 103 within the ATM 102 may be used to move the wafer from one of the wafer loaders 115 on to a chuck disposed inside a dynamic aligner within the buffer station 113. The chuck is configured to spin the wafer.

A sensor within the dynamic aligner is used to detect one or more notches provided along an edge of the wafer, the off-center of the notch, and provide this data as alignment input to the computer. The computer may provide the alignment input to the robot, so that the robot can use the alignment input to deliver the wafer from the dynamic aligner to the loadlock chamber 110, such that the wafer is properly aligned when delivered. In some implementations, one or more of the dynamic aligners may be used to provide alignment input for the consumable part to the computer to ensure the consumable part is properly aligned when delivered to the loadlock chamber 110. It should be noted that the alignment input for aligning the wafer may be different from the alignment input for aligning the consumable part. In other implementations, the alignment of the consumable part may be done within the replacement station. In such implementations, there is no need to perform further alignment when delivering the consumable part to the loadlock chamber 110.

In some embodiments, the robot 103 within the ATM 102 that is designed to move the wafer is also designed to move a consumable part 208 from the replacement station 108 to the loadlock chamber 110. The existing design of the robot 103 includes an end effector mechanism with "fingers" that are used to support the wafer. However, the fingers on the end effector mechanism are designed to support the wafer, and are therefore short and not designed to provide the contact support for the consumable part, as the consumable part is typically larger in diameter than the wafer. To accommodate for this discrepancy, in one embodiment, the fingers of the end effector mechanism of the robot 103 within the ATM 102 are extended to a length that is sufficient to allow the fingers to provide contact support for the consumable part 208. Although the end effector mechanism with extended fingers has been described as being implemented in the robot 103 of the ATM 102, it should be noted that the end effector mechanism described herein may also be implemented in a robot 105 of the VTM 104.

In an alternate embodiment, the short fingers of the end effector mechanism of the robot within the ATM 102 are used to support a ring carrier. The surface of the ring carrier is used to support the consumable part. The ring carrier may be in the form of a carrier plate that is stored within a housing in the replacement station 108 and retrieved when the consumable part needs to be transported to the loadlock chamber 110. In this embodiment, the fingers of the end-effector need not have to be re-designed as the existing fingers of the end effector can be used to support the carrier plate. Details of the end effector mechanism used within the ATM 102 and/or the VTM 104 will be described in detail with reference to FIGS. 6A-6C. The carrier plate used in supporting and transporting the consumable part will be described with reference to FIGS. 8A-8B, 9A-9B.

Replacing a consumable part in a process module 112 integrated in a cluster tool assembly 100 requires access to the process module 112 and to the consumable part 208 within the process module 112. The access to the process module 112 has been discussed with reference to FIGS. 1-3 wherein a replacement station 108 is mounted directly to a process module (112-120), or to a vacuum transfer module 104 or to an atmospheric transfer module 102 through which access is provided to the process module (112-118, 120). Once the process module (112-120) is accessed, access to the consumable part needs to be provided so that the consumable part can be safely retrieved and replaced without damaging the consumable part or other hardware components of the process module (112-120).

Figure 4:
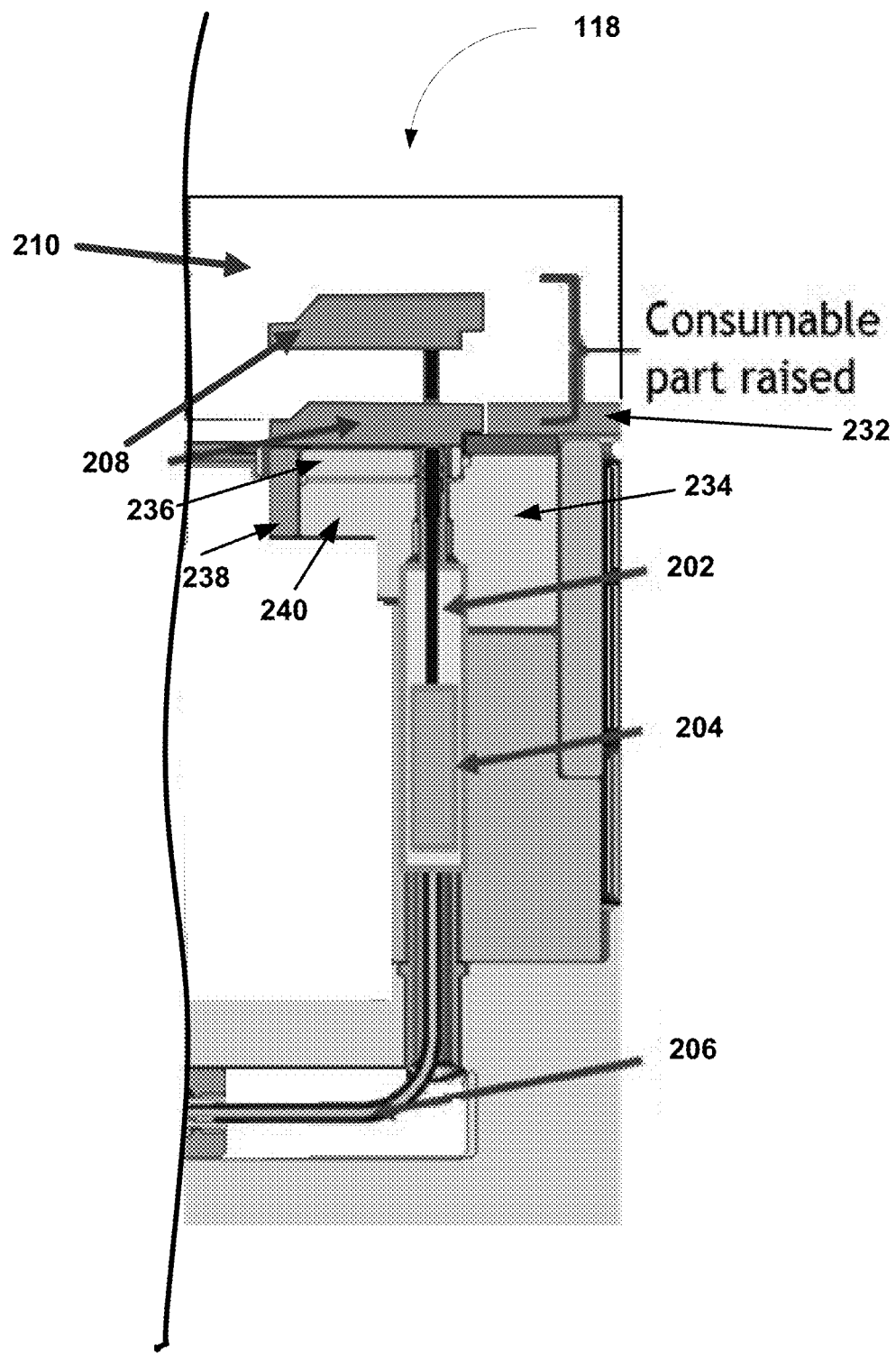
FIG. 4 illustrates a simplified block diagram of a portion of a process module of a cluster tool assembly that includes an example lift mechanism used to provide access to a consumable part, in one embodiment of the invention.

FIG. 4 illustrates an example embodiment of a lift mechanism that may be used within a process module (112-120) of a cluster tool assembly 100 to provide access to a consumable part 208 that needs to be replaced. In some implementations, the consumable part 208 is disposed over a bottom edge ring 236, and adjacent to a cover ring 232. The bottom edge ring 236 is disposed over a base ring 240 and, in some implementations, next to a sleeve ring 238. An insulator ring 234 may be provided between the lift mechanism and a sidewall of the chamber. The lift mechanism is configured to move the consumable part 208 to a raised position so that the consumable part 208 can be accessed. In some implementation, the consumable part 208 is an edge ring that is disposed adjacent to a semiconductor wafer 150 that is received in the process module during processing. The lift mechanism includes a plurality of lift pins 202 that are connected to a plurality of actuators 204. For example, the lift pins may be distributed along a plane to allow the lift pins to contact the consumable part at different points and move the consumable part. In some implementations, the lift pins distributed in a plane may be grouped into distinct sets, with each set of lift pins being operated independently to access and lift different consumable parts. In some implementations, the actuators 204 are vacuum-sealed actuators that are outfitted with plurality of lift pins 202.

The actuators 204 are driven by an actuator drive 206. In a disengaged mode, the lift pins 202 stay retracted inside a housing defined in the lift mechanism and is not in contact with the consumable part 208. When the consumable part 208 needs to be replaced, the actuator 204 is powered through the actuator drive 206. The powered actuator 204 causes the lift pins 202 to extend outside of the housing so as to come in contact with the consumable part 208 and move the consumable part 208 to a raised position. As the process module (e.g., 118) is maintained in a vacuum state, when the consumable part is raised, the consumable part is raised into the vacuum space 210. A robot of either the VTM 104 or the replacement station 108 extends an end effector into the process module 118 and allows it to slide underneath the raised consumable part 208. In some embodiments, the end effector attached to the robot is shaped like a spatula allowing the end effector to support the raised consumable part. Once the end effector has slid into place, the actuators 204 retract the lift pins 202 into the housing, causing the consumable part 208 to rest on the end effector. The robot is then manipulated to pull the end effector back into either the VTM 104 or the replacement station 108, depending on which robot is used to retrieve the consumable part 208, bringing the consumable part 208 with it. A reverse order occurs when a new consumable part 208 needs to be placed in the process module (e.g., 118). The lift mechanism of the process module (e.g., 118) is used to properly install the consumable part in an appropriate location in the process module (118) so that the process module (118) and the cluster tool assembly 100 are operational.

In addition to providing power to the actuators to operate the lift pins to raise the consumable part 208, a power source connected to the actuator drive 206 of the lift mechanism, in some implementations, may supply power to the consumable part through the lift pins. The actuators 204 and the lift pins 202, in such implementations, may be made of conductive material so as to supply power to the consumable part 208. In some implementations, a surface area of the lift pin that comes in contact with the consumable part may act as an electrical contact and be used to supply the power to the consumable part from a power source. In some implementations, the power source is a radio frequency (RF) power source so as to allow the lift pins 202 to supply RF power to the consumable part 208. Additional details of powering the consumable part using RF power source are described in co-owned U.S. Provisional Patent Application No. 62/191,817, filed on Jul. 13, 2015, and entitled "Extreme Edge Sheath and Wafer Profile Tuning Through Edge-Localized Ion Trajectory Control and Plasma Operation," which is incorporated herein by reference in its entirety. In some implementations, the lift pins 202 may be switched. The switch may be used to control amount of power supplied to the consumable part 208. In some implementations, the switch may be used to supply different power to the consumable part 208. In some implementations, the power supplied to the consumable part 208 may be used to heat the consumable part 208. For example, when the consumable part 208 is an edge ring, the power supplied by the power source may be used to provide a temperature controlled edge ring. In some implementations, power may be provided to the consumable part 208 through other means, such as through capacitive coupling. Additional details for providing power to the consumable part 208, such as edge ring, using alternate means, such as capacitive coupling are described in co-owned U.S. Provisional Patent Application No. 62/206,753, filed on Aug. 18, 2015, and entitled "Edge Ring Assembly for Improving Feature Profile Tilting at Extreme Edge of Wafer," which is incorporated herein by reference. It should be noted that the different means for providing power to a consumable part 208 discussed herein are mere examples and other forms of providing power to the edge ring may also be employed. In some implementations, the consumable part 208 (single piece or different pieces of a multi-piece consumable part) may be aligned and installed into position in the process module (e.g., 118) using one or more magnets. For example, the lift mechanism provided in the process module (e.g., 118) may include a surface on which the consumable part 208 is supported. One or more magnets may be disposed on an underside of the surface of the lift mechanism on which the consumable part 208 is supported. The magnets disposed in the lift mechanism may be used to align the consumable part into position within the process module (e.g., 118).

In some implementations, the lift mechanism may be connected to an air compressor or other compressed pressure source to allow the lift mechanism to be operated pneumatically. In some implementations, the lift mechanism may be used to provide electrostatic clamping to clamp the consumable part 208 in position within the process module (e.g., 118). In these implementations, the lift mechanism may be connected to a direct current (DC) power source to allow the lift pins 202 to provide the DC power to clamp the consumable part 208 in position within the process module (e.g., 118).

Figure 5A:
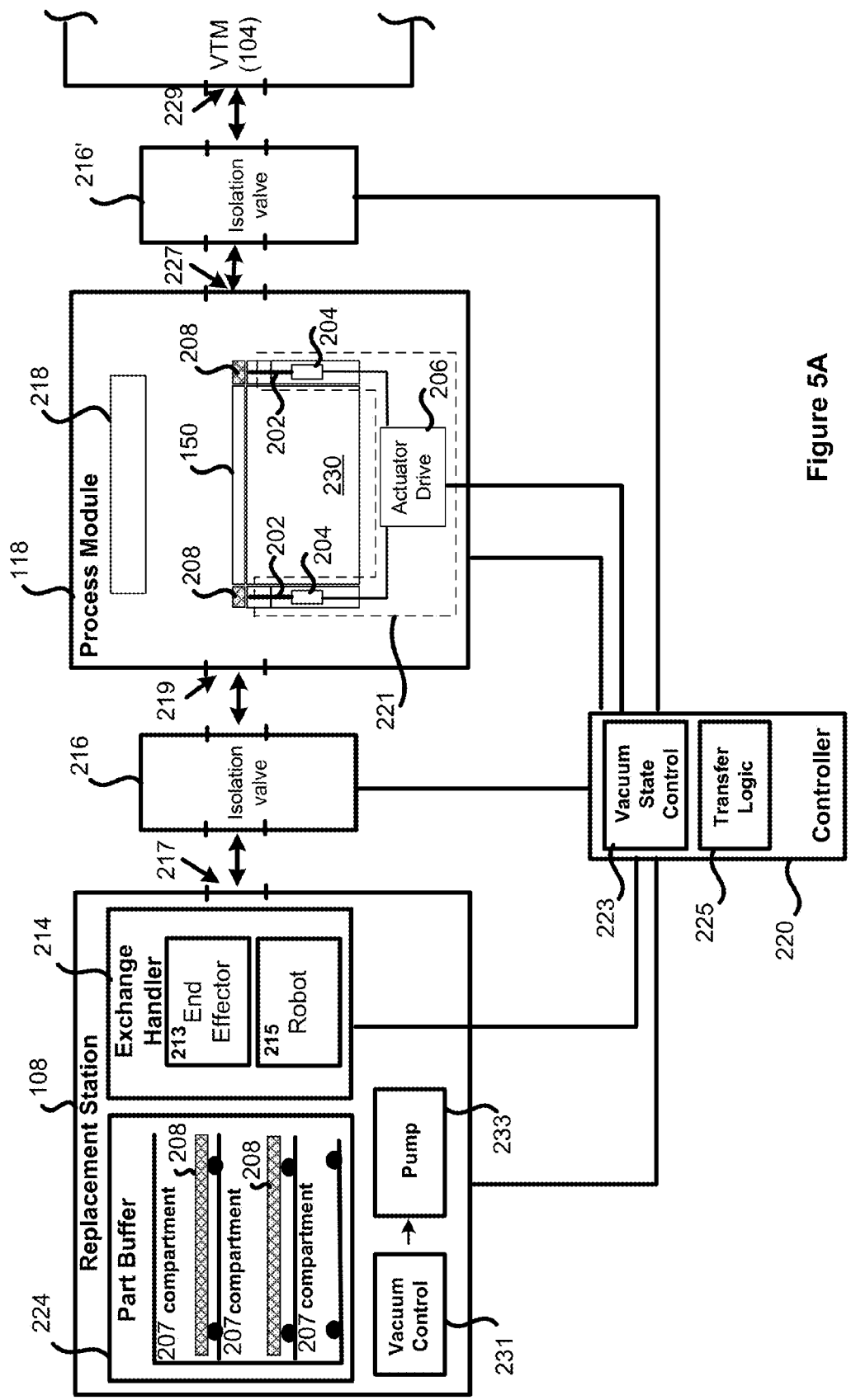
FIG. 5A illustrates a simplified block diagram of a process module with a replacement station mounted for moving a consumable part, wherein a lift mechanism is in a disengaged mode, in one embodiment of the invention.

FIG. 5A illustrates an example cluster tool assembly identifying various components that are used for replacing a consumable part within a process module 118, in one embodiment. The process module 118 may be an etcher module that can be used to generate a transformer coupled plasma (TCP) for performing conductive etching, or a capacitively coupled plasma (CCP) for conducting dielectric etching, or used to perform a plasma enhanced chemical vapor deposition (PECVD) or an atomic layer deposition (ALD), or any other type of etching on a semiconductor wafer. Alternately, the process module 118 may be used to perform any other process operation (e.g., deposition, plating, etc.) to define different features on the semiconductor wafer.

The replacement station 108 may include a part buffer 224. The part buffer 224, in one embodiment, includes a plurality of compartments 207 that are configured to receive used consumable part 208 retrieved from a process module and new consumable part 208 that need to be delivered to the process module. Alternately, separate part buffers 224 may be used to distinctly store used consumable parts 208 and new consumable parts 208. An exchange handler 214 within the replacement station 108 may be used to move the new consumable part 208 from a compartment 207 of the part buffer 224 into the process module 118 and retrieve used consumable part 208 from the process module 118 and store in compartment 207 of the part buffer 224. The exchange handler 214 includes a robot 215 that is configured to move laterally, vertically and/or radially to allow an end effector 213 of the exchange handler 214 to access the consumable part 208 in the part buffer 224 and the process module 118. The end effector may be configured to access, retrieve and deliver the consumable part 208 to the part buffer 224 or the process module. In some implementations, the end effector may be a special end effector that is designed to retrieve, pick, lift, support, hold, move, or rotate the consumable part in any plane. The end effector of the exchange handler 214 may be manipulated to extend and contract during operation so that the consumable part may be retrieved from a process module and stored in the part buffer 224. In some implementations, the end effector may be configured to move radially, laterally and/or vertically to provide greater flexibility during retrieval operation. The exchange handler 214 is connected to a controller 220 to control movement of the robot 215 and the end effector 213 of the exchange handler 214.

The replacement station 108 may also include a vacuum control module 231 that is connected to a pump 233 so as to manipulate the process condition in the replacement station 108. In some implementations, the replacement station 108 is connected to the controller 220 to enable coordinating operation or action of the pump 233 through the vacuum control module 231 during replacement of the consumable part.

A first isolation valve 216 is provided between the replacement station 108 and the process module 118 to allow the replacement station 108 to be mounted to the process module 118. In some implementation, the first isolation valve 216 may be a gate valve. The process module 118 includes a first side and a second side, with the first side of the process module 118 coupled to a vacuum transfer module (VTM) 104, and a second side of the process module 118 coupled to a first side of the first isolation valve 216. A second side of the first isolation valve 216 is coupled to a replacement station 108. The coupling manipulates the doors 217, 219, for example, defined in the replacement station 108 and the process module 118, respectively, so as to allow a robot 215 in the replacement station 108 to access the process module 118. A first side of a second isolation valve 216' is coupled to the VTM 104 and a second side of the second isolation valve 216' is coupled to the first side of the process module 118. The coupling allows manipulation of the doors 227, 229 that cover corresponding openings defined in the process module 118 and the VTM 104, respectively, so as to allow a robot in the VTM 104 to access the process module 118 and move the semiconductor wafer into and out of the process module 118, during processing. The first isolation valve 216 and the second isolation valve 216' are connected to the controller 220 to coordinate coupling of the process module 118 to the VTM 104 and the replacement station 108.

The process module 118 includes an upper electrode 218 that may be used to provide process chemistry to a process region defined in the process module 118. The upper electrode 218 may be connected to a power source (not shown) to provide power to the process chemistry in the process region so as to generate plasma, for example. In some embodiments, the power source may be a RF power source that is connected to the upper electrode 218 through a match network (not shown). Alternately, the upper electrode may be electrically grounded.

The process module 118 also includes a lower electrode 230. The lower electrode 230 is, in some implementations, configured to receive a semiconductor wafer 150 for processing. In some implementations, the lower electrode 230 is an electrostatic chuck. The lower electrode 230 may be coupled to a power source (not shown) to provide power to the lower electrode 230 during processing. Alternately, the lower electrode 230 may be electrically grounded.

The process module 118 includes a lift mechanism 221 to enable the consumable part 208 to be moved to a raised position. The lift mechanism 221 is similar to the lift mechanism discussed with reference to FIG. 4 and includes a plurality of lift pins 202 and actuators 204 to lift the consumable part to a raised position, and an actuator drive 206 connected to the actuators 204 to provide the power to drive the actuator 204. The actuator drive 206 may be coupled to the controller 220 to control operation of the lift mechanism 221 during replacement of the consumable part.

The controller 220 includes a vacuum state control 223 and a transfer logic 225 to facilitate coordinating operation of the various components that are connected to the controller 220. In one implementation, when a consumable part is to be replaced in the process module 118, the replacement station 108 is brought in contact with the first isolation valve 216. In response to detecting the replacement station 108 at the first isolation valve 216, a signal is sent from the first isolation valve 216 to the controller 220. The controller 220 then coordinates the coupling of the replacement station 108 to the process module 118 and maintaining vacuum at the replacement station 108. For example, in response to the detection signal received from the first isolation valve 216, the vacuum state control 223 of the controller 220 may send a signal to the vacuum control module 231 to begin the process of coupling the replacement station 108 to the process module 118. In response to the signal received from the vacuum state control 223, the vacuum control module 231 may activate the pump 233 to allow the pump 233 to bring the replacement station to a vacuum state. Once the replacement station 108 has reached a vacuum state, a signal is sent from the vacuum control module 231 to the vacuum state control 223. The vacuum state control 223 then sends a signal to the first isolation valve 216 to couple the replacement station to the process module 118. The first isolation valve 216, in response, ensures any intermediate region of the first isolation valve 216 between the replacement station 108 and the process module 118 is maintained in a vacuum state. Upon ensuring, the first isolation valve 216 performs the coupling of the process module 118 to a first side of the first isolation valve 216 and the replacement station 108 to a second side of the first isolation valve 216. Further testing may be done to ensure the replacement station 108 and intermediate areas of the first isolation valve 216 are at vacuum before manipulating the doors 217, 219 to provide access to the process module 118.

As part of the coupling operation, the vacuum state control 223 may coordinate operation of a second isolation valve 216' so as to keep the doors 227, 229 covering corresponding openings defined in the process module 118 and the VTM 104 to which the process module 118 is integrated, closed and sealed. During the coupling, the lift mechanism 221 in the process module 118 is kept in a disengaged mode with the lift pins 202 retracted into a housing of the lift mechanism 221 and the consumable part 208 resting in its installed position. For example, the consumable part 208 is an edge ring. In its installed position, the edge ring is positioned adjacent to and substantially surrounding a semiconductor wafer 150, when the semiconductor wafer 150 is present in the process module 118.

Once the process of coupling is completed, a signal is sent from the first isolation valve 216 and, in some embodiments, from the second isolation valve 216', to the controller 220. In response, the controller 220 activates a transfer logic 225. The transfer logic 225 is configured to coordinate movement of the robot 215, the end effector 213 of the exchange handler 214 within the replacement station 108 and the actuator drive 206 of the lift mechanism 221 in the process module 118 to allow the end effector 213 to retrieve the consumable part from the process module 118 and move to a compartment 207 in a part buffer 224 defined in the replacement station 108 and to move a replacement for the consumable part from a compartment 207 of the part buffer 224 back to the process module 118 for installation. The lift mechanism 221 is manipulated to install the replacement consumable part into an appropriate location in the process module 118.

Figure 5B:
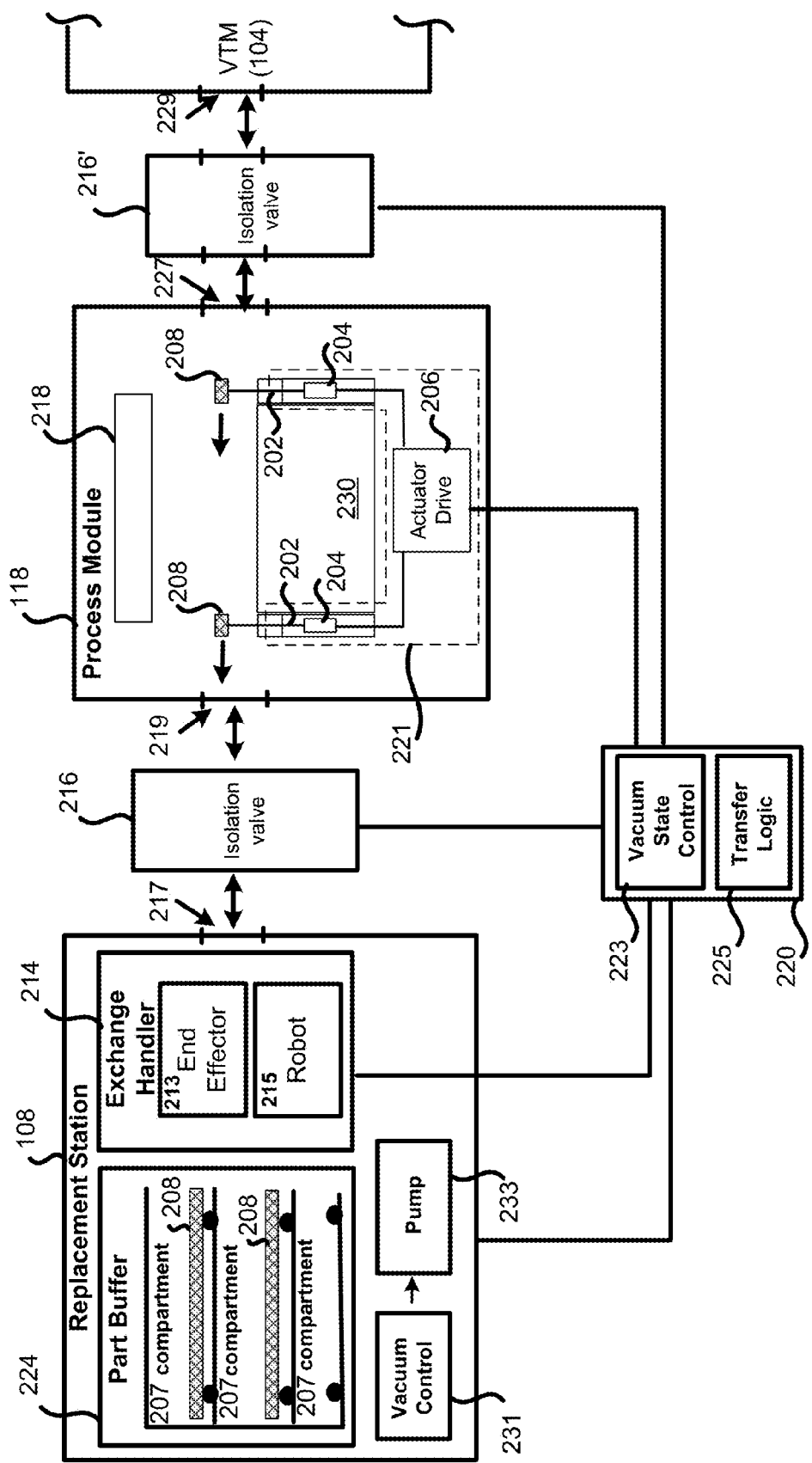
FIG. 5B illustrates a simplified block diagram of a process module with a replacement station mounted, wherein a lift mechanism is in an engaged mode, in one embodiment of the invention.

FIG. 5B illustrates the process followed to retrieve the consumable part 208 from the process module 118, in one embodiment. The consumable part 208 is usually replaced before a semiconductor wafer is received in the process module 118 for processing. In accordance to this embodiment, once the replacement station 108 is coupled to the process module 118 through the first isolation valve 216 and the second isolation valve 216' seals the doors 227, 229 to VTM 104, the transfer logic 225 of the controller 220 is used to send signals to the exchange handler 214 and to the actuator drive 206 to retrieve the consumable part from the process module and replace with a new consumable part. The transfer logic 225 sends signals to manipulate the robot 215 and the end effector 213 to allow the end effector 213 to extend into the process module 118 to retrieve the consumable part. At the same time, the transfer logic 225 manipulates the actuator drive 206 to cause the actuators 204 to move the lift pins 202 out of a housing defined in the lift mechanism 221, thereby moving the consumable part 208 from an installed position to a raised position, as illustrated in FIG. 5B. The end effector 213 slides below the raised consumable part 208 substantially supporting it. The actuator drive 206 is then manipulated to cause the actuators 204 to retract the lift pins 202 into the housing in the lift mechanism 221 allowing the raised consumable part 208 to rest on the end effector 213 of the exchange handler 214. The end effector 213 of the exchange handler 214 is then manipulated to retract into the replacement station 108 bringing the consumable part 208 with it. The end effector 213 is then manipulated to move the retrieved consumable part 208 to a compartment 207 of the part buffer 224.

A new consumable part 208 is moved from a different compartment 207 of the part buffer 224 to the process module 118 in a similar manner. When the new consumable part 208 is moved into the process module 118, the actuator drive 206 is manipulated to cause the actuators 204 to extend the lift pins 202 out of the housing so as to receive the new consumable part 208. The actuators 204 allow the lift pins 202 to be lowered so that the consumable part 208 is set in an installed position in the process module 118. During the replacement of the consumable part, the vacuum state control 223 continually interacts with the vacuum control module 231 to ensure that the pump 233 continues to keep the replacement station in a vacuum state so as to match the vacuum state maintained in the process module 118.

Once the consumable part 208 is replaced, the controller 220 is used to coordinate the withdrawal of the replacement station 108 from the process module 118. In accordance to this, the controller 220 sends a signal to the first isolation valve 216 to close the doors 217, 219 between the process module 118 and the replacement station 108, and a signal to the second isolation valve 216' to unlock the doors 227, 229 so as to allow the VTM 104 to access the process module 118.

In some implementations, the process module 118 may be conditioned before returning the process module to active operation. The conditioning operation may take a shorter time as the replacement of the consumable part was carried out in vacuum and only the process module 118 needs to be conditioned. A signal may then be sent from the vacuum state control 223 to the vacuum control module 231 to allow the pump 233 to purge the replacement station 108. The replacement station 108 may then be dismounted from the process module 118.

Figure 5C:
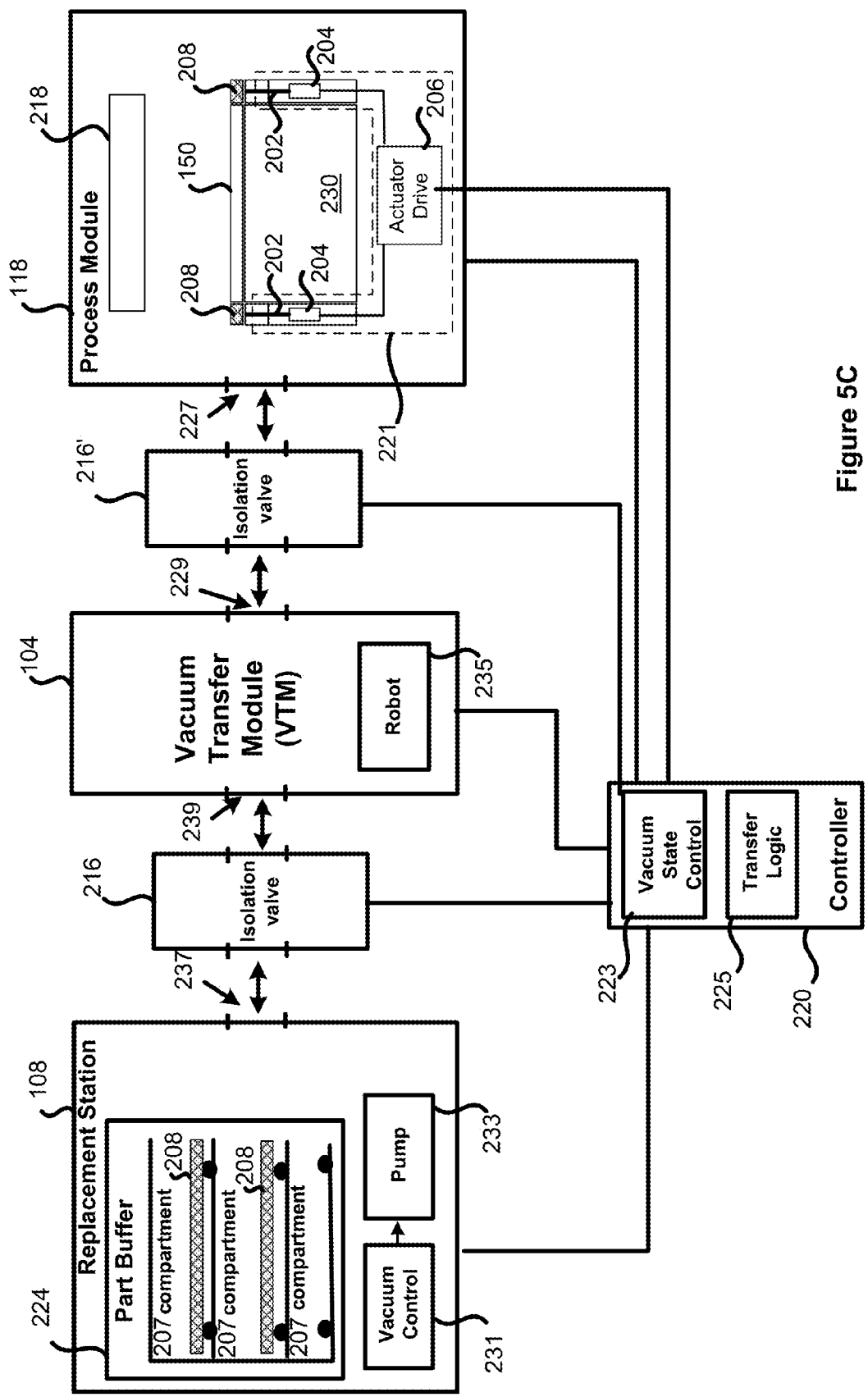
FIG. 5C illustrates a simplified block diagram of a process module with a replacement station mounted to a vacuum transfer module and a lift mechanism in the process module used in replacing the consumable part within the process module, in one embodiment of the invention.

FIG. 5C illustrates the process followed for replacing a consumable part within an embodiment of cluster tool assembly illustrated in FIG. 2, wherein the replacement station 108 is mounted to a VTM 104 instead of the process module 118. In this embodiment, the replacement station 108 is mounted to a vacuum transfer module (VTM) 104 through a first isolation valve 216, such that a first side of the first isolation valve 216 is coupled to a first side of the VTM 104. A replacement station 108 is coupled to the second side of the first isolation valve 216. A second isolation valve 216' is disposed such that a first side of the second isolation valve 216' is coupled to a process module 118 and a second side of the second isolation valve 216' is coupled to the second side of the VTM 104. The first isolation valve 216 is configured to manipulate doors 237, 239 that cover corresponding openings defined in the replacement station 108 and the VTM 104, respectively, and the second isolation valve 216' is configured to manipulate doors 227, 229, that cover corresponding openings defined in the VTM 104 and the process module 118, respectively, so as to allow a robot in the VTM 104 to access, retrieve and move the consumable part between the process module 118 and a compartment 207 in a part buffer 224 in the replacement station 108. The replacement station 108 illustrated in FIG. 5C does not include a dedicated exchange handler 214 with robot 215 and end effector 213. The robot 235 is operatively coupled to the controller 220 so as to allow the controller to coordinate operation of the robot 235. Further, the replacement station, the first isolation valve 216, the VTM 104, the second isolation valve 216' and the process module 118 are coupled to the controller 220 so as to synchronize access between the replacement station and the process module during replacement of the consumable part while the process module 118, the VTM 104 and the replacement station 108 are kept at a vacuum state.

The process of mounting the replacement station 108 to the VTM 104 is similar to the embodiment discussed with reference to FIG. 5A except that the replacement station 108 is mounted to the VTM 104 instead of the process module 118. The process of replacing the consumable part 208 is similar to the embodiment discussed with reference to FIG. 5A except the controller 220 coordinates with the robot 235 of the VTM 104 instead of coordinating with the robot 215, end effector 213 of the replacement station 108 discussed in FIG. 5A.

In an alternate embodiment, the replacement station 108 may include an exchange handler 214 (not shown) with a robot 215 and end effector 213, wherein the exchange handler 214 is operatively connected to the controller 220. The controller 220 is used to control coordination of the robot 215, the end effector 213, and the robot 235 during replacement of the consumable part. In this embodiment, the robot 215 and the end effector 213 may be used to retrieve and move the consumable part between the part buffer 224 and the VTM 104, and the robot 235 of the VTM 104 may be used to move the consumable part between the VTM 104 and the process module 118.

It should be noted that in the embodiment illustrated in FIG. 5C, the second isolation valve 216' is not used to isolate the process module 118 from the rest of the cluster tool assembly 100 during replacement of the consumable part. This is due to the fact that the access to the process module, in this embodiment, is provided through the VTM 104. As a result, second isolation valve 216' is configured to provide access when the consumable part needs to be replaced, while enabling selective isolation of the process module 118 during the processing of a semiconductor wafer. The conditioning of the cluster tool assembly 100 after replacement of the consumable part, in this embodiment, will take shorter time as the replacement station, the VTM 104 and the process module 118 are all maintained in a vacuum state during the replacement of the consumable part.

Figure 6A:
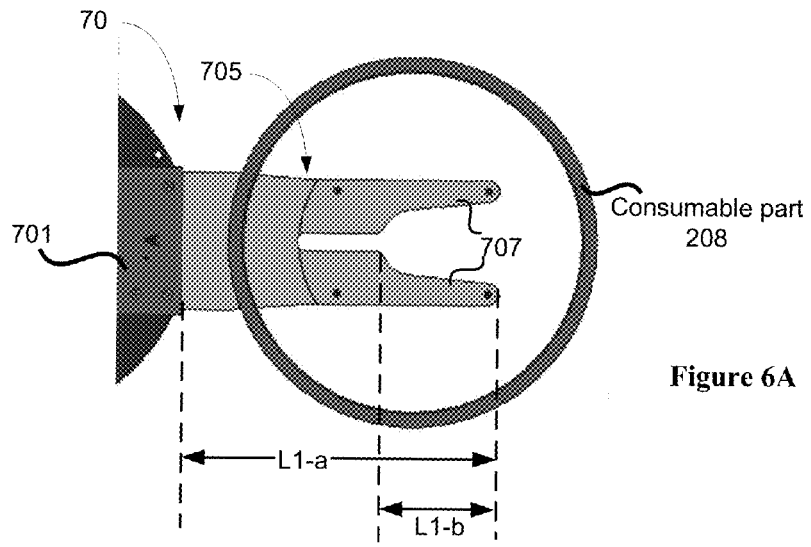
FIG. 6A illustrates an end-effector mechanism used within an ATM that is configured to receive a substrate.

FIG. 6A illustrates an end effector mechanism 70 that is used in a robot 103 of an ATM 102 to transfer wafer between a wafer loader 115 and a loadlock chamber 110. As illustrated in FIG. 6A, the end effector mechanism 70 includes a wrist plate 701 that is connectable to a robot, such as robot 103 in the ATM 102, on one side and to a mounting armset on the other side. In some embodiments, the mounting armset is made of a single plate of stainless steel material. A finger assembly 705 is mounted to a second side of the mounting armset. In some embodiments, the finger assembly 705 is mounted to the mounting armset using a spring loaded mounting to provide a way of leveling adjustment of the finger assembly 705. The finger assembly 705 includes a pair of fingers 707 extending a length that is sufficient to support a wafer but is not sufficient to support a consumable part 208, as shown in FIG. 6A. In some embodiments, the wrist plate 701 and the finger assembly 705 of the end effector mechanism 70 is made of aluminum material. The length L1-$a$ of the finger assembly 705, in some embodiments, is about 280 mm and the length L1-$b$ of the fingers 707 is about 103 mm.

The fingers 707 of the finger assembly 705 may be extended to accommodate a consumable part 208. However, if the fingers 707 of the finger assembly 705 were to be extended, the stainless steel material used in the end effector mechanism 70 of FIG. 6A would cause deflection in the fingers 707 from the wafer transfer plane due to increase in payload caused by the extra material. The amount of deflection would make this end effector mechanism 70 less desirable for use in a tight space, such as space within a cluster tool assembly, where precision in the transfer plane is desired. So, instead of re-designing the finger assembly 705 to extend the fingers 707, the original design of the finger assembly 705 is maintained. The original design of the finger assembly 705 is used to transport the consumable part by allowing the finger assembly 705 to support a ring carrier. The ring carrier is, in turn, used to support the consumable part 208. Details of the ring carrier will be described with reference to FIGS. 8A-8B.

Figure 6B:
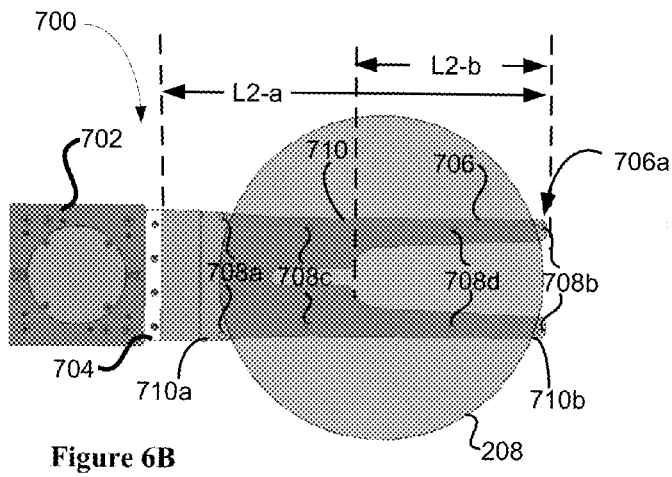
Figure 6C:
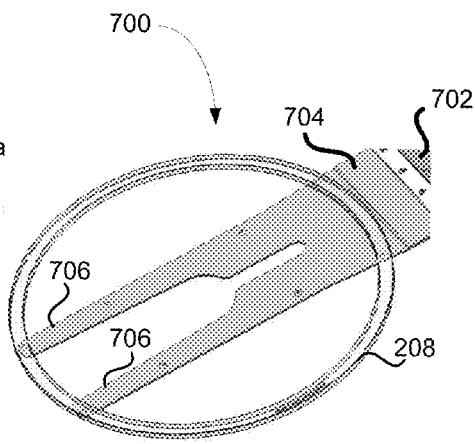
Figures 1, 6B:
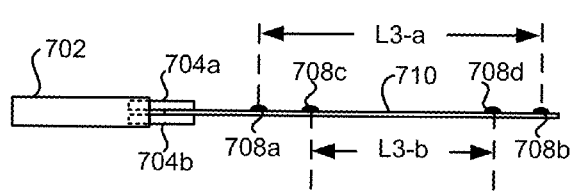

FIGS. 6B, 6B-1, and 6C illustrate an example end effector mechanism 700 that is used in the robot within the cluster tool assembly 100, in some embodiments. FIG. 6B illustrates a top view, FIG. 6B-1 illustrates a side view, and FIG. 6C illustrates a side-angled view of the example end effector mechanism 700 that is used to receive and transport the consumable part. The end effector mechanism 700 illustrated in FIGS. 6B, 6B-1, and -6C is re-designed to allow the end effector mechanism 700 to be able to transport a consumable part in addition to transporting a wafer. It should be noted that the end effector mechanism 700 illustrated in FIGS. 6B, 6B-1, 6C may be implemented in a robot 105 within the VTM 104 and/or in a robot 103 within the ATM 102. The re-designed end effector mechanism 700 includes a wrist plate 702 that is mountable to a robot at one end and to a mounting armset 704 at an opposite end. The mounting armset 704 is defined by a top plate 704$a$ and a bottom plate 704$b$, as illustrated in FIG. 6B-1. The top plate 704$a$ of the mounting armset 704, in some embodiments, is made of stainless steel material and the bottom plate 704$b$ of the mounting armset 704 is made of aluminum. Variations in the material used for the top plate and the bottom plate may be implemented so long as the functionality of the mounting armset is maintained. In some embodiments, a spring loaded mounting may be effectuated between top plate 704$a$ and the wrist plate 702.

A finger assembly 710 with a pair of fingers 706 is clamped between the top plate 704$a$ and the bottom plate 704$b$ of the mounting armset 704 with the pair of fingers 706 extending outward from the mounting armset 704. The finger assembly 710 of the end effector mechanism 700, in some embodiments, is made of ceramic material. The ceramic material provides stiffness to the fingers 706 and the finger assembly 710, thereby reducing deflection from a ring transfer plane, especially when supporting the wafer and/or the consumable part. Further, ceramic is lighter in weight, thereby resulting in reduced payload on the finger assembly 710. The clamping provides a stable mount of the finger assembly 710 while ensuring that it does not cause any stress cracking in the ceramic finger assembly 710. Further, the light-weight ceramic material allows the finger assembly 710 to be aligned substantially parallel to the ring transfer plane so that the consumable part can be smoothly transferred into and out of the loadlock chamber 110. A first pair of consumable contact pads 708$a$ are defined at a proximal end of the finger assembly 710 and a second pair of consumable contact pads 708$b$ are defined at a distal end of the finger assembly 710 proximal to the tips of the fingers 706 of the finger assembly 710. A length L3-$a$ between the consumable contact pads 708$a$, 708$b$ is defined to be about 301 mm. Similarly, a third pair of substrate contact pads 708$c$ are disposed proximal to the first pair of consumable contact pads 708$a$ and a fourth pair of substrate contact pads 708$d$ are disposed proximal the second pair of consumable contact pads 708$b$. The third pair and the fourth pair of substrate contact pads are disposed to be inside the first pair and the second pair of consumable contact pads. A length L3-$b$ between the substrate contact pads 708$c$, 708$d$ is defined to be about 133 mm.

Referring now to FIG. 6B, the finger assembly 710 has a proximal end 710$a$ that is defined adjacent to the mounting armset 704 and a distal end that is defined at tips of the pair of fingers 706. In some embodiments, the length L2-$a$ is defined to cover at least a diameter of the consumable part 208, when received so as to allow the consumable part to be supported. For example, the length L2-*a* of the finger assembly 710 is defined to be at least about 360 mm, and length L2-*b* of the pair of fingers 706 is defined to be at least 182 mm. The finger assembly 710 is used to receive and transport both the consumable part 208 and the wafer. For example, the finger assembly 710 is configured to transport a 300 mm wafer as well as a consumable part, such as an edge ring, that surrounds the 300 mm wafer. In other embodiments, the finger assembly 710 is configured to transport a 200 mm wafer, or a 450 mm wafer, or wafer of any other dimension, as well as a consumable part, such as an edge ring, that surrounds the respective sized wafer. In these embodiments, the finger assembly 710 is sized to support the appropriately sized wafer and consumable part.

To assist in the transportation of the consumable part 208 and the wafer, a plurality of contact pads are provided on a top surface of the finger assembly 710 at varying distances so as to support the consumable part and the wafer, when received. In some embodiments, separate sets of contact pads are provided to allow the consumable part and the wafer to have distinct contact surfaces on the finger assembly 710. This arrangement may be desirable to reduce contamination of the wafer when using the same finger assembly 710 to transfer the consumable part. A first pair of consumable contact pads 708*a* may be disposed on the top surface of the finger assembly 710 and is located at or near the proximal end 710*a* that is close to the mounting armset 704. A second pair of consumable contact pads 708*b* is disposed on the top surface of the finger assembly 710 and is located at or near the distal end 710*b* that is close to the tips 706*a* of the pair of fingers 706. The first pair 708*a* and the second pair 708*b* of the consumable contact pads are used for transferring the consumable part. Similarly, a third pair of substrate contact pads 708*c* is disposed on the top surface of the finger assembly 710 adjacent to the first pair of consumable contact pads and between the first pair and the second pair of consumable contact pads, 708*a*, 708*b*. A fourth pair of substrate contact pads 708*d* is disposed on the top surface of the finger assembly 710 adjacent to the second pair of consumable contact pads and between the first and the second pair of consumable contact pads, 708*a*, 708*b*. The third pair and the fourth pair of substrate contact pads 708*c*, 708*d*, are used to transport the wafer. The consumable contact pads 708*a*, 708*b* are disposed outside of a diameter of the wafer and the substrate contact pads 708*c*, 708*d* are disposed inside of a diameter of the wafer. This design allows separation of the receiving surface of the wafer and the consumable part 208 on the finger assembly 710 so as to minimize contamination of the wafer.

The contact pads, in some embodiments, are made of non-skid material, such as an elastomer material. The location of the consumable contact pads 708*a*, 708*b*, on the top surface of the fingers 706 is such that when the end effector mechanism 700 of the robot lifts the consumable part 208, the contact pad provides a reliable contact support to a bottom surface of the consumable part 208. In some embodiments, more than one set of consumable contact pads 708*a*, 708*b* may be provided at the proximal end 710*a* and the distal end 710*b* of the finger assembly 710, such that they are able to provide reliable contact support. In some embodiments, the additional consumable contact pads 708 may be disposed to provide contact support for a bottom surface of a consumable part 208 with a distinct bottom surface profile that may require more than one contact point.

FIGS. 7A-7D illustrate specific embodiments of the finger assembly 710 used in an end effector mechanism 700 for supporting consumable parts 208 having different bottom surface profiles. The consumable part 208, in some embodiments, may be an edge ring that is disposed adjacent to a wafer, when the wafer is received in a process module 112, for example. The edge ring may have different cross sectional profiles at the bottom surface and the consumable contact pads 708 are disposed on the top surface of the finger assembly 710 to accommodate the different surface profiles of the consumable part 208.

FIG. 7A illustrates an embodiment, wherein a cross section of a bottom surface edge of the consumable part 208 is substantially rectangular. In this embodiment, a consumable contact pads 708 disposed at a top surface of the finger assembly 710 provides sufficient contact surface, when the consumable part 208 is properly aligned and received on the finger assembly 710 of the end effector mechanism 700. In some implementations, the consumable contact pads 708*a*, 708*b* are separated by a distance that is equal to at least a diameter of the consumable part. In the embodiment illustrated in FIG. 7A, the consumable contact pad 708 is disposed such that it contacts a bottom surface of the consumable part 208 at mid span.

FIG. 7B illustrates an alternate cross sectional profile of the bottom surface of the consumable part 208, in one embodiment. The consumable part 208 includes a cut in the bottom surface at an outer diameter of the consumable part 208. The location of the consumable contact pad 708 disposed on a top surface of the finger assembly 710 ensures that the consumable contact pad continues to provide contact support the consumable part 208 and does not miss the bottom surface of the consumable part 208 so long as the alignment of the consumable part 208 on the fingers 706 is within pre-defined position error limits.

FIG. 7C-1 illustrates a second alternate cross sectional profile of the bottom surface of the consumable part 208, in one embodiment. The consumable part 208 includes a cut out in the middle of the bottom surface. If the consumable contact pad 708 disposed at a distance illustrated in FIGS. 7A and 7B were to be used, the contact pad 708 will not provide sufficient or reliable contact with the bottom surface of the consumable part 208, as illustrated in FIG. 7C-1. This would cause the consumable part to be received on the top surface of the fingers 706 instead of the surface of the consumable contact pad 708. As the pair of fingers 706 are made of ceramic material with fine finish, there is a high likelihood that the consumable part 208 received on the pair of fingers 706 may get misaligned during its transportation—a highly undesirable outcome. In order to avoid such misalignment from occurring, additional consumable contact pads may be provided on the finger assembly 710 at different distances so as to ensure that the bottom surface of the consumable part 208 with the cut-out, when received on the finger assembly 710, makes sufficient contact with one or more consumable contact pads 708 disposed on the pair of fingers 706. The consumable contact pads are defined on the finger assembly 710 so as to support consumable part 208 of expected cross section through a range of expected position error, while also staying outside of an expected range of wafer offset such that the wafer, when received never touches the consumable contact pads. FIG. 7C-2 illustrates one such example, where a set of two consumable contact pads 708 are provided on the finger assembly 710 at different distances so as to provide reliable contact support at the bottom of the consumable part 208. The distance between the two consumable contact pads 708 may be configured in accordance to width of the cut-out.

FIG. 7D illustrates a third alternate cross sectional profile of the bottom surface of the consumable part 208, in one embodiment. In this embodiment, the consumable part 208 includes a smaller inner diameter lip so as to allow a wafer to be received over the lip of the consumable part, when received in a process module. The bottom surface of the consumable part 208, in this embodiment, includes a larger surface area than the ones illustrated in FIGS. 7A-7C. As a result, the consumable contact pad 708 disposed on the finger assembly 710 would provide sufficient contact support for the consumable part 208 during transportation. Some embodiments may use a different type of contact pad concept than what is shown in FIGS. 7A-7D.

Figure 7E:
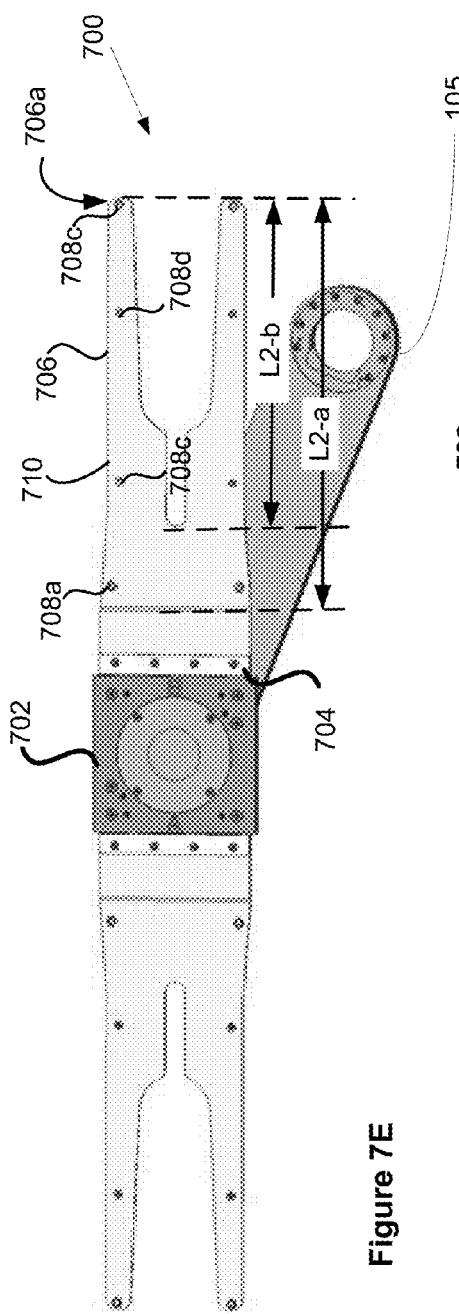
FIG. 7E illustrates an example end effector mechanism on a robot of a VTM, in accordance with some embodiments of the inventions.
Figures 1, 7F:
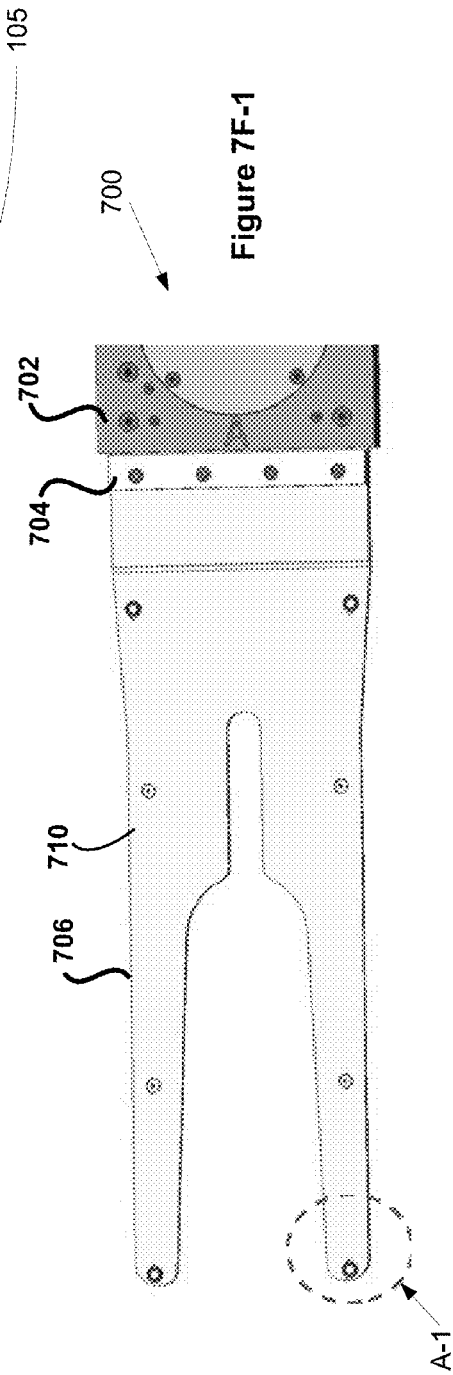
Figures 2, 7F:
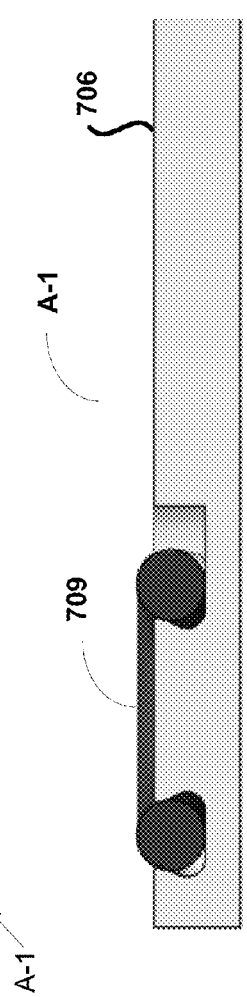

FIG. 7E illustrates the end effector mechanism 700 depicted in a robot 105 within the VTM 104 and FIGS. 7F-1, 7F-2 show details of an alternate contact pad concept used in the end effector mechanism 700, to enable receiving consumable part of varying bottom profiles. The various components of the end effector mechanism 700 illustrated in FIG. 7E are similar to what was discussed with reference to the end effector mechanism 700 depicted in FIG. 6A.

FIGS. 7F-1 and 7F-2 illustrate the alternate contact pad concept used in the end effector mechanism 700 for receiving consumable part, in some embodiments. FIG. 7F-2 shows an expanded view of a portion A-1 of a finger 706 within the finger assembly 710 where an alternate contact pad concept is defined. In such embodiments, a ring-shaped contact structure 709 may be used instead of consumable contact pads 708. In some embodiments, the ring-shaped contact structure 709 may be in the form of an O-ring made of elastomeric material. Using the O-ring or ring-shaped contact structure 709 allows for a ring shaped line contact that spans a larger range of the consumable part radius. It also addresses consumable part bottom profile variation issues that are described with reference to FIGS. 7A-7D and provides more tolerance of position error on the end effector mechanism 700. In some embodiments, the consumable contact pads or ring-shaped contact structure and wafer contact pads are defined to be a permanent part of the end effector mechanism 700. In such embodiments, the contact pads (consumable, wafer contact pads) and/or contact structure may be made of ceramic material or any other metal that is suitable for the environment defined in the ATM 102 or the VTM 104. In other embodiments, the consumable, wafer contact pads or contact structure may be made of a replaceable, consumable material, such as elastomer or other similar type of material.

Referring back to FIGS. 6B-6C, the end effector mechanism 700 illustrated in FIGS. 6B-6C may be employed by a robot 105 within a vacuum transfer module 104, and in some embodiments in a robot 103 within the ATM 102, as well. In alternate embodiments, the end effector mechanism 700 of FIGS. 6B-6C may be employed by the robot 105 of the VTM 104 while configuration of the end effector mechanism 70 illustrated in FIG. 6A or a re-designed end effector mechanism 70 or 700 may be implemented within the robot 103 of the ATM 102.

FIGS. 8A-8B illustrate top views of different end effector mechanisms used in robots within the ATM 102 and the VTM 104, in some embodiments of the invention. As mentioned earlier, the robot 103 in the ATM 102 may use either an existing end effector mechanism 70 with short fingers and a carrier plate, or a modified end effector mechanism 700 with extended fingers to move the wafer as well as the consumable part. FIG. 8A illustrates a top view of an existing end effector mechanism 70 integrated within the robot 103 of the ATM 102 that is typically used to deliver a wafer to a loadlock chamber 110. The existing end effector mechanism 70 may also be used to deliver a consumable part to the loadlock chamber 110. As can be seen in FIG. 8A, the pair of fingers 707 defined in the end effector mechanism 70 is designed to provide contact support for a wafer (not shown) and is not designed to provide contact support for the consumable part 208, which has a larger radius than the wafer. In order to enable the end effector mechanism 70 to be used for supporting and transferring the consumable part, a ring carrier fixture is used.

FIG. 8B illustrates an example embodiment wherein a ring carrier fixture is used with the end effector mechanism 70 in the robot 103 of the ATM 102, to transport the consumable part 208 between a replacement station 108 and the loadlock chamber 110. The ring carrier fixture may be in the form of a carrier plate 1104. In some embodiments, the carrier plate 1104 is made of carbon fiber material. The carbon fiber is light in weight and is ideal for use as it minimizes increase in the payload on the finger assembly 705. The carbon fiber also provides sufficient stiffness to minimize deflection.

In some embodiments, the carrier plate 1104 is configured to be triangular in shape and is sized such that distance of the apexes (1104a, 1104b, 1104c) from a center 1104m of the carrier plate 1104 is at least equal to a radius of the consumable part 208. The triangular shape design of the carrier plate has many advantages. For example, the triangular shape of the carrier plate allows the carrier plate 1104 with the consumable part 208 received thereon, to be moved easily into and out of the loadlock chamber 110 without interfering with any components defined within the loadlock chamber 110. This is possible as the apexes 1104a-1104c enable the carrier plate 1104 to easily move between the finger assemblies 902, for example, defined in the loadlock chamber 110 while maintaining sufficient clearance. Further, as the apexes 1104a-1104c are distributed equidistant from the center of gravity 1104m defined in the center of the triangular shaped carrier plate 1104, the consumable part 208 can be properly supported at the apexes without providing undue stress on any one side.

In one embodiment, the carrier plate 1104 is stored within the replacement station 108 and retrieved by the robot 103 of the ATM 102 using the end effector mechanism 70. In some embodiments, the end effector mechanism 70 provided in the robot 103 of the ATM 102 may be configured to provide sufficient suction force when picking the carrier plate 1104 so that the carrier plate 1104 can be securely received and carried on the end effector mechanism 70. In some embodiments, different carrier plates 1104 may be used to separately transport used and new consumable parts. For example, a first carrier plate may be used to transport used consumable part and a second carrier plate may be used to transport new consumable part.

Using the end effector mechanism 70 with a ring carrier in the form of carrier plate 1104, has its advantages. For example, the existing end effector mechanism 70 may be used and there is no need to re-design the existing end effector mechanism 70. Re-design of the end effector mechanism 70 to support a ring may require a shape change that may interfere with wafer supports or other hardware at various wafer hand-off locations. Such clearance issues may be addressed by changing robot arm trajectories of the robot in the ATM, but trajectory changes may increase wafer transfer times reducing system throughput. The alternative use of a ring carrier allows the use of current trajectories for wafer transfer without any changes to wafer through-put. As necessary, ring transfer specific trajectories can be defined leaving the wafer transfer trajectories unchanged. Further, it has less impact on the existing firmware. In some embodiments, the ring carrier (in the form of carrier plate 1104) may increase the payload which may contribute to deflection from a ring transfer plane. However, by using appropriate light-weight material, such as carbon fiber, for the ring carrier, any increase in the pay load and resulting deflection may be substantially minimized.

FIGS. 9A and 9B illustrate a side and top view of an example end effector mechanism 70 that is used with a ring carrier 1104 for transferring consumable part 208 into the loadlock chamber 110, in some embodiments. The end effector mechanism 70 includes a wrist plate 701 that is attachable to the robot 103 at one end and to a mounting armset 703 at the opposite end. A finger assembly 705 is attached to a second end of the mounting armset 703. The finger assembly 705 includes a pair of fingers 707 extending outward from the mounting armset 703. The finger assembly 705 has a proximal end 705a proximal to the mounting armset 703. A distal end 705b of the finger assembly 705 is defined at finger tips 707a of the pair of the fingers 707. A first carrier contact pad 721a is disposed on a top surface of the finger assembly 705 proximal to a center of a fork 723 that is formed at a base of the fingers 707. A second pair of carrier contact pads 721b is disposed on the top surface of the finger assembly 705 and located proximal to the distal end (705b) of the finger assembly 705. A carrier plate 1104 is supported on the finger assembly 705 using the first carrier contact pad 721a and the second pair of carrier contact pads 721b. The finger assembly 705 is also configured to transport a substrate or wafer. It should be noted that, in some embodiments, the existing end effector mechanism 70 with the ring carrier (in the form of carrier plate 1104) may only be used with the robot of the ATM 102 as it is convenient to store and retrieve the carrier plate 1104 from the replacement station 108 and there is no need to re-engineer any of the other modules for storing the carrier plate 1104. The carrier plate 1104 includes a consumable contact pad 708 disposed at each of the apexes 1104a-1104c at a distance from the center of the carrier plate 1104 that is outside a radius of the substrate. In some embodiments, the distance of the consumable contact pads 708 from the center of the carrier plate 1104 is at least a radius length of the consumable part 208, so as to provide a non-skid contact surface for the consumable part, when received on the apexes of the carrier plate 1104. As discussed with reference to the embodiments illustrated in FIGS. 7A-7D, the consumable contact pads 708 may be provided at different distance from the apexes of the carrier plate 1104. In some embodiments, each apex may include a pair of consumable contact pads 708 disposed equidistant from each of the apexes 1104a-1104c. In alternate embodiments, a plurality of consumable contact pads 708 may be defined at different distances from each of the apexes 1104a-1104c so as to allow the contact pads to provide reliable contact surface for the consumable part 208 with different bottom surface profiles.

In addition to including a modified end effector mechanism 700 within a robot of the ATM 102 and/or the VTM 104, additional modifications may be provided within the loadlock chamber 110 to allow the consumable part to be received therein during a replacement operation.

FIGS. 10A-10F provide various views and details of a support mechanism engaged within the loadlock chamber 110 to receive and support the consumable part, in some embodiments. FIG. 10A illustrates an overhead view of a simplified loadlock chamber 110 that is interfaced between an ATM 102 and VTM 104 within a cluster tool assembly 100 in which a consumable part 208 needs to be replaced, in one embodiment. The loadlock chamber 110 includes a support mechanism 901 for receiving the consumable part 208. The support mechanism 901 includes a plurality of finger assemblies 902 that provide the contact surface onto which the consumable part is received. The finger assemblies 902 are disposed at fixed locations within the loadlock chamber 110. In some embodiments, the finger assemblies 902 are configured to have mutually exclusive contact points for receiving wafers and consumable parts to avoid cross contamination, as will be described in the following paragraphs. It should be noted that the contact points may be at different heights or radial distances to accomplish exclusive separation within expected wafer or consumable part position error.

FIG. 10B illustrates an existing finger assembly 903 within the loadlock chamber 110 that was designed for receiving a wafer. Each finger assembly 903 included a top support finger 903a and a bottom support finger 903b. As shown, a top surface of both the top support finger 903a and the bottom support finger 903b was designed to include a portion that is inclined downward 911. A contact pad 912 was defined proximal to a tip of the top and the bottom support fingers 903a, 903b, to provide a non-skid contact surface for the wafer, when received. A spacer block is defined to support the top and bottom support fingers 903a, 903b. A thickness the spacer block is designed to provide sufficient clearance for receiving a wafer. However, the clearance provided by the spacer block of FIG. 10B is not sufficient for receiving a consumable part, which has a larger radius than the wafer. In order to accommodate the consumable part, the finger assembly in the loadlock chamber is re-designed so as to avoid interference with components of the loadlock chamber when receiving the consumable part.

FIG. 10C illustrates an example re-designed finger assembly 902 of a support mechanism 901 that is used within the loadlock chamber 110 to enable a consumable part to be received thereon, in one embodiment of the invention. The support mechanism 901 includes a plurality of finger assemblies 902. In one embodiment illustrated in FIG. 10A, the support mechanism includes three finger assemblies distributed equidistant from one another along a circumference of a circle. Each of the plurality of finger assemblies 902 includes a top support finger 902a and a bottom support finger 902b. A top surface of the bottom support finger 902b, in one embodiment, is designed to include an indent 908 proximal to a second end of the bottom support finger 902b while a spacer block is disposed between the top support finger 902a and the bottom support finger 902b at a first end. In order to fully accommodate the consumable part, the spacer block 905 is re-designed to provide sufficient clearance to allow the consumable part 208 to be fully received on the finger assembly 902. In the embodiment illustrated in FIG. 10C, the spacer block 905 is shown to be moved farther out from the center of the loadlock chamber 110, closer to a sidewall of the loadlock chamber 110 so as to not interfere with a transfer path of the consumable part. A second spacer block 905" may be disposed below the bottom support finger 902b at the first end and be of same size, thicker or thinner than the re-designed spacer block 905. In some embodiments, instead of providing a spacer block 905, the finger assembly could include a finger support for supporting the top support finger and the bottom support finger 902b while providing a gap there-between. Additionally, in one embodiment illustrated in FIG. 10C, the bottom support finger 902b in each finger assembly 902 within the loadlock chamber 110 is re-designed to include an indent 908 on a top surface at a distance that is equal to at least a radius of a consumable part. A size of the indent 908, in one embodiment, is designed to be at least a width of the consumable part. One or more contact pads are defined on the surface of the finger assemblies 902 to provide a non-skid contact support surface for the wafer as well as the consumable part 208, when received. For example, a substrate contact pad 904 is disposed on a top surface of the top and the bottom support fingers 902a, 902b, at the second end of the finger assembly that is proximal to a tip of the top and bottom support fingers 902a, 902b. In some embodiment, the substrate contact pads 904 are defined at a distance from a center of the support mechanism that is equal to a radius of a wafer so as to provide contact support surface for the wafer, when received. Further, consumable contact pads 906 are defined in the indent 908 of the bottom support finger 902b to provide a contact support for the consumable part 208. Based on a bottom surface profile of the consumable part, additional consumable contact pads 906 may be defined in the indent 908.

In some embodiments, the substrate contact pads 904 at the top support finger 902a may be used to receive the wafer while the consumable contact pad within the indent may be used to receive the consumable part. In alternate embodiments, the top support finger 902a may include the indent 908 with a consumable contact pad 906 for receiving the consumable part 208, while the substrate contact pad 904 on the surface of the bottom support finger 902b may be used to receive the wafer. In an alternate embodiment, the indent 908 may be provided in both the top and the bottom support fingers 902a, 902b. In this embodiment, both the top and the bottom support fingers 902a, 902b are configured to receive the consumable part 208 and the wafer. It should be noted that the consumable part 208 and the wafer are not received on the finger assembly at the same time. In some implementations, it may however be possible to receive the consumable part and the wafer simultaneously by allowing the consumable part to be received at the bottom support fingers 902b while using the top support fingers 902a to receive the wafer or vice versa. In such embodiments, the design positions of the wafer contact pads and the consumable contacts pads is such that the contact surface for receiving the consumable part 208 is kept separate from the contact surface that is used for receiving the wafer to avoid cross-contamination. It should be noted that the wafer contact pad locations are defined such that a wafer received at an extreme of allowed position error will not contact the consumable contact pads. Similarly, the consumable part received at the extreme of allowed position error shall not contact the wafer contact pads. The separation of the contact receiving surfaces is to avoid cross-contamination of the wafer, when received on the finger assembly. In some embodiments, instead of using distinct contact pads, a ring-shaped contact structure may be disposed in the indent 908 defined in the bottom support fingers 902b and/or the top support fingers 902a. The ring-shaped contact structure may be made of elastomer material and could be an O-ring. The contact surface provided by the ring-shaped contact structure spans a larger range of the consumable part radius.

A consumable part, such as an edge ring, disposed close to the wafer within a process module, is exposed to the harsh processing conditions that the wafer is exposed to within the process module. As a result, some of the processing chemicals may have settled on the surface of the consumable part as contaminants. When the consumable part is to be replaced in the process module, the used consumable part with the contaminants is removed from the process module and received into the loadlock chamber 110 and the new consumable part is moved from the loadlock chamber 110 to the process module. As the loadlock chamber 110 is used to move both the consumable part and the wafer into and out of the process modules, if the contact support surface is common for receiving both the consumable part and the wafer, there is a high likelihood that the contaminants from the used consumable part may contaminate the surface of the wafer. In order to prevent such contamination from occurring, one solution is to use separate loadlock chambers 110 to separately move the wafer and the consumable part. This arrangement may be viable but may severely affect the wafer throughput as only one of the two loadlock chambers 110 will be available for moving the wafer.

In order to maintain the wafer throughput and avoid potential wafer contamination, an alternate solution is to allow the available loadlock chambers 110 within the cluster tool assembly 100 to be used to move the new and used consumable parts 208 as well as the pre-processed and processed wafers, in one embodiment. For instance, in one embodiment, the top and the bottom support fingers 902a, 902b may provide separate receiving areas for the consumable part and the wafer. In such embodiment, the plurality of contact pads provided at the finger assemblies allows the contact surface of the wafer to be kept at a separate height from the contact surface of the consumable part. In the case of a consumable part that is in the form of a ring (i.e., edge ring), by maintaining the contact surface of the ring at a different height from the wafer contact surface, wafer surface contamination can be avoided or minimized.

FIG. 10D illustrates an expanded view of one such finger assembly 902 within the loadlock chamber 110 that is used to support both the wafer and the consumable part, in one embodiment. An indent 908 is defined on a top surface of the bottom support finger 902b. One or more consumable contact pads 906 are disposed in the indent 908 for receiving the consumable part 208 and one or more substrate contact pads 904 are disposed near a tip of the support fingers 902a, 902b for receiving the wafer. On the bottom support finger 902b, the consumable contact pads 906 for receiving the consumable part, in one embodiment, are disposed at a distance from a center of the support mechanism that is at least equal to a radius of the consumable part 208 and the substrate contact pads 904 for receiving the wafer are disposed at a distance from the center of the support mechanism that is equal to at least the radius of the wafer. The consumable contact pads 906 disposed in the indent 908 of the plurality of finger assemblies 902 define a ring receiving plane 913b for receiving the consumable part 208, and the substrate contact pads 904 disposed on the finger assemblies 902 define a wafer receiving plane 913 for receiving the wafer. The indent 908 allows the ring receiving plane 913b to be disposed at a different height than the wafer receiving plane 913a, separating the contact support surface for the wafer from that of the consumable part. This separation in the contact support surface is designed to protect the surface of the wafer from contamination by preventing the wafer from coming in contact with any portion of the contact support surface used for receiving the consumable part. In one embodiment, the ring receiving plane 913b is at a lower height ($h_1$) than the wafer receiving plane 913a ($h_2$) (i.e., height $h_1 < h_2$). In one embodiment, the difference between $h_2$ and $h_1$ is at least greater than the height of the consumable part 208. In another embodiment, height $h_1 > h_2$, such that the wafer is received at a lower height and the consumable part is received at a higher height while separating the wafer receiving surface from the consumable part receiving surface.

Of course, the finger assembly design illustrated in FIGS. 10C and 10D is one example of keeping the contact surface of the wafer and the consumable part separate. Other designs may be employed including the finger assembly design where the height $h_1 > h_2$. In this design, a cut-out may be defined at the tips on a top surface of the support fingers 902a, 902b. Surface formed by the cut-out may be used to receive the substrate contact pads 904 for supporting a wafer while a consumable part may be received on the consumable contact pads 906 defined in an indent 908 at the top surface of the bottom support finger 902b. In one embodiment, the cut-out may be formed on the top and/or bottom support fingers 902a, 902b such that it defines a wafer receiving surface for receiving the wafer that is at least at a distance from the center of the support mechanism 901 that is equal to a radius of the wafer and substrate contact pads 904 may be provided thereon for providing a reliable contact support surface for the wafer. Similarly, consumable contact pads provided in an indent 908 defined in the top surface of the support fingers 902a, 902b, provide the contact support surface for the consumable part.

FIGS. 10E and 10F illustrate example airlock chambers before and after re-designing of the support mechanism 901, in some embodiments. The support mechanism 901 includes a plurality of finger assemblies that have been re-designed to accommodate transporting of the consumable part as well as the wafer. The re-designed finger assemblies provide a simple, easy and cost effective solution as it enables the consumable part 208 to be received into the loadlock chamber 110 without having to re-design the loadlock chamber 110 completely. As illustrated in FIG. 10E, in order to fully receive a consumable part 208 on the bottom support finger 902b of the finger assembly within the support mechanism 901, the spacer block 905' has to be re-designed to be moved out of the transfer path of the consumable part. The existing design shown in FIG. 10E shows a spacer block 905' that interferes when receiving the consumable part on the bottom support finger 902b. FIG. 10F illustrates an example embodiment wherein a re-designed spacer block 905 is engaged. The re-designed spacer block 905 is shown to be moved farther from the airlock center, closer to the sidewall. As mentioned earlier, the top and the bottom support fingers may be supported and separated by the re-designed spacer block 905, or alternately by a finger support (not shown) that provides sufficient clearance for allowing the consumable part to be fully received on the bottom support finger.

In order to fully receive the consumable part 208 on a top support finger 902a, there has to be sufficient vertical clearance so as to avoid interference caused by the inside edge radius of the loadlock chamber 110 and such interference may be experienced when moving the consumable part into and out of the loadlock chamber 110. The finger assemblies are designed to take this limitation into consideration by providing at least a minimal clearance between an "exclusion zone" of the consumable part and the upper and lower slot corners of the loadlock chamber. The exclusion zone, as used in this application, refers to a cross-section of the largest consumable part design (e.g., outside diameter and height) and a perimeter offset representing a stack up of tolerances. The tolerance stack up includes position error effects due to leveling, end effector deflection, robot arm trajectory, robot teaching and other tolerance contributors. The upper and lower slot corners are defined as respective areas over an edge of the top and the bottom support fingers of the support mechanism within the loadlock chamber where the consumable part is received. In some embodiments, the minimal clearance defined between the exclusion zone and the slot corner is between about 0.01" to about 0.03". In other embodiments, the minimal clearance is about 0.025".

The finger assemblies 902 are designed such that there is at least a minimal nominal clearance between the consumable part received on the finger assemblies and a sidewall 110a of the loadlock chamber 110. In some embodiments, the minimal nominal clearance is designed to at least be between about 5 mm to about 6 mm. In other embodiments, the minimal clearance is about 5.4 mm. In some embodiments, the minimal nominal clearance to the sides of the loadlock chamber 110 is defined so as to account for consumable part misplacement or position offset that can be corrected by the VTM robot using the dynamic alignment input.

Further, a height of the spacer block 905 in the finger assemblies 902 should be defined so as to provide sufficient vertical clearance between the top and the bottom support fingers 902a, 902b, to allow the consumable part received on the bottom support finger 902b to be moved into and out of the loadlock chamber 110 without any interference. In some embodiments, the spacer blocks 905 in the finger assemblies 902 are designed so as to provide a minimal gap between a top surface of the consumable part received on the bottom support finger 902b and a bottom surface of the top support finger 902a to define a ring transfer plane for moving the consumable part along. In some embodiments, the minimal gap is between about 4 mm and 5 mm. In some embodiments, the vertical clearance defined by the gap is about 4.6 mm. In some embodiments, the vertical clearance between the top support finger and the bottom support finger is designed to provide at least a minimum clearance of about 2 mm to about 3 mm above and below the consumable part when being transferred into and out of the loadlock chamber 110. In another embodiment, the vertical clearance between the top support finger and the bottom support finger is designed to be at least about 2.3 mm above and below the consumable part, to enable transfer. In some embodiments, the vertical clearance is defined to take into account any payload deflection that exists at the end effector mechanism during transfer.

In one embodiment, a high level operation for replacing a consumable part within a cluster tool assembly 100 will now be discussed. As described with reference to FIGS. 3 and 3A, the cluster tool assembly 100 includes one or more load ports to which a wafer loader 115 or a replacement station 108 is permanently or temporarily mounted, an ATM with a first robot for moving the consumable part and the wafer, a loadlock chamber, a VTM with a second robot, and one or more process modules. The consumable part is disposed in the process module and may need to be replaced periodically so that wafer processing can be efficiently effectuated.

In one embodiment, when the consumable part needs to be replaced in a process module, all the process modules integrated with the VTM are brought to an idle state. This means that no wafers are in the cluster tool assembly except where a closed wafer loader is engaged. At least one load port at the ATM is kept free for receiving the replacement station 108, if the replacement station is temporarily mounted. In this embodiment, the cluster tool assembly 100 is not set for simultaneous handling of wafer processing and replacement of the consumable part. In an alternate embodiment, the cluster tool assembly may be configured to simultaneously handle both the replacement of the consumable part and wafer processing. In such embodiment, access to the various modules is coordinated to allow efficient movement of the consumable part and the wafer.

In one embodiment, the replacement station 108 with the replacement consumable part is mounted to the free load port within the cluster tool assembly 100. In one embodiment, the mounting is done manually. In an alternate embodiment, the mounting is done using a robot. In the embodiment illustrated in FIG. 3A, a FOUP type replacement station may be delivered in an automated manner using an Overhead Hoist Transfer (OHT) or Automatic Guided Vehicle (AGV), which may be part of an Automated Material Handling System (AMHS). In one embodiment, the AMHS is installed in a host fabrication facility. The AMHS, in some embodiments, may include an automated stocker where the FOUP type replacement station and/or the wafer loader are stored. The AMHS may include tracking software to guide the OHT or the AGV to the appropriate replacement station or the wafer loader, so that the appropriate replacement station or the wafer loader may be retrieved from the stocker and mounted to a free load port within the cluster tool assembly. The OHT or the AGV, in some embodiments, may be equipped with radio frequency identifier (RFID) tag readers or barcode readers to pinpoint the location of the replacement station or the wafer loader within the stocker of the AMHS. In some embodiments, the stocker may include rows of replacement stations and/or wafer loaders. In such embodiments, the software may guide the OHT or the AGV to the appropriate row and the barcode readers or RFID tag readers may be used to identify specific replacement station or the wafer loader to retrieve from the row. In one example, the OHT or the AGV may therefore retrieve the replacement station and automatically mount it to a free load port defined in a first side of the ATM of the cluster tool assembly.

Upon mounting the replacement station 108, a transfer sequence is initiated on a user interface of a computer that is communicatively connected to the cluster tool assembly. The transfer sequence causes the replacement station 108 to be loaded to the cluster tool assembly. In some embodiment, upon loading the replacement station, a consumable part mapping is done by the ATM robot 103. The mapping, in some embodiments, may be to provide dynamic alignment input so that the consumable part can be aligned when moved into the loadlock chamber. In other embodiments, the mapping may be used to determine presence of the consumable part in each slot.

Simultaneously or sequentially, the VTM robot 105 removes the used consumable part from a process module 112 in the cluster tool assembly 100 and transfers the used consumable part 208 to the loadlock chamber 110. The VTM robot 105 moves the consumable part 208 using planar transfer by coordinating lift pin motion within the process module 112. More information on the lift pin mechanism for removing the consumable part from the process module was discussed with reference to FIG. 4. The VTM robot 105 places the used consumable part 208 in the bottom support finger 902b of the finger assemblies 902. In some embodiments, both the top and the bottom support fingers 902a, 902b may be used to transport used or new consumable part 208. In one embodiment, the bottom support finger 902b may be used to only receive the used consumable part 208 and the top support finger 902a may be used to only receive the new consumable part 208, or vice versa. In other embodiments, the receiving of the used and new consumable parts are not restricted to particular one of the support fingers but may be received on any one of the top or the bottom support fingers 902a, 902b. The dynamic alignment is active in the loadlock chamber 110 during the replacement of the consumable part 208.

Once the used consumable part 208 is placed on the support mechanism 901 of the loadlock chamber 110, the airlocks are vented to bring the loadlock chamber 110 to ambient condition. The ATM robot 103 is then activated to remove the consumable part 208 from the loadlock chamber 110 and transfer it to the replacement station 108. In one embodiment, this may include the ATM robot 103 to retrieve the ring carrier (i.e., carrier plate) 1104 from the replacement station 108 and use it for retrieving the used consumable part from the loadlock chamber 110. The ATM robot 103 then picks the new consumable part 208 from the replacement station 108 and transfers it to the loadlock chamber 110. After receiving the new consumable part 208, the loadlock chamber 110 is pumped to vacuum. In order to pump the loadlock chamber 110 to vacuum, the loadlock chamber 110 may, in one embodiment, be coupled to a pump through a vacuum control module (not shown) that interfaces with a controller. The controller is used to coordinate action of the pump so as to allow the loadlock chamber 110 to be pumped to vacuum when the new consumable part 208 is to be moved through the VTM 104 into the process module 112. Once the loadlock chamber 110 is set to vacuum state, the VTM robot 105 is activated to pick the consumable part 208 from the loadlock chamber 110 and transport it to the process module 112. In one embodiment, access to the loadlock chamber 110 is controlled through a gate valve that interfaces between the VTM 104 and the loadlock chamber 110. Similarly, access to the process module 112 through the VTM 104 may be controlled through a second gate valve, such as an isolation valve, as discussed with reference to FIG. 5C. The second gate valve may be operated using a sensor mechanism. As the dynamic alignment is active during the replacement of the consumable part 208, when the VTM robot 105 picks the consumable part 208 from the loadlock chamber 110, it picks the consumable part 208 with the dynamic alignment correction and places it into the process module 112. The lift pin mechanism in the process module 112 extends the lift pins to receive the consumable part 208, positions the consumable part 208 in installed state, and then retracts the lift pins inside a housing (e.g., lift pin housing). In one embodiment, replacement of the consumable parts 208 in more than one process module 112-120 (alternately termed "process chamber") may be handled sequentially one at a time, using this process.

Figure 11:
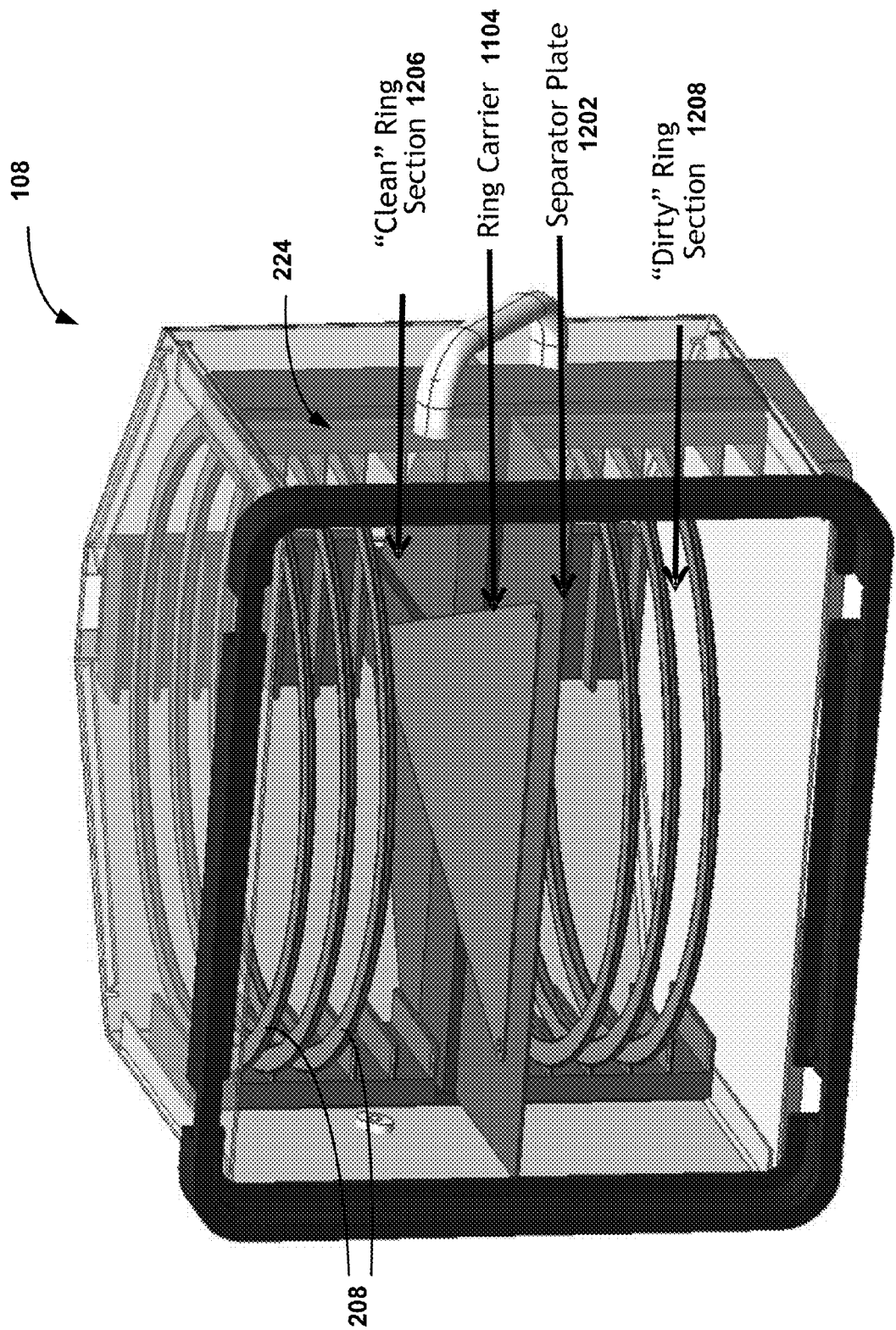
FIG. 11 illustrates an example replacement station used for storing consumable part and a ring carrier, in accordance with an embodiment of the invention.

FIG. 11 illustrates an example replacement station 108 that is used to store new and used consumable parts 208, in one embodiment. In one embodiment, the replacement station 108 may be similar in structure to a wafer loader and include a part buffer 224 with a plurality of compartments 207 to store the consumable part 208. In one embodiment, the part buffer includes a "clean" or "new" consumable part section 1206 for receiving and storing new consumable parts 208, and a "dirty" or "worn" consumable part section 1208 for receiving and storing used and worn, possibly contaminated consumable part 208. A separator plate 1202 may be provided in the replacement station 108 to separate the clean consumable part section 1206 and the dirty consumable part section 1208. In one embodiment, a ring carrier in the form of carrier plate 1104 may be stored in a housing provided within the replacement station. In one embodiment, the housing for the carrier plate 1104 may be provided within the clean or new consumable part section 1206. The housing for the carrier plate 1104 may be provided at the bottom, at the top or anywhere in-between the bottom and the top of the clean or new consumable part section 1206. In an alternate embodiment, the carrier plate 1104 may be housed in the dirty or worn consumable part section 1208. The housing for the carrier plate 1104 may be provided at the bottom, at the top or anywhere in-between the bottom and the top of the dirty or worn consumable part section 1208. In some embodiments, the replacement station 108 may house two carrier plates 1104—one within the clean or new consumable part section 1206 and the other within the dirty or worn consumable part section 1208, so that the new and the used consumable parts may be separately transferred between the replacement station and the loadlock chamber 110. In alternate embodiments, instead of or in addition to a replacement station 108, one or more sections may be defined within the ATM 102 to store used and new consumable parts. In such embodiments, the consumable parts may be delivered and removed from the ATM 102 using the replacement station 108 and the robot in the ATM 102 or with other means of delivery and removal.

Figure 12:
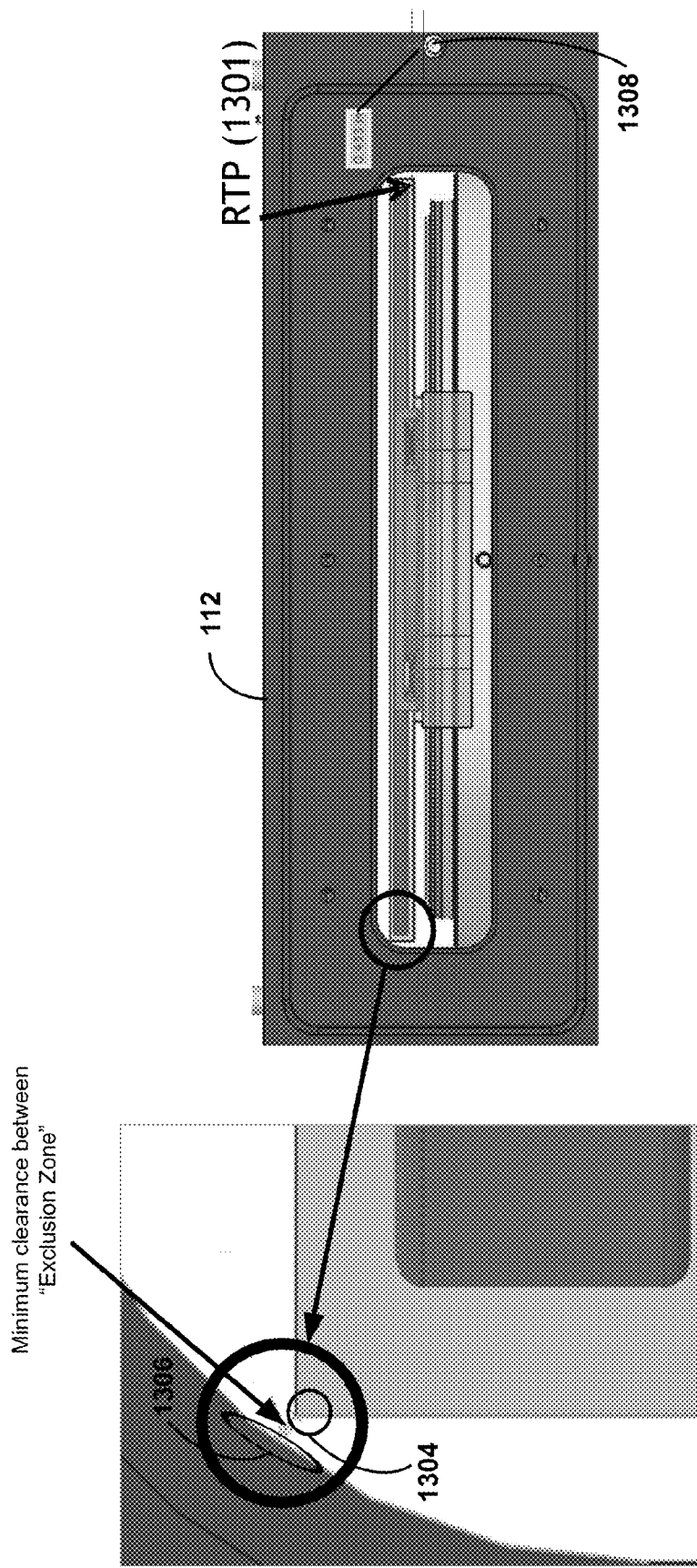
FIG. 12 illustrates an example view of a slot within a process module through which a consumable part or a wafer is moved into and out of the process module, in one embodiment of the invention.

FIG. 12 illustrates an example slot view into a process module in which a consumable part is being received, in one embodiment. The consumable part is received along a ring transfer plane (RTP) 1301 that is located above a set of chamber interface pins 1308 within the process module 112, for example. In some embodiments, the RTP 1301 is defined to be above the chamber interface pins (CIPs) 1308. In certain embodiments, the height of the consumable part above a top surface of an electrostatic chuck (ESC) that is disposed in the process module 112, is defined to allow sufficient clearance for the consumable part to move into and out of the process module 112 without any interference. In such embodiments, the clearance ensures that the consumable part, the end effector mechanism with the armset is able to fit through the slot opening of the process module 112. Since the slot opening is designed for wafer transfers, the consumable part size may be limited by the slot size. When a wider consumable part is to be transferred, a segmented consumable part may be used to fit into the existing slot opening of the process module 112 instead of redesigning the slot opening. In specific examples, a relative height of the ESC biases the consumable part toward the top of the slot. Due to the specific size of the slot corner radius, there may be a trade-off between consumable part height and diameter. To ensure sufficient clearances are found all around, a tolerance zone may be defined around the consumable part and robot to represent the combined volume during transfer. The tolerance zone will have to take into account load deflection effects, robot arm trajectory error, leveling error effects, and other factors. In some embodiments, the clearances above, below and to the sides of the nominal ring transfer path can be as little as a few millimeters or less.

In some embodiments, the RTP is different from the wafer transfer plane (WTP). In such embodiments, the WTP is defined to be above the CIPs 1308 and the RTP, when the wafer is being transferred into and out of the process module 112. In some embodiments, a minimum clearance is defined between the exclusion zone 1304 of the consumable part 208 and the inner corner radius 1306 of an opening into the process module 112 through which the wafer and the consumable part are transported. In some embodiments, the minimum clearance may be a few millimeters in dimension. This minimal clearance allows the consumable part to be moved into and out of the process module 112 without any part of the process module 112 interfering in the transfer of the consumable part.

The various embodiments have been described defining an end effector mechanism employed within robots of an ATM 102 and VTM 104 that are used to transport a wafer to also transport a consumable part. In some embodiments, the end effector mechanism is re-designed so that the finger assembly extends beyond the edge of a wafer so as to allow support of the consumable part. In alternate embodiments, an existing end effector mechanism is used to transport the consumable part. In such embodiments, an intermediate fixture, in the form of a ring carrier, is used temporarily, during consumable part transfer to support the consumable part, as the existing end effector mechanism is not designed to support the consumable part. The finger assemblies within the loadlock chamber are re-designed to support the consumable part. The re-designed end effector mechanism and the finger assembly have a plurality of contact pads to define mutually exclusive contact points for wafers and consumable parts to avoid cross contamination. The contact pads (consumable contact pads, wafer contact pads) may be designed so as to provide contact points at different heights or radial distances to accomplish exclusive separation within expected wafer or consumable part position error.

The consumable part may oftentimes exceed a diameter, thickness, and weight of a wafer. Therefore, addition of consumable part transfer to tools that are not initially designed for such transfer is limited by clearances within the existing hardware. Additional payload induced deflection reduces the clearances further. So, in order to accommodate the increase in payload and reduce deflection, the end effector mechanism may be made of higher stiffness materials, such as ceramics, to limit increase in deflection or thickness, while reducing total payload on the robot using the re-designed end effector mechanism. Various contact pads (wafer, consumable contact pads) are defined on the surface of the finger assembly within the end effector mechanism to support the consumable part within expected positional error ranges and possibly with varied bottom surface profiles. The same alignment inputs used for centering the wafers may also be used to position and center the consumable part. The consumable parts may be delivered to and removed from the cluster tool assembly via a standard wafer FOUP load port defined in the ATM. A pod used for delivering and removing consumable part, is designed to be similar to the FOUP design used for delivering wafers. The pod can be part of a replacement station that can be temporarily mounted to the load port of the ATM manually or by an automated system, such as an overhead track FOUP delivery system. This temporary mounting allows replacement of the consumable part without displacing or consuming other wafer storage or processing hardware on the ATM (i.e., wafer buffers, cool stations, integrated metrology, etc.). In alternative embodiments, the consumable parts may be received into the ATM via the replacement station, stored temporarily within the ATM separate from the load port and retrieved when the consumable part needs to be replaced. The various embodiments described herein provide an efficient, cost-effective way of replacing the consumable part within a cluster tool assembly without breaking the vacuum seal, thereby allowing the cluster tool assembly to have a shorter downtime. Reduced downtime of the cluster tool assembly would result in improved wafer throughput.

Figure 13:
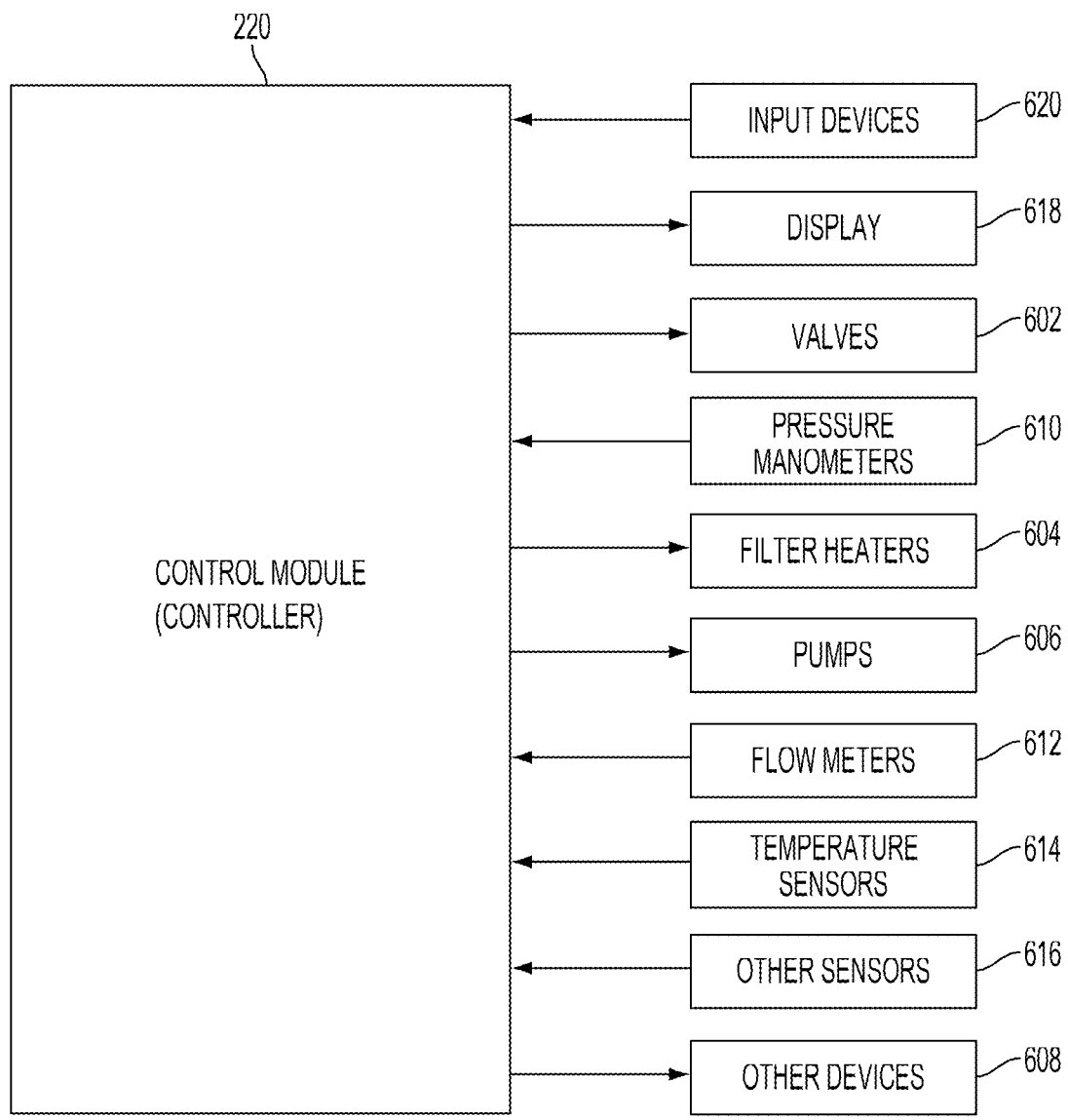
FIG. 13 illustrates a control module (i.e., a controller) for controlling various aspects of a cluster tool, in accordance with one embodiment.

FIG. 13 shows a control module (also referred to as a "controller") 220 for controlling the cluster tool assembly described above. In one embodiment, the controller 220 may include some example components, such as a processor, memory and one or more interfaces. The controller 220 may be employed to control devices in a cluster tool assembly 100 based in part on sensed values. For example only, the controller 220 may control one or more of valves 602 (including isolation valves 216, 216' of FIGS. 5A, 5B, 5C), filter heaters 604, pumps 606 (including pump 233), and other devices 608 based on the sensed values and other control parameters. The controller 220 receives the sensed values from, for example only, pressure manometers 610, flow meters 612, temperature sensors 614, and/or other sensors 616. The controller 220 may also be employed to control process conditions during precursor delivery and deposition of a film. The controller 220 will typically include one or more memory devices and one or more processors.

The controller 220 may control activities of the precursor delivery system and deposition apparatus. The controller 220 executes computer programs including sets of instructions for controlling process timing, delivery system temperature, pressure differentials across the filters, valve positions, robots and end effectors, mixture of gases, chamber pressure, chamber temperature, wafer temperature, RF power levels, wafer chuck or pedestal position, and other parameters of a particular process. The controller 220 may also monitor the pressure differential and automatically switch vapor precursor delivery from one or more paths to one or more other paths. Other computer programs stored on memory devices associated with the controller 220 may be employed in some embodiments.

Typically there will be a user interface associated with the controller 220. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module (i.e., controller) parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber or process module components necessary to carry out the inventive deposition processes. Examples of programs or sections of programs for this purpose include substrate positioning code, process gas control code, pressure control code, heater control code, plasma control code, lift mechanism control code, robot position code, end effector position code and valve position control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck. The valve position control code may include code to control access to a process module or the cluster tool assembly by controlling isolation valves that provide access to the process module or the cluster tool, for example. The lift mechanism control code may include code to activate the actuator drive to cause the actuators to move the lift pins, for example. The robot position code may include code to manipulate the position of the robot(s) including manipulation of the robot to move along a lateral, a vertical, or a radial axis, for example. The end effector position code may include code to manipulate the position of the end effector including manipulation of the robot to extend, contract, or move along a lateral, a vertical or radial axis, for example.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

Front Opening Ring Pod:

With the various embodiments discussed in relation to position of replacement station at different modules of a cluster tool assembly, finger assembly within a loadlock chamber and end effector mechanisms of different robots used inside the cluster tool assembly for moving the consumable parts, attention will now be directed to details of a pod that is part of a replacement station used to supply new consumable parts to and removing old or damaged consumable parts from the cluster tool assembly. In some embodiments, the consumable part may be an edge ring. In alternate embodiments, the consumable part may be a focus ring, a dielectric ring, or any other consumable part that may be used in a process module and exposed to processing conditions within the process module. The consumable part may surround a substrate or portions of a substrate received in the process module, surround a chuck or portions of a chuck defined inside the process module, or any other consumable component disposed in other portions of the process module and is exposed to the process conditions within the process module. The consumable part may be a single unit or may include a plurality of parts. Alternately, the consumable part may include multiple rings. The consumable part may be made of quartz, ceramic, silicon, dielectric material or coated with different materials. Due to the processing conditions in the process module, the edge ring may get worn out or damaged and has to be replaced periodically in a prompt manner.

Figure 14:
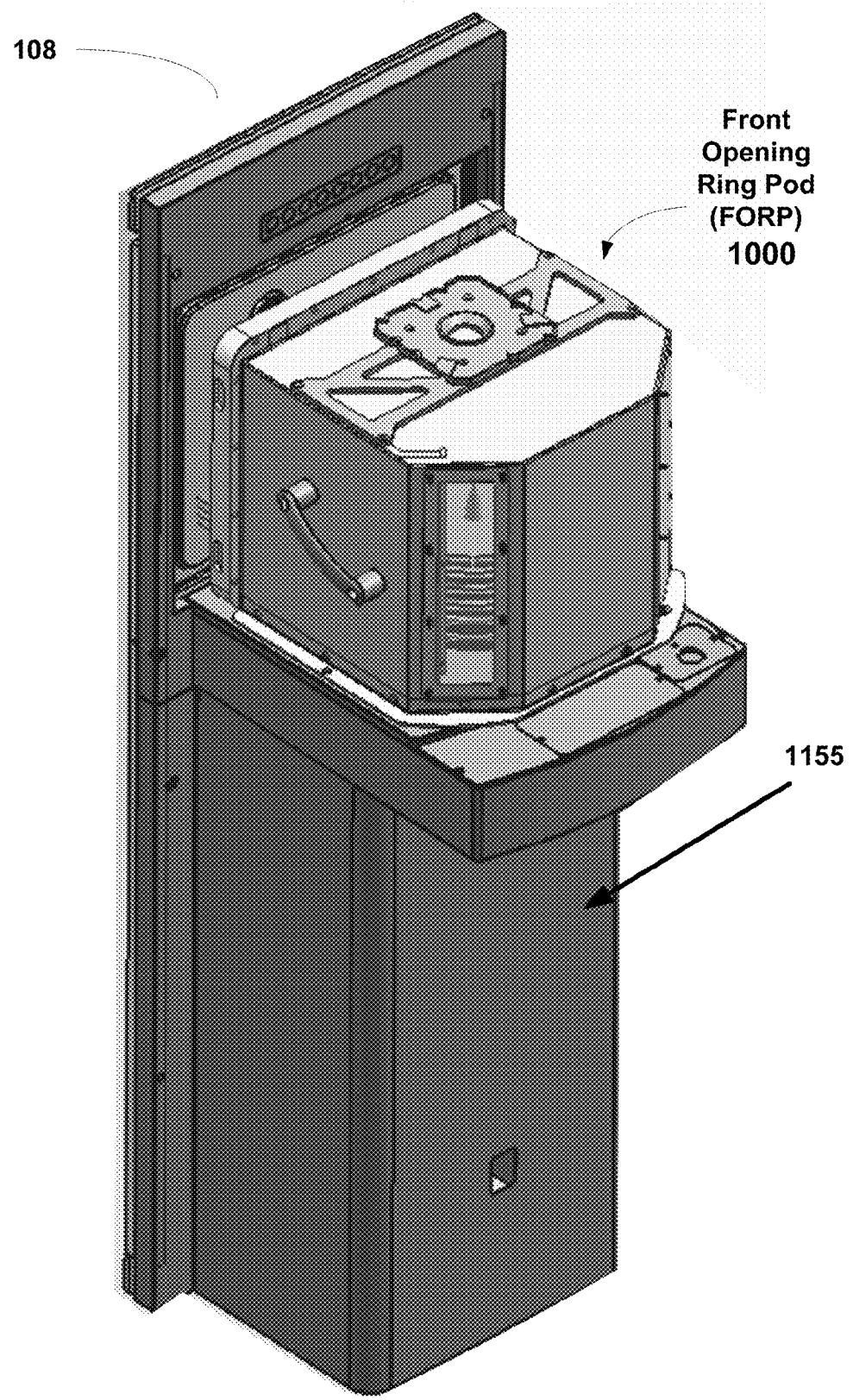
FIG. 14 illustrates a view of a load port module with a pod for transferring consumable parts received at the load port, in accordance with one embodiment.
Figure 15:
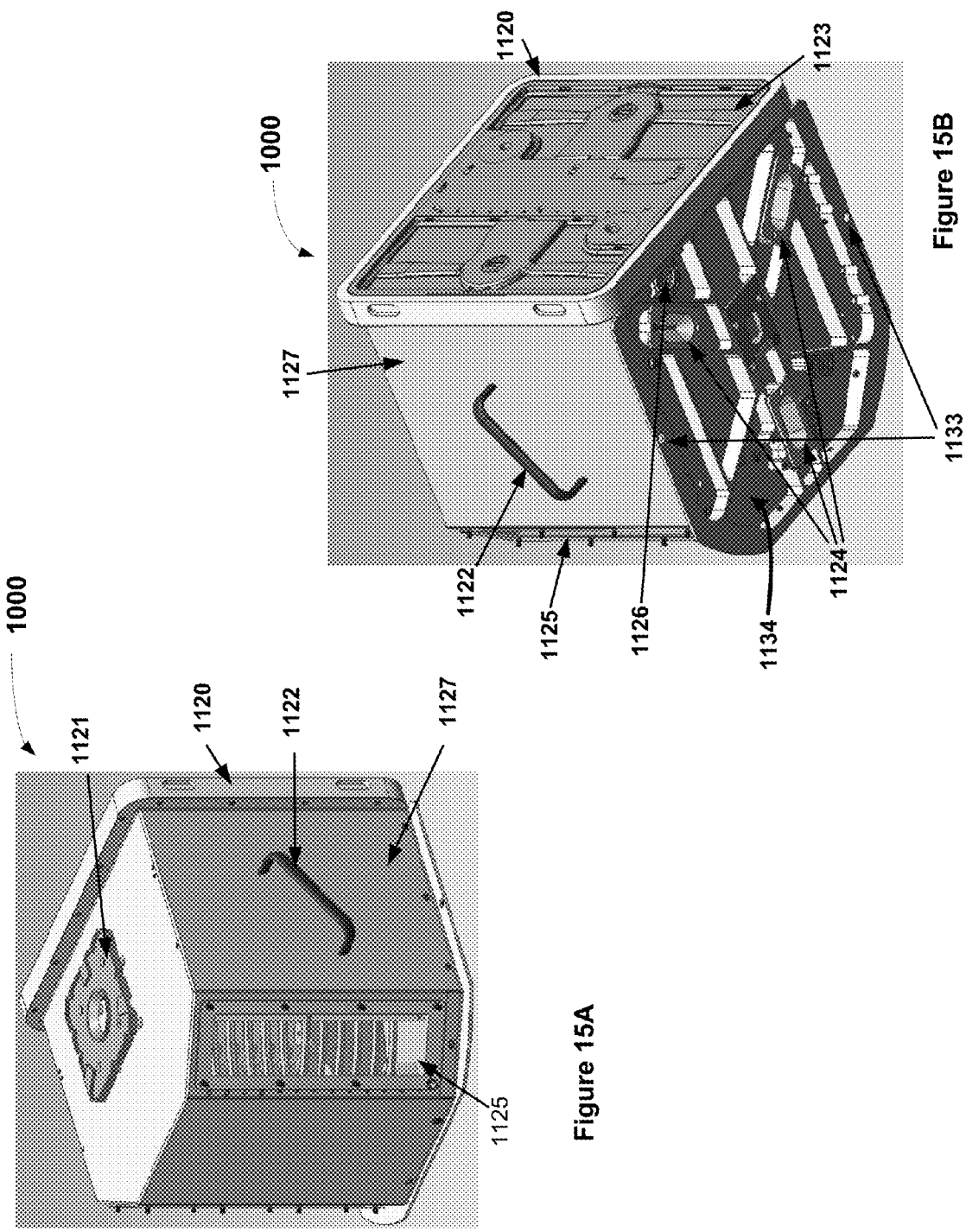
FIGS. 15A and 15B illustrate different views of an example replacement station, in accordance to different embodiments of the invention.

FIG. 14 illustrates an example replacement station 108 that engages a pod for exchanging consumable part of a process module, in one embodiment. The replacement station 108 may include a load port module 1155 that interfaces with an opening to a module in a cluster tool assembly. For example, the load port module 1155 may be mounted (either permanently or temporarily) to a process module 112 or a vacuum transfer module (VTM) 104 or an atmospheric transfer module (ATM) 102 of the cluster tool assembly. The load port module 1155 acts as a docking station for a wafer loader 115 or a consumable part loader, and includes a load port to which the wafer loader 115 or the consumable part loader may be coupled. In some embodiments, the consumable part loader is similar in structure to the wafer loader 115 (e.g., a front opening unified pod (FOUP)), used for transferring wafers into and out of the cluster tool assembly, and is therefore also referred to herein-onwards as front opening ring pod (or simply referred as a "ring pod") 1000. The ring pod 1000 is used to transfer consumable parts 208, such as edge rings, into and out of the process module. An opening in the ring pod 1000 (i.e., an envelope defined by a door frame of the ring pod) matches to an opening defined in the load port so that the consumable part 208 can be easily moved into and out of the cluster tool assembly. Structural details of the ring pod 1000 used in moving the consumable part 208 into and out of the cluster tool assembly will be described with reference to FIGS. 15A through 21B.

FIGS. 15A and 15B illustrate different views of the ring pod 1000 used for storing consumable parts, such as edge rings. As illustrated in FIG. 15A, the ring pod 1000 includes a shell structure 1127 that provides a housing to accommodate various parts of the ring pod 1000 used for receiving and storing the consumable parts. The ring pod 1000 includes a flange 1121 disposed on a top surface of the shell structure 1127. The flange 1121 may be engaged by an overhead transport (OHT) module for transporting the ring pod 1000 to and from the load port of the load port module 1155. The flange 1121 is similar in design to a flange found in a FOUP and is therefore not discussed in detail. In addition to the flange 1121, the ring pod 1000 includes handles 1122 that are disposed on lateral sides of the ring pod 1000. The ring pod 1000 also includes a door frame 1120 that defines an opening of the ring pod 1000. A window 1125 is defined in a portion of a backside of the ring pod 1000 to provide a visual of the interior of the ring pod 1000 so as to allow a user to visually determine the location of the consumable parts received in the ring pod 1000. In some embodiments, the window 1125 may be made of Polycarbonate or other similar see-through material. The location and orientation of the window 1125 is provided only as an example and that other location and/or orientation may also be considered.

FIG. 15B illustrates a frontal and bottom side view of the ring pod 1000. In addition to the various parts defined with reference to FIG. 15A, the ring pod 1000 also includes a base plate 1134 with various automated materials handling system (AMHS) and/or OHT interfaces. For example, the base plate 1134 may include a plurality of kinematic slots 1124 distributed on an underside surface of the base plate 1134. The kinematic slots 1124 are used for aligning the ring pod 1000 to corresponding kinematic pins defined in the load port of the load port module 1155 to which the ring pod 1000 is coupled. The kinematic slots 1124 may also be part of a dissipative path to ground defined from a receiving surface that receives the consumable part within the pod and the kinematic pins of the load port. The kinematic pins in the load port are grounded. The dissipative path will be discussed in more detail with reference to FIGS. 17A and 17C. A door 1123 that fits into the door frame 1120 is provided in the front side of the ring pod 1000 and includes necessary hardware to engage, disengage and to secure the consumable part, when received in the ring pod 1000. The door 1123 is operable to provide access to the inside of the ring pod 1000 so as to allow a robot within the cluster tool assembly or within the ring pod 1000 to transport the consumable part into and out of the ring pod 1000. A pair of conveyor rails 1133 is provided on the base plate 1134 of the ring pod 1000 to allow manual alignment of the ring pod 1000 onto a pad handling system, such as a person guided vehicle (PGV), for example. The handles 1122 provided on the ring pod 1000 may be used for manual loading of the ring pod 1000 onto the PGV.

Figure 16:
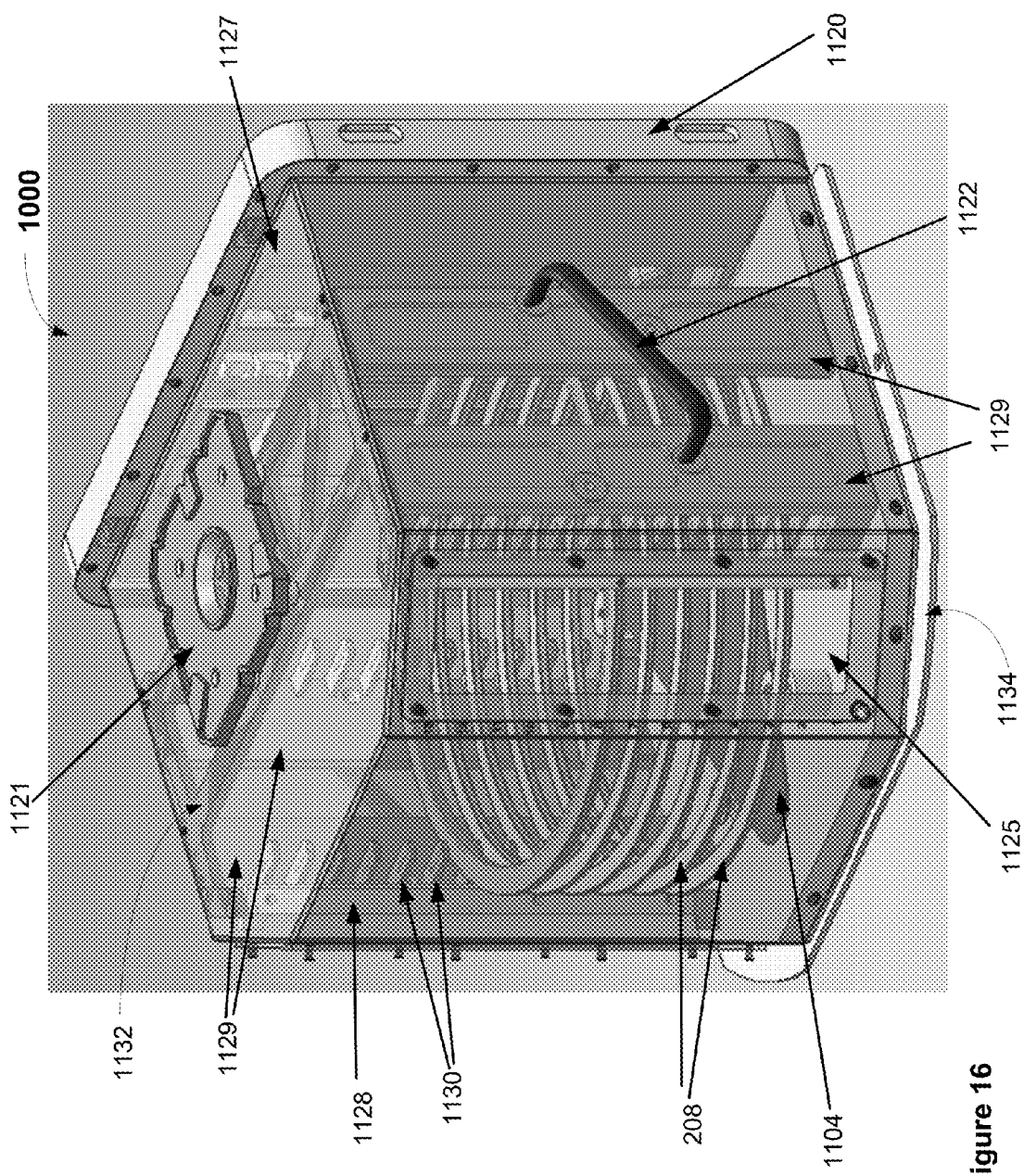
FIG. 16 illustrates a view of different parts of an example replacement station used for storing consumable parts and ring carrier(s), in accordance with an embodiment of the invention.

FIG. 16 provides a detailed representation of an inside of the ring pod 1000 as viewed through a shell structure 1127. The shell structure 1127, in the embodiment illustrated in FIG. 16, is represented as a transparent structure. In this embodiment, the transparent shell structure 1127 provides a view of the inner structure of the ring pod 1000. In such embodiment, there is no need for a separate window 1125 for providing a visual of the inside of the ring pod 1000. In another embodiment, the shell structure 1127 may be opaque. In this embodiment, a window 1125 may be defined lengthwise on a portion of a side, such as a back side, of the ring pod 1000 to provide a visual of the inside of the ring pod 1000. The shell structure 1127 houses a consumable part holding structure, and provides stability to the different components of the consumable part holding structure. The consumable part holding structure includes a top plate 1132 that is oriented above a base plate 1134, and a plurality of support columns 1129 extending between the base plate 1134 and the top plate 1132 and distributed along outer perimeter of the base plate 1134. The plurality of support columns include a plurality of support fingers defined along a length of an inside surface of the support columns, for receiving the consumable parts 208. The base plate 1134 further includes a plurality of carrier supports for receiving a ring carrier 1104, which is used by an end effector mechanism of a robot to carry the consumable parts 208 to and from the ring pod 1000. A pair of hard stop columns 1128 are disposed inside the housing and disposed so as to be parallel to a pair of support columns that is disposed proximal to the back side of the base plate 1134. In some embodiments, each hard stop column 1128 is disposed substantially perpendicular to a corresponding support column 1129 in the pair but is spaced apart from the support column 1129. The hard stop columns 1128 are configured to provide radial constraint for securing a consumable part 208, when received in the pod. The plurality of support columns 1129 are held together using the top plate 1132, which provides the required stability for the support columns 1129. The ring pod 1000 also includes handles 1122 that are directly attached to the support columns 1129 through the shell structure 1127, in one embodiment, and the support columns 1129 provide direct support to the handles 1122.

Figure 17D:
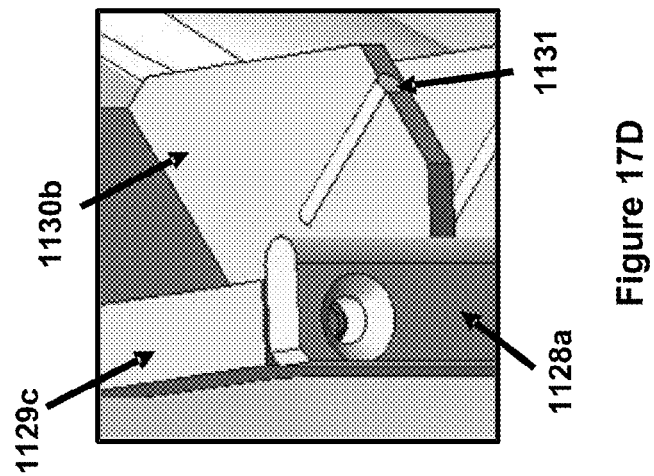
FIG. 17D illustrates an expanded view of a portion of the support column illustrated in FIG. 17C, in one embodiment of the invention.

FIGS. 17A-17G illustrate details of support columns and retention assembly 1135 that are provided inside a ring pod 1000 and used in receiving and storing consumable parts 208 within the ring pod 1000, in some embodiments. FIG. 17A shows the basic structure of a ring pod 1000 without the shell structure 1127 and the door assembly. The basic structure includes a base plate 1134 oriented vertically opposite to a top plate 1132 and a plurality of support columns 1129 that extend between the top plate 1132 and the base plate 1134. The base plate 1134 defines a bottom surface of the ring pod 1000 on which the support columns are positioned in place, in some embodiments. The base plate 1134 is defined by a front side, a back side and two lateral sides that extend between the front side and the back side. In some embodiments the two lateral sides run substantially parallel to one another. In alternate embodiments, depending on the consumable part that is being stored and depending on the design of the ring pod 1000, the two lateral sides may be oriented differently with each other. The top plate 1132 is oriented opposite to the base plate 1134 and is anchored to an underside of the top surface of the shell structure 1127.

The plurality of support columns, in some embodiments, includes two pairs of support columns 1129 that are disposed along the two lateral sides of the base plate 1134. It should be noted that the embodiments are not restricted to two pairs of support columns but may include additional one or pairs of support columns 1129. The additional one or pairs of support columns may be disposed along the two lateral sides or along the back side of the base plate 1134. Reverting to the embodiment where two pairs of support columns 1129 are disposed along the two lateral sides of the base plate 1134, a first support column 1129a of a first pair is disposed proximal to the front side of the base plate 1134 and on a first lateral side of the base plate. A second support column 1129b of the first pair is disposed proximal to the front side of the base plate 1134 and on a second lateral side of the base plate 1134, such that the first support column is oriented opposite to the second support column of the first pair. A third support column 1129c of a second pair is disposed proximal to the back side of the base plate 1134 and on the first lateral side of the base plate 1134. A fourth support column 1129d of the second pair is disposed proximal to the back side of the base plate 1134 and on the second lateral side of the base plate 1134, such that the third support column is oriented opposite to the fourth support column of the second pair. The support columns 1129a, 1129b, 1129c and 1129d extend from the base plate 1134 to the top plate 1132 and are distributed symmetrically around an outer perimeter of the ring pod 1000. The support columns 1129a, 1129b, 1129c, 1129d are each connected to the top plate 1132, which provides the support for the support columns 1129a, 1129b, 1129c and 1129d. A top plate 1132 is disposed above the base plate and separated by the first, second, third and fourth support columns (1129a-1129d).

In addition to the support columns 1129a, 1129b, 1129c, 1129d the basic structure of the ring pod 1000 may include a pair of hard stop columns 1128. In one embodiment illustrated in FIG. 17A, a first hard stop column 1128a in the pair of hard stop columns is disposed proximal to and oriented to be parallel to the third support column 1129c of the second pair. Similarly, a second hard stop column 1128b in the pair of hard stop columns is disposed proximal to and oriented to be parallel to the fourth column 1129d of the second pair. In some embodiments, the first hard stop column 1128a is located between the third support column 1129c and the back side of the base plate 1134, and the second hard stop column is located between the fourth support column 1129d and the back side of the base plate 1134. In this embodiment, each of the hard stop columns 1128a, 1128b is spaced apart from the respective support column 1129c, 1129d, respectively. The hard stop columns 1128 are oriented toward an inner region of the ring pod 1000 and are substantially perpendicular to an inside edge of the respective support column 1129c, 1129d of the second pair, in some embodiments. This orientation allows the hard stop columns 1128 to provide a radial constraint so as to secure the consumable parts, when received inside the ring pod 1000. It should be noted that more than a pair of hard stop columns 1128 may be included in the ring pod. In such embodiments, each hard stop column 1128 may be disposed at an angle relative to the respective support columns 1129 so as to provide radial constraint, when the ring is pushed into position within the ring pod. In some embodiments, each of the support columns 1129a, 1129b, 1129c, 1129d are made of single piece of metal. In other embodiments, each of the support columns 1129a, 1129b, 1129c, 1129d are made of multiple pieces of metal, with each piece designed to snugly fit with another piece. In some embodiments, the support columns 1129a, 1129b, 1129c, 1129d are made of aluminum material. In some embodiments, to increase resistance to corrosion and wear, the support columns 1129a-1129d may be made of anodized aluminum or other corrosion resistant material.

In alternate embodiments, each lateral side of the base plate 1134 may include a single support column 1129 disposed between the top plate 1132 and the base plate 1134. In some embodiments, a first hard stop column 1128a may be integrated with a first support column 1129 disposed on a first lateral side and a second hard stop column 1128b may be integrated with a second support column 1129 disposed on a second lateral side. In some other embodiments, the first hard stop column 1128a may be located between the first support column 1129 and the back side of the base plate 1134, and the second hard stop column 1128b may be located between the second support column 1129 and the back side of the base plate 1134. In this embodiment, each of the hard stop columns 1128a, 1128b is spaced apart from the respective first and second support columns 1129, respectively.

The structure of the ring pod 1000 further includes a pair of handles 1122 disposed on lateral sides of the ring pod 1000. In some embodiments, a first handle 1122 in the pair is attached to the first support column 1129a of the first pair and third support columns 1129c of the second pair, both of which are disposed on the first lateral side of the base plate 1134, through the shell structure 1127, using one or more direct connects 1122a. Similarly, a second handle 1122 is attached to support column 1129b of the first pair and a support column 1129d of the second pair, both of which are disposed along the second lateral side of the base plate 1134, using one or more direct connects 1122a. The direct connects 1122a may, in some embodiments, be a screw, a clamp, a retention structure that allows the handle 1122 to directly connect to the corresponding support columns. The handles 1122, in some embodiments, are used for manual handling of the ring pod 1000.

A plurality of support fingers 1130 are disposed lengthwise of an inside surface of each of the support columns (1129a, 1129b, 1129c, 1129d) in the first and the second pair. The support fingers 1130 extend toward an inner region of the ring pod 1000, so as to provide a support surface for receiving the consumable parts. In one embodiment illustrated in FIG. 17A, the shape and/or design of the support fingers 1130 disposed on the first pair of support columns 1129a, 1129b are similar to the shape and/or design of the support fingers disposed on the second pair of support columns 1129c, 1129d.

FIG. 17B shows an expanded view of the support fingers 1130 disposed on the first and the second pairs of support columns (1129a-1129d). In some embodiments, the support fingers 1130 are made of aluminum or other similar light weight material. In such embodiments, a support pad 1131 is defined on a top surface of each support finger 1130. In some embodiments, the support pad 1131 may be made of a material, such as Carbon filled PolyEtherEtherKetone (PEEK), to provide a non-scratch support surface for a consumable part, when received on the support finger 1130. Carbon filled PEEK material is just one example and other material that can provide the similar support functionality may also be used. The support pad 1131 is defined to provide a distinct support surface so that the consumable part, when received, does not touch the metal surface of the support fingers 1130. In one embodiment, a groove may be defined on a top surface of each support finger 1130 and the support pad 1131 may be embedded into the groove such that a portion of the support pad 1131 extends beyond the top surface of the support finger 1130 to provide a distinct receiving surface for the consumable part 208, as illustrated in FIG. 17B. In other embodiments, a rod or a strip or a layer made of PEEK or other material may be defined on a portion of the top surface of the support finger 1130 to define the support pad 1131. In such embodiments, the support pad may be defined so as to provide a raised surface that extends from a top surface of the support finger 1130 to provide a distinct support surface. FIG. 17H illustrates a cross-sectional view of one such embodiment wherein a strip of support pad 1131 is disposed on a top surface of the support finger 1130. FIG. 17I illustrates a cross-sectional view of an alternate embodiment, wherein contour of the support pad disposed on a top surface of each support finger is pointed, instead of being flat. The different embodiments of the support pad are provided as mere examples and other designs of support pad may be contemplated. The support pad 1131 provides a distinct line contact or surface contact that is separate from the top surface of the support finger 1130 so as to prevent contamination of the top surface of the support finger 1130. In another embodiment illustrated in FIG. 17J, the support fingers 1130 are made of Carbon filled PEEK material. In this embodiment, there is no need for a separate support pad 1131 to be defined on the support fingers 1130 as the support fingers 1130 provide the non-scratch and non-slippery surface for receiving the consumable part and there are no metal surfaces for contamination to occur. It should be noted that the material used for the support fingers 1130 and support pad 1131 are just examples and should not be considered limiting. Other materials may be used for the support fingers 1130 and support pad 1131 so long as they provide the functionality for which they support fingers 1130 and the support pad 1131 are designed.

Figure 17C:
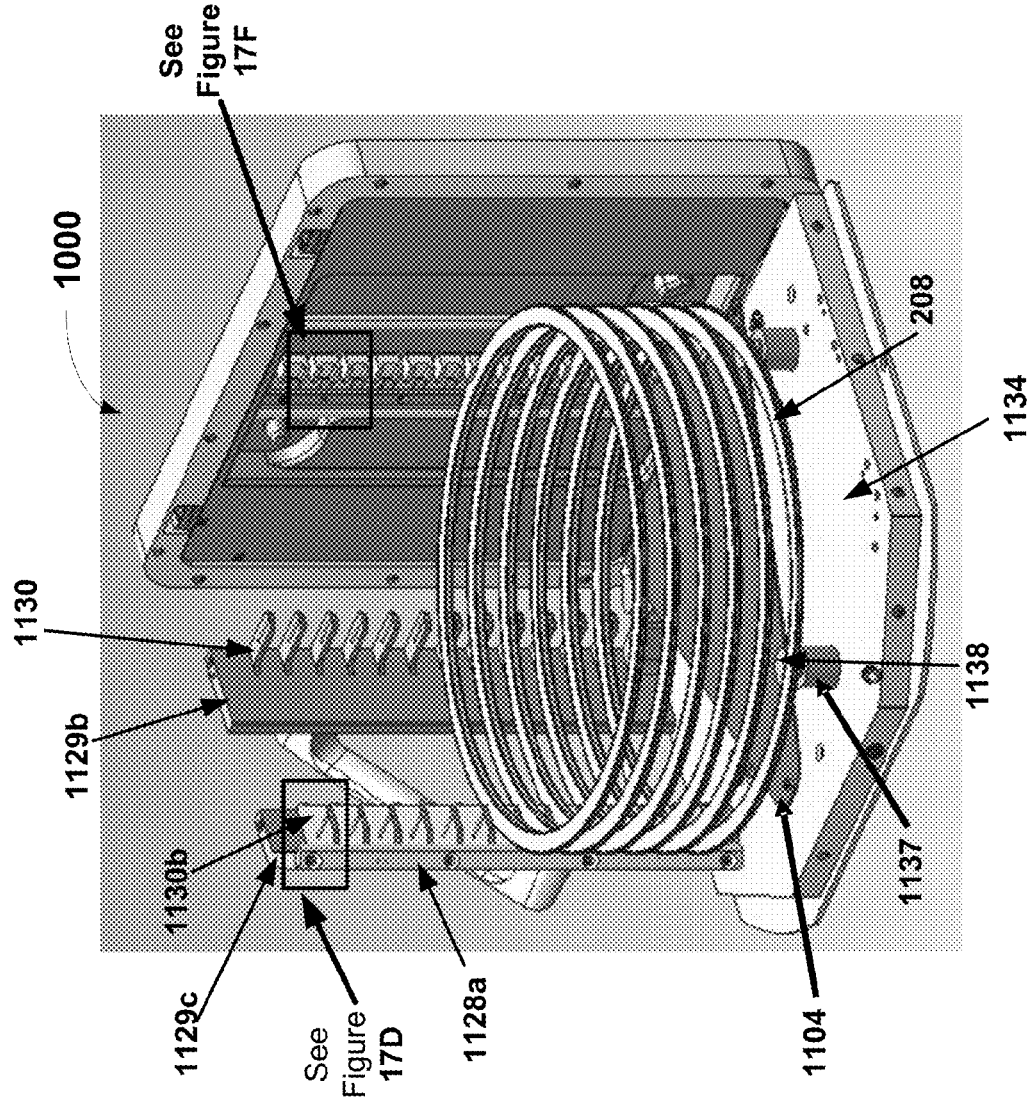
FIG. 17C illustrates an alternate design of a support column provided in the replacement station, in an alternate embodiment of the invention.

FIG. 17C illustrates an alternate design for support columns that can be employed within the ring pod 1000 for receiving and storing consumable parts, in one embodiment. The third and the fourth support columns 1129c and 1129d of the second pair, in this embodiment, are disposed along inner opposite corners of the base plate 1134. Consequently, the support columns 1129c, 1129d are designed to have an angled contour matching the angled contours of the inner corners of the base plate 1134, as shown in FIG. 17C. The shape of the plurality of support fingers 1130b distributed on the inside surface of the third and fourth support columns 1129c, 1129d of the second pair are different from the support fingers 1130 that are distributed on the inside surface of the first and second support columns 1129a, 1129b of the first pair. As illustrated in FIG. 17C, the support fingers 1130b are contoured to match the contour of the third and fourth support columns 1129c, 1129d of the second pair of support columns.

FIG. 17D shows an expanded view of the support fingers 1130b disposed on the inside surface of the third and fourth support columns 1129c, 1129d of the second pair, in one embodiment. The support fingers 1130b are, in some embodiments, made of metal, such as aluminum or other similar metal. To prevent corrosion, the support fingers 1130 may be made of anodized aluminum or aluminum coated with Teflon, epoxy, or other similar materials that can prevent corrosion. Similar to the support fingers 1130 that are disposed on the first and second support columns 1129a, 1129b of the first pair, each support finger 1130b may include a support pad 1131 defined on a top surface of the support finger 1130b to provide a distinct support surface for the consumable part 208, when received, so as to prevent the consumable part 208 from contacting the metal surface of the support fingers 1130b. In other embodiments, the support fingers 1130b may be made of Carbon filled PEEK material. In such embodiments, separate support pads 1131 are not defined on the support fingers 1130b. The support fingers 1130, 1130b provide sufficient support surface for the consumable part 208 so as to prevent the consumable part from sliding out of its position on the support fingers 1130, 1130b. In some embodiments, each of the first, second, third, fourth support columns (1129a-1129d) are made of aluminum or other light weight material that are anodized or coated with corrosion inhibiting material.

The ring pod 1000 includes a pair of hard stop columns 1128a, 1128b. However, instead of the hard stop columns 1128 being spaced apart from the respective support columns 1129c, 1129d of the second pair, as illustrated in FIG. 17A, each one of the pair of hard stop columns 1128a, 1128b, is disposed adjacent to an inside edge of a respective support columns of the second pair that is facing toward the back side of the base plate 1134. For example, a first hard stop column 1128a is disposed adjacent to the third support column 1129c of the second pair and the second hard stop column 1128b is adjacent to the fourth support column 1129d of the second pair. Further, the hard stop columns 1128, in one embodiment illustrated in FIGS. 17C and 17D, are oriented toward an inner region of the ring pod 1000 so as to be substantially perpendicular to the inside edge of the support columns 1129c, 1129d of the second pair so as to provide radial constraints for a consumable part when it is received inside the ring pod 1000. In other embodiments, the hard stop columns 1128a, 1128b may be oriented in any angle in relation to the inside edge of the support columns 1129b so long as it is able to provide a radial constraint to the consumable part. In some embodiments, the first and the second hard stop columns 1128a, 1128b may be affixed to the respective support columns 1129c, 1129d using any fastening or connection options, such as connection tools, connection structures, connection mechanism, connecting elements, etc. In some embodiments, each of the hard stop columns 1128a, 1128b is made of single piece or strip of material, such as Carbon filled PEEK material, while each of the support columns 1129a-1129d are made of aluminum. In some embodiments, the support columns 1129a-d, support fingers 1130, 1130b, and other surfaces within the ring pod 1000 that are made of metal and are exposed to the ambient environment within the ring pod 1000, may have to be treated in order to prevent corrosion, any other wear or damage. For example, any component of the ring pod 1000 made of metal may get damaged due to exposure to processing chemicals/chemistries that are carried back by a damaged or worn consumable part 208. To avoid such damage, the support columns (1129a-1129d), support fingers (1130, 1130b) and other surfaces of the ring pod 1000 that are made of metal may have to be treated, for example, with a coating of corrosion inhibiting material, such as Teflon, epoxy, etc. to prevent wear. Alternately, instead of metal, the support columns 1129a-1129d, support fingers 1130, 1130b may be made of anodized aluminum.

The shell structure 1127 is configured to attach to an outer periphery of the base plate 1134 of the ring pod 1000 and enclose the first and the second pair of support columns 1129a-1129d, the top plate 1132, and first and second hard stop columns 1128a, 1128b. In some embodiments, the top plate 1132 may be a part of the shell structure 1127. The shell structure includes an opening along the front side of the base plate 1134. The top plate 1132 is attached to an underside of the top surface of the shell structure 1127. The front opening of the shell structure is configured to mate with a door 1123, FIGS. 17E-17G illustrate details of a door 1123 that is disposed on a front side of the ring pod 1000. The door 1123 has dimensions that match the dimensions of the opening of a load port. The door is configured to mate with a front opening of the shell structure 1127. The door 1123 includes a retention assembly 1135 that is defined on an inside surface of the door 1123 and extends a length of the door 1123, as illustrated in FIG. 17E. The details of the retention assembly 1135 will be described in detail with reference to an expanded view provided in FIGS. 17F and 17G. FIG. 17F illustrates a view of a consumable part received within a slot defined in the retention assembly 1135, and FIG. 17G illustrates an expanded view of the retention assembly 1135 identifying the different components.

Referring simultaneously to FIGS. 17F, 17G, the retention assembly 1135 includes a plurality of components for securing and positioning the consumable part 208 within the ring pod 1000. For example, the retention assembly 1135 includes a clamp 1150, a spring mechanism 1151, and a receiving pad 1152. The clamp 1150 is a fixed unit that is attached to an inside surface of the door 1123. The clamp 1150 is used to secure the spring mechanism 1151 of the retention assembly 1135. In some embodiments, the clamp 1150 is made of aluminum. A pair of bumpers 1136 is provided on either side of the receiving pad 1152. The bumpers 1136 are used to define a radial limit to which the receiving pad 1152 can be moved, when securing the consumable part 208 in place within the ring pod 1000. Additionally, the bumpers 1136 provide a radial limit for consumable part movement within the pod 1000, when the door 1123 is closed. In some embodiments, a first bumper 1136 from the pair is defined adjacent to the clamp 1150 on a side of the clamp 1150 that is opposite to the side that is used to secure the spring mechanism 1151, as illustrated in FIG. 17F. A second bumper 1136 of the pair is disposed on the other side of the receiving pad 1152.

The spring mechanism 1151 is secured to the clamp 1150 on one end and to the receiving pads 1152 on the other end and is designed to provide sufficient spring loaded force to the receiving pad 1152, when the door 1123 is closed. The spring mechanism 1151, in some embodiments, is designed such that the spring component that provides a spring loaded force, is immediately behind each receiving pad 1152 of the retention assembly 1135 so that when the door 1123 of the ring pod 1000 is closed and the spring mechanism 1151 is activated, the force from the activated spring mechanism 1151 is directly applied to the receiving pads 1152 causing the receiving pads 1152 to be pushed inward. This, in turn, pushes a consumable part 208 received thereon against the third and the fourth support columns 1129c, 1129d of the second pair. The first and the second hard stop columns 1128a, 1128b that are adjacent to the third and fourth support columns 1129c, 1129d, respectively, provide the radial constraint to hold the consumable parts 208 in place on the select ones of the support fingers 1130, 1130b. In some embodiments, the spring component of the spring mechanism 1151 is made of steel material.

When a robot places the consumable part 208 in the ring pod 1000, the consumable part 208 may not be positioned correctly. For example, the consumable part 208 may not be positioned all the way back so that the support fingers 1130 can fully support the consumable part 208. In order to prevent the consumable part 208 from moving around or slipping out of its position when the ring pod 1000 is moved away from the cluster tool assembly, the various parts of the retention assembly 1135 are used to push the consumable part 208 toward the third, fourth support columns 1129c, 1129d and the first and second hard stop columns 1128a, 1128b, so that the consumable part 208 is held in place on the support fingers 1130. The support fingers 1130 disposed on the support columns 1129a-1129d provide the bottom constraint to hold the consumable part in place.

The receiving pad 1152 is designed so as to define a pocket for receiving and aligning the consumable part 208 and holding it in place. In some embodiments, the receiving pad 1152 is shaped as an inverted "C". The design of the receiving pad 1152 ensures that the consumable part is held in place and does not slip out of the pocket. Further, the pocket in the receiving pad 1152 is sized to provide sufficient clearance to account for deflection and other potential tolerances, when the consumable part 208 is moved into the ring pod 1000 by a robot. Further, a width and height of the pocket is sufficient to accommodate the thickness and height of the consumable part 208. Further, the size of the pocket in the receiving pad 1152, the support fingers 1130, 1130b, and the depth of the support pads 1131 are designed to accommodate consumable parts 208 with different bottom surface profiles. In some embodiments, the receiving pads 1152 are made of Carbon filled PEEK material. In some embodiments, sufficient clearance is provided between the bumper 1136 and the consumable part 208, when the door 1123 is closed and the consumable part 208 is pushed into place.

Figure 18:
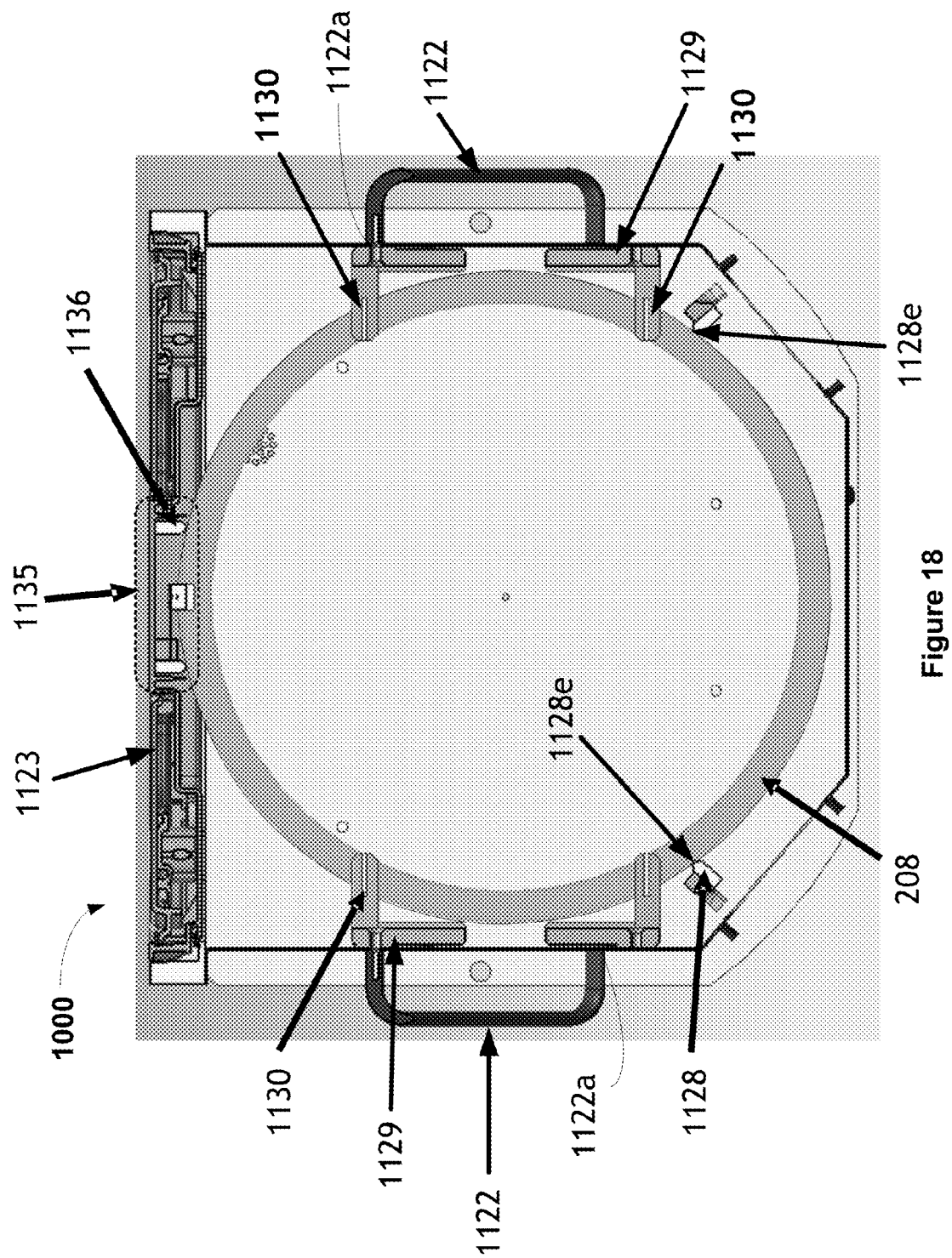
FIG. 18 illustrates an overhead view of a replacement station used for receiving a consumable part, in some embodiments of the invention.

FIG. 18 illustrates an overhead view of an inside of the ring pod 1000 when the consumable part 208 is received. The overhead view shows the consumable part being received on support fingers 1130 that extend outward from the first and the second pair of support columns (i.e., 1129a-1129d). The first and second hard stop columns 1128a, 1128b provide the radial constraint for the consumable part 208 while ensuring that the consumable part 208 is positioned in place. In some embodiments, the first and second hard stop columns 1128a, 1128b are oriented relative to the third and fourth support columns 1129c, 1129d, respectively, such that an edge 1128e of the first and second hard stop columns 11128a, 1128b, are facing inward relative to the outer perimeter of the base plate 1134. In other embodiments, the first and second hard stop columns 1128a, 1128b are oriented relative to the third and fourth support columns 1129c, 1129d, respectively, such that a surface of the first and second hard stop columns 1128a, 1128b, are facing inward relative to the outer perimeter of the base plate 1134. The surface of the hard stop columns 1128a, 1128b that is facing inward may be an edge surface, a flat side surface or a cylindrical surface. The spring mechanism 1151 of the retention assembly 1135 disposed along a length of the door 1123 provide sufficient radial force to cause the ring receiving pad 1152 to push the consumable part 208 toward the first and second hard stop columns 1128a, 1128b and the pair of bumpers 1136 ensure that the spring mechanism 1151 does not exert too much force on the consumable part 208 to distort or pop the consumable part 208 out of its place on the support fingers 1130, 1130b.

A spacing control may be available at the door 1123 of the ring pod 1000 for adjusting the spacing between the door frame 1120 and the opening of the shell structure 1127, when engaging (i.e., closing) or disengaging (i.e., opening) the door 1123, in one embodiment. The spacing of the door frame 1120 from the shell structure 1127, in one embodiment, may be controlled by adjusting position of a pin that is disposed in a spine in each corner of the door frame 1120, when the door is engaged.

The consumable part is moved between the ring pod 1000 and a process module within the cluster tool assembly using an end effector mechanism of a robot within the ring pod 1000 or a robot in the cluster tool assembly. In some embodiments, the end effector mechanism of the robot that is generally used to transport a wafer to and from a wafer loader 115 may not be large enough to accommodate the consumable part, which is usually larger than the wafer. In order to accommodate the consumable part, the end effector mechanism may use a ring carrier 1104 to transport the consumable part to and from the ring pod 1000. The ring carrier 1104 may be stored at the bottom of the ring pod 1000, at the top of the ring pod 1000 or anywhere in-between. Further, a single ring carrier 1104 or a plurality of ring carriers 1104 may be used for transporting the consumable part. For example, dedicated ring carriers 1104 may be used to separately transport a new consumable part and a used consumable part. The ring carriers are received on a carrier support mechanism defined in the ring pod 1000.

Figure 19A:
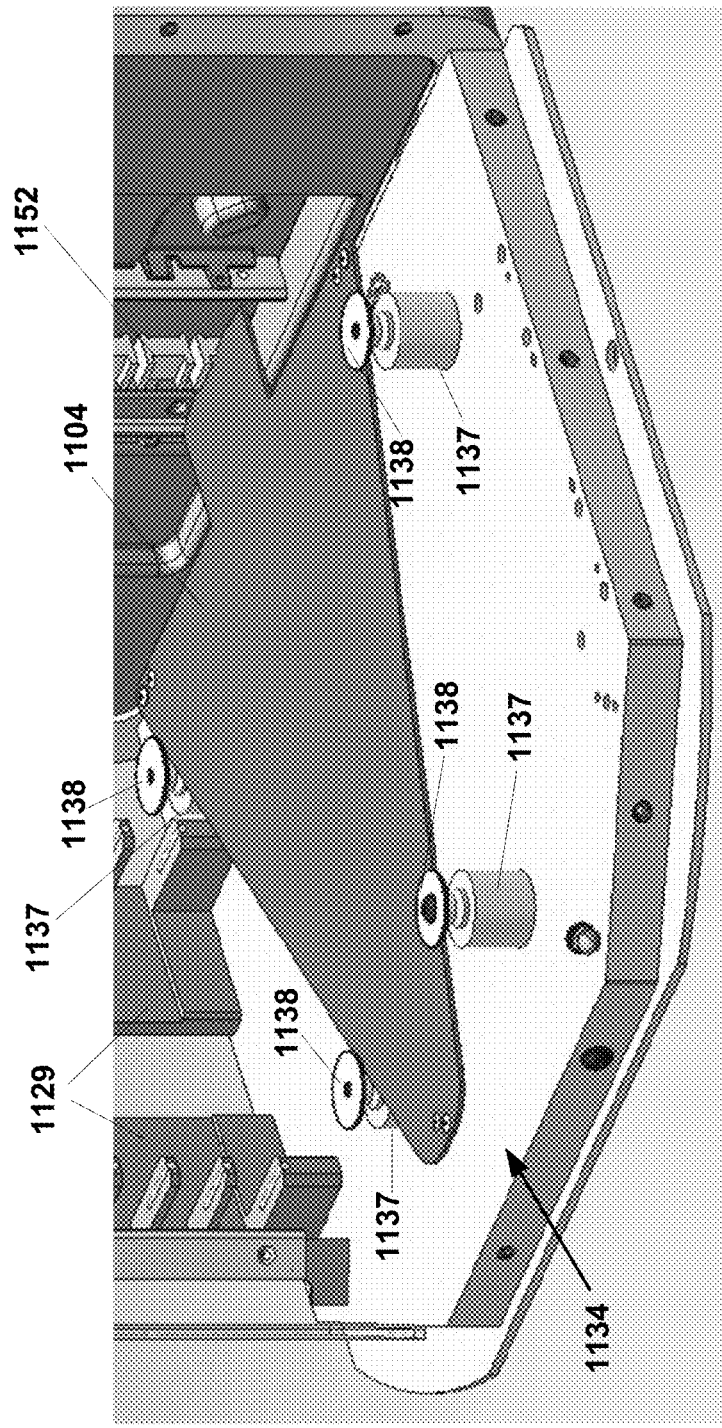
FIGS. 19A and 19B illustrate details of an example carrier support for receiving and storing a ring carrier within a replacement station, in accordance with some embodiments of the invention.

FIG. 19A illustrates an example carrier support mechanism defined within the ring pod 1000 for receiving a ring carrier 1104, in one embodiment of the invention. The ring pod 1000, in this embodiment, houses a single ring carrier 1104 that is used for transporting both the new and the used consumable parts. The carrier support mechanism includes a plurality of carrier supports distributed on a plane defined on the base plate 1134, for example. Each carrier support includes a base support structure 1137 to provide support and to offset the ring carrier 1104 from the base plate 1134 and a top hat 1138 that is disposed on top of the base support structure 1137. In some embodiments, the top hat 1138 may be a washer unit. The base support structure 1137 and the top hat 1138 are designed to provide support for the ring carrier 1104 when received within the ring pod 1000. Further, the design of the top hat 1138 prevents the ring carrier 1104 from popping out of its place on the base support structure.

The carrier supports are positioned in the plane in accordance to a shape of the ring carrier 1104. For example, when the ring carrier 1104 is triangular in shape, the carrier supports are positioned to fit along a triangular outline of the ring carrier 1104. In some embodiments, the carrier supports are made of Carbon filled PEEK material. In other embodiments, the carrier supports may be made of other material selected to prevent corrosion and other wear while providing support to the ring carrier 1104. Alternately, the carrier supports may be made of metals and are coated with corrosion resistive material, such as epoxy, Teflon, etc.

Figure 19B:
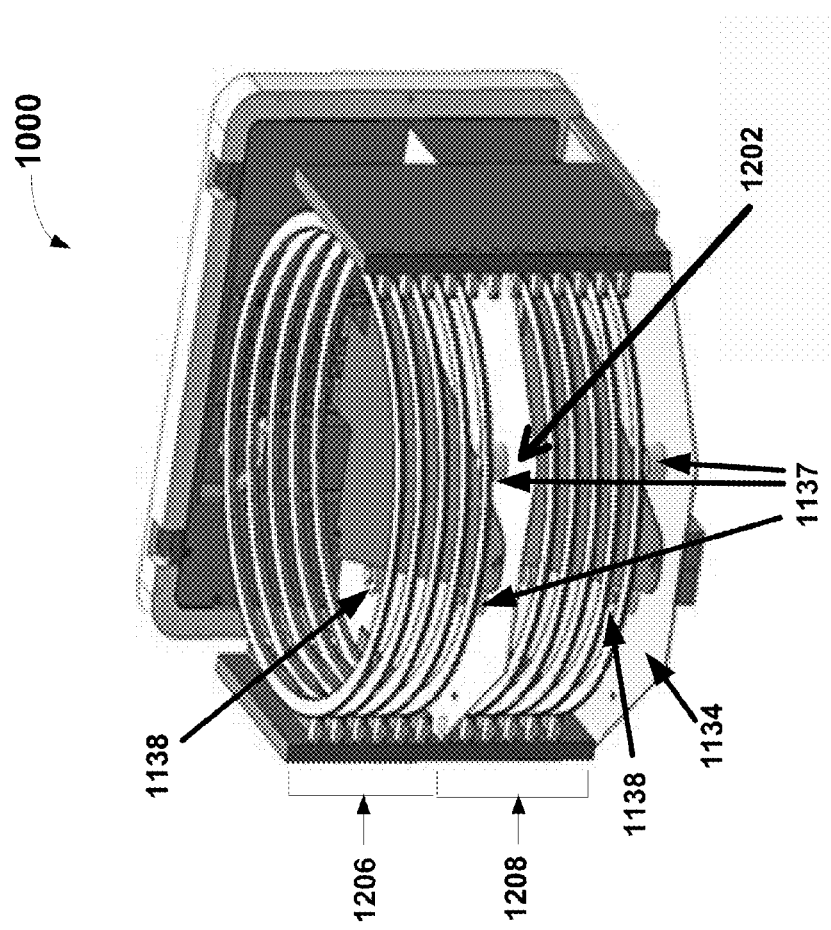

FIG. 19B illustrates an alternate example of carrier support mechanism defined within the ring pod 1000 in which a plurality of ring carriers 1104 may be received. In this embodiment, the ring pod 1000 includes a separator plate 1202 that is defined between a base plate 1134 and a top plate 1132 and is oriented substantially parallel to the base plate 1134. In the embodiment illustrated in FIG. 19B, plurality of carrier supports is disposed on both the base plate 1134 and the separator plate 1202 to receive the ring carriers 1104. The separator plate 1202 may be defined to separate a clean (or new) consumable part section 1206 (described with reference to FIG. 11) and a dirty consumable part section 1208 (described with reference to FIG. 11) in the ring pod 1000. The clean consumable part section 1206 includes dedicated slots for receiving clean or new consumable parts 208 and the dirty consumable part section 1208 includes dedicated slots for receiving dirty or damaged or used consumable parts 208. In addition to providing carrier supports at the base plate 1134 and the separator plate 1202, additional carrier supports may be provided on an underside surface of the top plate 1132, in some embodiments. The additional carrier supports may be similar in structure to the carrier support mechanism described with reference to FIGS. 19A and 19B or may have a different structure. In some embodiments where additional carrier supports are provided on the underside surface of the top plate 1132, the ring carrier 1104 may be received and supported by the carrier supports of the top plate 1132.

In some embodiments, a height of the carrier supports defined on the base plate 1134 and/or a separator plate 1202 would determine the height from which the support fingers 1130 for receiving the consumable parts 208 may be defined along a length of the support columns 1129a-1129d so as to avoid any interference by the carrier supports when the consumable part is received within the ring pod 1000. For example, the support fingers 1130 may be defined on the support column 1129 starting at a height that is greater than the height of the carrier supports defined on the base plate 1134 so that the carrier supports do not interfere when a consumable part is received at the bottom finger support. Similarly, height of the carrier supports defined on a bottom surface of the top plate 1132 would determine a height up to which the support fingers 1130 are to be defined along the length of the support columns 1129a-1129d.

Figure 20:
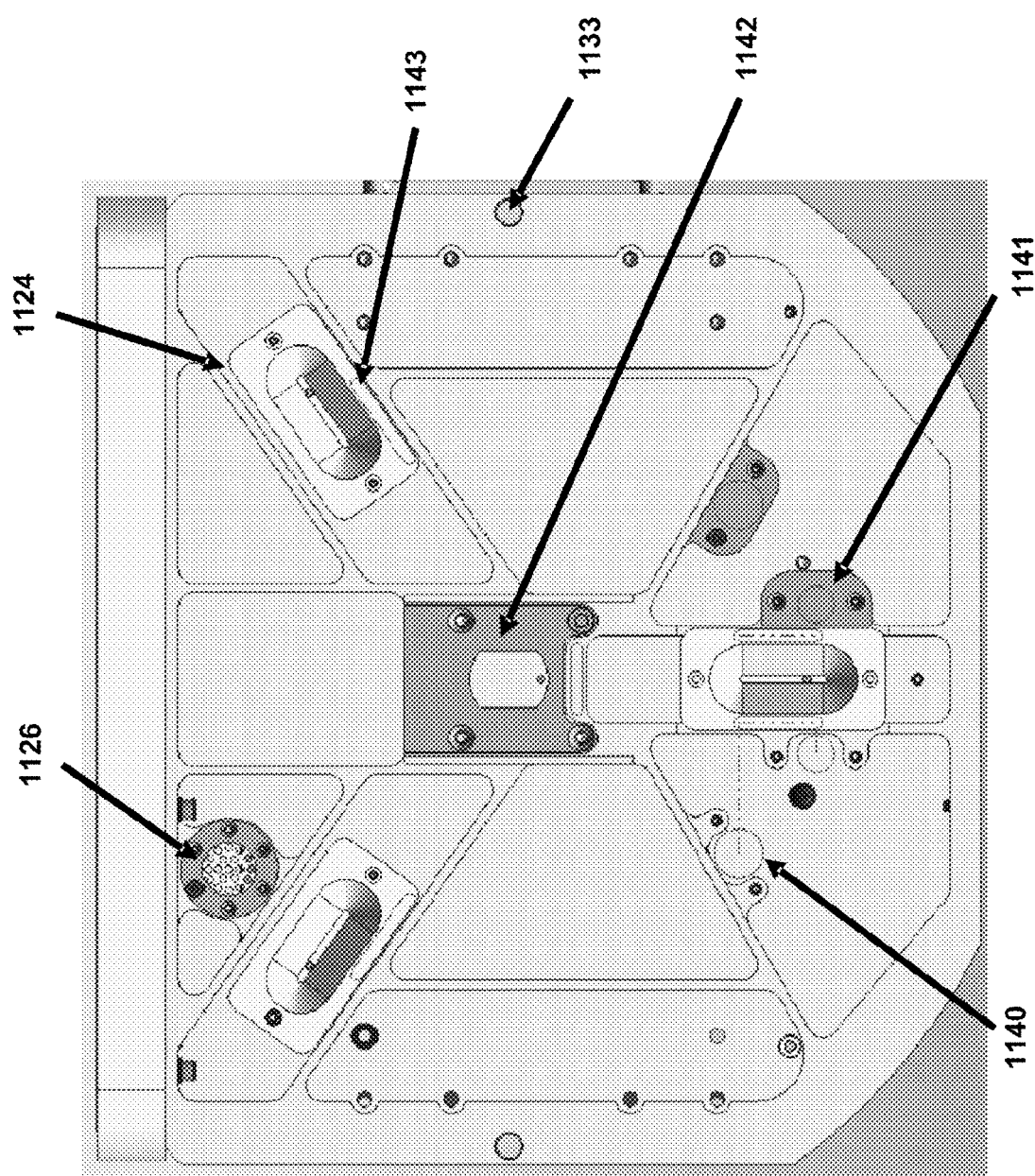
FIG. 20 illustrates a bottom view of the replacement station identifying various parts that are used to interface with a load port of a load port module, in accordance with an embodiment of the invention.

FIG. 20 illustrates a bottom surface view of a base plate 1134 of the ring pod 1000 that is used for storing and transporting consumable parts, in one embodiment of the invention. The bottom surface of the base plate 1134 includes various interfaces that are used for manual loading or are compatible with automated material handling system (AMHS), overhead transport (OHT) system, etc., standards, or for automatic alignment of the ring pod 1000 onto a load port in a load port module 1155. The interfaces that are provided in the bottom surface of the base plate 1134 are similar to the interfaces that can be found on a wafer carrier 115, such as a front opening unified pod (FOUP). For example, a pair of conveyor rails 1133 may be used along with the handles 1122 of the ring pod 1000 to manually load the ring pod 1000 to a material handling vehicle, such as a person guided vehicle (PGV). Similarly, a flange 1121 for OHT handling, for example, is disposed on a top surface of the shell structure 1127, a shuttle clamp feature 1142 disposed on the bottom surface of the base plate 1134, and carrier sensing pads 1143 disposed on kinematic slots 1124 may be used together during automatic handling of the ring pod 1000 by an AMHS, OHT, etc. One or more carrier sensing pads 1143 may also be used during automatic handling of the ring pod 1000 by the AMHS, OHT, etc.

The kinematic slots 1124 may be part of an alignment mechanism that is used to align the ring pod 1000 with corresponding kinematic pins defined on a load port of the load port module 1155. The kinematic slots 1124 may also be used to provide a dissipative path to ground in order to keep electrostatic discharge level low. Vent assembly 1126 is used to vent the inside of the ring pod 1000. One or more information pads 1140 may be used to track various conditions, including alignment of the ring pod 1000 to the load port defined in the replacement station. One or more lockout options 1141 are provided for blocking or unblocking one or more of the interface elements of the ring pod 1000 during operation. The interfaces provided in the bottom portion of the ring pod 1000 are standard interfaces that conform to material handling standards defined for handling FOUPs but are extended to the ring pods 1000, as well.

The various components of the ring pod 1000 may be made of metal. For example, the support fingers 1130, the support columns 1129 (i.e., 1129*a*, 1129*b*), the base plate 1134, etc., may be made of metal, such as casted aluminum. In order to ensure that the consumable part does not get damaged, a dissipative ground path is defined from the support pads 1131 through the metal portion of the support fingers 1130 to corresponding one of the support column 1129*a*-1129*d*, down to the base plate 1134 to the kinematic slots 1124 defined on the underside of the base plate 1134, to the kinematic pins on the load port. The kinematic pins on the load port are grounded so that the surface that is contact the consumable part is grounded, as well.

Generally, the support columns 1129, the base plate 1134, support fingers 1130, etc., are all made of aluminum or other light weight metal/material in order to limit the weight of the ring pod 1000. The materials that are used for the various components in the ring pod 1000 design is driven by a weight limit defined by the standards set for the OHT, AMHS, etc. As a result, some components of the ring pod 1000 may be made of casted aluminum, other components may be coated with corrosion resistive material, such as epoxy, Teflon, etc., some other components may be molded, or made of plastic.

The ring pod 1000 may be used to store and transport different types of consumable parts. In order to determine the exact content of the ring pod 1000, the ring pod 1000 may include identifiers that are used to determine the content contained within. In some embodiments, a dedicated identification station may be used scan the identifier to identify content of the ring pod 1000. The identification station may include a robot, for example, with sensors to scan the ring pod identifier and correlate it to the content.

Figure 21B:
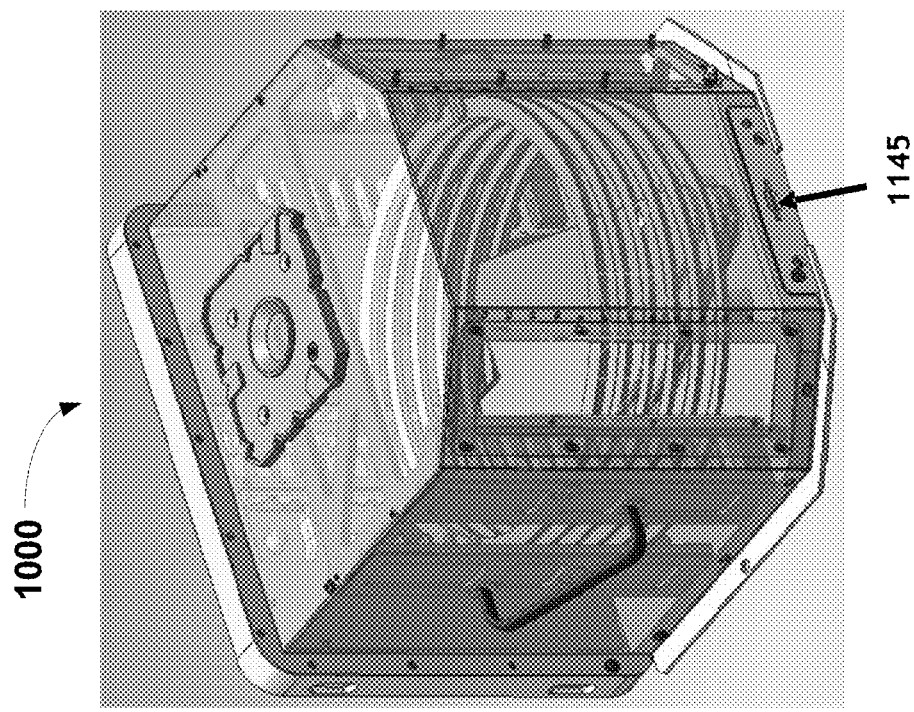
FIGS. 21A and 21B illustrate back side views of the replacement station identifying a mounting plate for providing a replacement station identifier, in accordance with some embodiments of the invention.
Figure 21A:
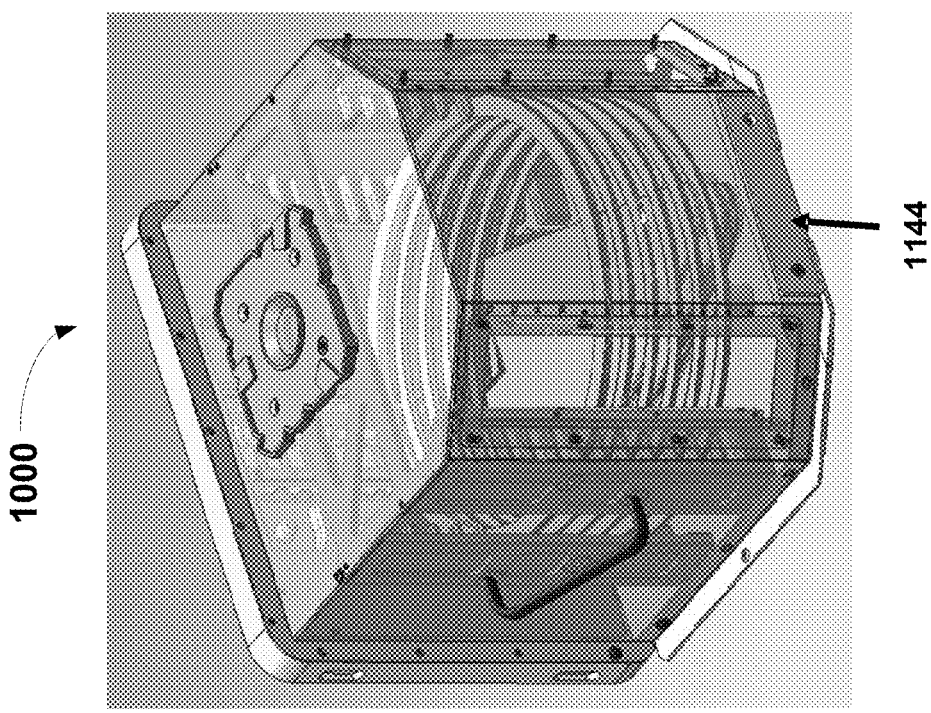

FIGS. 21A and 21B provide a view of a back side of the ring pod 1000 on which a ring pod identifier may be disposed to identify contents of the ring pod 1000, in some embodiments of the invention. The back side location of the identifier is provided only as an example and that other sides or locations may also be used to place the ring pod identifier. In some embodiments, the ring pod identifier may be in the form of a bar code presented on a bar code mounting plate 1144, as illustrated in FIG. 21A. In alternate embodiments, the ring pod identifier may be in the form of a radio frequency identifier (RFID) tag that is provided on an RFID tag plate 1145, as illustrated in FIG. 21B. In other embodiments, the ring pod identifier may be in the form of a serial number that is etched on a ring pod identifier plate disposed on the back side or any other side of the ring pod 1000. A host, such as an identification station, can correlate what is inside the ring pod 1000 with the ring pod identifier and manage the inventory of the ring pods 1000 and the consumable parts stored within the ring pod 1000. For example, when a ring pod is coupled to the load port module 1155, a sensor on the load port may be used to read the ring pod identifier and identify the type of consumable parts that are stored inside the ring pod 1000. In order to determine the type and number of consumable parts stored in the ring pod 1000, the content of the ring pod 1000 have to be scanned and the information from the scanning is maintained and managed by the host. The scanning is done, for example, when the door 1123 of the ring pod 1000 is opened.

In some embodiments, when the door 1123 of the ring pod 1000 is opened, a robot with an end effector equipped with an aligner and a sensor (e.g., camera) may be used to scan up and down the ring pod 1000 and map the location of the consumable parts received in the various support fingers 1130 of the ring pod 1000. This mapping information, in some embodiments, may be used by a tool software to track the various consumable parts in different ring pods 1000. In some embodiments, this mapping information may also be stored in a database with the ring pod identifier and updated any time the ring pod 1000 is used so that the tool software can keep track of the inventory of the consumable parts in the various ring pods 1000. The updated mapping information is used by the host to correlate with what is inside the ring pod 1000. When the sensor on the load port scans the identifier of the ring pod 1000, the identifier of the ring pod 1000 is used to obtain the mapped information that identifies the type and number of consumable parts contained therein.

The various embodiments describe the structure of a ring pod 1000 that is used to provide a new consumable part 208 to a process module 112 for replacing a damaged or old consumable part. The ring pod 1000 is coupled to a load port of a load port module 1155, which in turn is coupled directly to a process module (any one of 112-120) or a vacuum transfer module (VTM) 104 or an atmospheric transfer module (ATM) 102. The consumable part is moved to the process module using a robot within the ring pod 1000, or using robots in the VTM 104 and/or ATM 102.

The various embodiments described herein allow the consumable parts to be replaced in a fast and efficient manner without having to open the cluster tool assembly to atmospheric conditions. As a result, the time to replace consumable parts, as well as any risk of contaminating the chamber during replacement of consumable parts is greatly reduced, thereby allowing the cluster tool assembly to come online faster. Further, risk of inadvertent damage to the process module, the consumable part and to other hardware components in the process module are greatly reduced.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A pod for exchanging consumable parts of a process module, comprising:
   a base plate having an outer perimeter defined by a front side, a back side and two lateral sides that extend between the front side and the back side;
   a top plate oriented vertically opposite to the base plate, the top plate being substantially parallel to the base plate;
   a first pair of support columns, each one of the first pair of support columns is oriented along each of the two lateral sides and disposed proximal to the front side of the base plate, and each one of the first pair of support columns extends between the top plate and the base plate, each one of the first pair of support columns includes a plurality of support fingers distributed lengthwise along the respective support column of the first pair of support columns and faces inward relative to the outer perimeter;

a second pair of support columns, each one of the second pair of support columns is oriented along each of the two lateral sides and disposed proximal to the back side of the base plate, and each one of the second pair of support columns extends between the top plate and the base plate, each one of the second pair of support columns includes a plurality of support fingers distributed lengthwise along the respective support column of the second pair of support columns and faces inward relative to the outer perimeter;

a first hard stop column disposed proximate to a first one of the second pair of support columns;

a second hard stop column disposed proximate to a second one of the second pair of support columns, wherein each of the first and the second hard stop columns extends a length of the second pair of support columns, such that an edge surface of each of the first and the second hard stop columns faces inward relative to the outer perimeter;

a shell structure of the pod is configured to attach to the base plate and enclose the first pair of support columns, the second pair of support columns, the top plate and the first and second hard stop columns, the shell structure having a front opening that is disposed along the front side of the base plate; and a door is configured to mate with the front opening of the shell structure and the front side of the base plate, the door is configured with a retention assembly that is disposed on an inside surface of the door and extends between the base plate and the top plate, such that consumable parts when disposed in the pod are configured to rest upon the support fingers of the first and second pairs of support columns and the retention assembly secures the consumable parts against the first and second hard stop columns when the door is closed.

2. The pod of claim 1, wherein each one of the plurality of support fingers includes a support pad defined on a top surface, the support pad providing a distinct contact surface for a consumable part, when received on respective one of the plurality of support fingers.

3. The pod of claim 2, wherein each one of the plurality of support fingers includes a groove defined on the top surface, the support pad is formed in the groove and extends above the top surface.

4. The pod of claim 2, wherein the support pad is made of carbon filled Polyetheretherketone (PEEK) material, and wherein the plurality of support fingers is made of aluminum.

5. The pod of claim 1, wherein the plurality of support fingers are made of carbon filled Polyetheretherketone (PEEK) material.

6. The pod of claim 1, wherein the first and the second hard stop columns are made of carbon filled Polyetheretherketone (PEEK) material, and wherein the first pair and the second pair of support columns are made of aluminum.

7. The pod of claim 1, wherein the top plate is affixed to an underside of a top surface of the shell structure, the top plate providing support to the first pair and the second pair of support columns.

8. The pod of claim 1, wherein the retention assembly includes a spring mechanism that is activated to secure the consumable parts, when the door is closed.

9. The pod of claim 1, wherein the retention assembly includes a plurality of fingers, wherein each one of the plurality of fingers in the retention assembly is configured to provide support for the consumable parts when disposed in the pod, the plurality of fingers is made of carbon filled Polyetheretherketone (PEEK) material.

10. The pod of claim 1, further includes a window defined lengthwise along a portion of a backside of the pod to provide a view of an inside of the pod.

11. The pod of claim 1, further includes a pair of handles, wherein a first handle in the pair is defined on a first lateral side of the pod and is attached to a first support column from the first pair of support columns and a first support column from the second pair of support columns that are disposed on the first lateral side, through the shell structure, and wherein a second handle in the pair is defined on a second lateral side of the pod and is attached to a second support column from the first pair of support columns and a second support column from the second pair of support columns that are disposed on the second lateral side, through the shell structure.

12. The pod of claim 1, further includes a plurality of carrier supports distributed on a receiving plane defined inside the pod, each of the plurality of carrier supports includes a base support structure and a top hat disposed over the base support structure, the base support structure, the top hat and the retention assembly on the door provide support surface for resting a ring carrier, when received in the pod.

13. The pod of claim 12, wherein the receiving plane with the plurality of carrier supports is defined on the base plate.

14. The pod of claim 12, wherein the receiving plane with the plurality of carrier supports is defined on a separator plate that is disposed between the top plate and the base plate, the separator plate defining distinct areas to separately store used consumable parts and new consumable parts.

15. The pod of claim 12, wherein the receiving plane with the plurality of carrier supports is defined on an underside surface of the top plate in the pod.

16. The pod of claim 1, wherein portions of the first pair of support columns, second pair of support columns, base plate and the top plate are made of aluminum and wherein the portions of the first pair of support columns, the second pair of support columns, base plate and the top plate that are exposed to ambient environment within the pod, are treated with a corrosion resistant coating.

17. The pod of claim 1, wherein the pod is a front opening ring pod and the consumable parts are edge rings to be used in the process module.

18. A pod for holding consumable parts to be supplied or returned from a process module, the process module is configured to process semiconductor substrates and processing of the semiconductor substrates causes a wear upon the consumable parts, the pod comprising, a base plate having a front side, a back side, a first lateral side and a second lateral side, the first and second lateral sides being oriented opposite one another;

a first support column disposed proximal to the front side and on the first lateral side;

a second support column disposed proximal to the front side and on the second lateral side;

a third support column disposed proximal to the back side and on the first lateral side;

a fourth support column disposed proximal to the back side and on the second lateral side;

a top plate disposed above the base plate and connected to each of the first, second, third and fourth support columns, and each of the first, second, third and fourth support columns including support fingers that are distributed between the base plate and the top plate and oriented toward an inner region of the pod;

a first hard stop column disposed parallel to the third support column and a second hard stop column disposed parallel to the fourth support column, such that the first and second hard stop columns are oriented toward the inner region of the pod and extend between the base plate and the top plate;

a shell structure configured to enclose the first, second, third and fourth support columns, the top plate and the first and second hard stop columns and connect to the base plate, the shell structure having a front opening disposed proximate to the front side of the base plate; and a door for mating with the front opening of the shell structure, the door having a retention assembly for securing consumable parts in the pod when disposed over select ones of the support fingers, the retention assembly is disposed on an inside surface of the door and extends between the base plate and the top plate.

19. The pod of claim 18, wherein the first hard stop column is spaced apart from the third support column and the second hard stop column is spaced apart from the fourth support column.

20. The pod of claim 18, wherein the first hard stop column is attached to the third support column and the second hard stop column is attached to the fourth support column.

21. The pod of claim 18, wherein each one of the support fingers in each of the first, second, third and fourth support columns includes a groove defined on a top surface, a support pad is formed on the top surface, such that the support pad fills the groove and extends above the top surface to form a distinct support surface for receiving the consumable parts, when disposed in the pod.

22. The pod of claim 18, wherein each one of the support fingers in each of the first, second, third and fourth support columns includes a support pad disposed on a top surface, the support pad providing a distinct support surface for the consumable parts in the pod when disposed over select ones of the support fingers.

23. The pod of claim 18, further includes a window defined lengthwise along a portion of a backside of the pod to provide a view of an inside of the pod.

24. The pod of claim 18, further includes a first handle disposed on a first lateral side of the pod and attached to the first and third support columns through the shell structure, and a second handle disposed on a second lateral side of the pod and attached to the second support column and the fourth support column through the shell structure.

25. The pod of claim 18, further includes a plurality of carrier supports distributed on a receiving plane defined inside the pod, each one of the plurality of carrier supports includes a base support structure and a top hat disposed over the base support structure, wherein the base support structure, the top hat and the retention assembly on the door provide support surface for resting a ring carrier, when received in the pod.

26. The pod of claim 25, wherein the receiving plane with the plurality of carrier supports is defined on the base plate.

27. The pod of claim 25, wherein the receiving plane with the plurality of carrier supports is defined on a separator plate that is disposed between the top plate and the base plate, the separator plate defining distinct areas to separately store used consumable parts and new consumable parts.

28. The pod of claim 18, wherein the retention assembly includes fingers distributed lengthwise and oriented toward the inner region of the pod, the fingers providing support for the consumable parts when disposed in the pod.

29. The pod of claim 18, wherein the top plate is attached to an underside of a top surface of the shell structure.

* * * * *